(12) United States Patent
Shigenobu et al.

(10) Patent No.: US 7,728,745 B2
(45) Date of Patent: Jun. 1, 2010

(54) VARIABLE LENGTH CODE DECODING APPARATUS AND METHOD WITH VARIATION IN TIMING OF EXTRACTING BIT STRING TO BE DECODED DEPENDING ON CODE WORD

(75) Inventors: Yuya Shigenobu, Osaka (JP); Yoshiyuki Wada, Osaka (JP); Satoshi Yamaguchi, Hyogo (JP); Kozo Kimura, Osaka (JP); Takeshi Furuta, Kyoto (JP)

(73) Assignee: Panasonic Corporation, Osaka (JP)

( * ) Notice: Subject to any disclaimer, the term of this patent is extended or adjusted under 35 U.S.C. 154(b) by 76 days.

(21) Appl. No.: 12/108,118

(22) Filed: Apr. 23, 2008

(65) Prior Publication Data

US 2008/0266147 A1  Oct. 30, 2008

(30) Foreign Application Priority Data

Apr. 26, 2007  (JP) .............................. 2007-117774

(51) Int. Cl.
*H03M 7/40* (2006.01)
(52) U.S. Cl. .......................................... 341/67; 341/50
(58) Field of Classification Search .................. 341/67, 341/65, 50, 51
See application file for complete search history.

(56) References Cited

U.S. PATENT DOCUMENTS 5,541,595 A   7/1996   Meyer (Continued)

FOREIGN PATENT DOCUMENTS

JP   7-307675   11/1995

(Continued)

OTHER PUBLICATIONS

English language Abstract of JP 7-307675.

(Continued)

*Primary Examiner*—Peguy JeanPierre
(74) *Attorney, Agent, or Firm*—Greenblum & Bernstein P.L.C.

(57) ABSTRACT

A variable length code decoding apparatus according to the present invention includes: an extracting unit which extracts a bit string from a beginning of a bit stream; a first storage unit for storing a plurality of code words in which one piece of data has been coded, and decoded data and code lengths respectively corresponding to the code words; a second storage unit for storing a plurality of code words in which two or more pieces of data have been coded, and decoded data and code lengths respectively corresponding to the code words; a first judging unit which judges whether one of the code words stored in the first storage unit is included in the extracted bit string, and, when judged as being included, outputs the decoded data and the code length of the code word; and a second judging unit which judges whether a code word stored in the second storage unit is included in the extracted bit string, and when judged as being included, outputs the decoded data and the code length of the code word, wherein the extracting unit extracts the bit string to be decoded next in the same cycle as a cycle in which the judgment was made by the first judging unit, and extracts the bit string to be decoded next in a cycle following the cycle in which the judgment was made by the second judging unit.

12 Claims, 22 Drawing Sheets

U.S. PATENT DOCUMENTS

| | | |
|---|---|---|
| 5,550,542 A | 8/1996 | Inoue |
| 5,561,690 A | 10/1996 | Park |
| 5,614,900 A | 3/1997 | Watanabe |
| 5,717,394 A * | 2/1998 | Schwartz et al. ............... 341/51 |
| 5,831,557 A | 11/1998 | Handley |
| 6,437,712 B1 * | 8/2002 | Aoki ........................... 341/67 |
| 6,738,525 B1 | 5/2004 | Iwata |
| 6,980,138 B2 * | 12/2005 | Vassiliadis et al. ............ 341/67 |
| 2002/0114464 A1 | 8/2002 | Wang |
| 2002/0114529 A1 | 8/2002 | Horie |
| 2006/0119490 A1 | 6/2006 | Lim et al. |
| 2007/0115156 A1 | 5/2007 | Lim et al. |

FOREIGN PATENT DOCUMENTS

| | | |
|---|---|---|
| JP | 3341962 | 8/2002 |

OTHER PUBLICATIONS

English language Abstract of JP 7-307675, Nov. 21, 1995.

* cited by examiner

FIG. 3

| Code word | RUN | LEVEL | LAST | Code length |
|---|---|---|---|---|
| a1 | 0 | 1 | 0 | 1 |
| e1-e4 | 0 | 2 | 0 | 4 |
| f1-f4 | 0 | 3 | 0 | 4 |
| g1-g8 | 0 | 4 | 0 | 8 |
| ⋮ | ⋮ | ⋮ | ⋮ | ⋮ |

FIG. 4

| Code word | RUN | LEVEL | LAST | Code length |
|---|---|---|---|---|
| h1-h8 | 1 | 1 | 0 | 8 |
| b1-b16 | 1 | 2 | 0 | 16 |
| i1-i16 | 1 | 3 | 0 | 16 |
| ⋮ | ⋮ | ⋮ | ⋮ | ⋮ |
| j1-j16 | 2 | 1 | 1 | 16 |
| k1-k32 | 2 | 2 | 1 | 32 |
| c1-c32 | 2 | 3 | 1 | 32 |
| ⋮ | ⋮ | ⋮ | ⋮ | ⋮ |

FIG. 5

| | | Table lookup unit 101 | | | Table lookup unit 102 | | |
|---|---|---|---|---|---|---|---|
| Cycle | Bit stream extracting unit 100 | Decode completion signal | Decoded data | Code length | Decode completion signal | Decoded data | Code length |
| 0 | a1 b1-b16 c1-c15 | 1 | (0,1,0) | 1 | 0 | (x,x,x) | 0 |
| 1 | b1-b16 c1-c16 | 0 | (x,x,x) | 0 | 1 | (1,2,0) | 16 |
| 2 | b1-b16 c1-c16 | 0 | (x,x,x) | 0 | 1 | (1,2,0) | 16 |
| 3 | c1-c32 | 0 | (x,x,x) | 0 | 1 | (2,3,1) | 32 |
| 4 | c1-c32 | 0 | (x,x,x) | 0 | 1 | (2,3,1) | 32 |
| Cycle | Multiplexer 103 | Register 104 | Register 105 | Register 106 | Multiplexer 107 | Multiplexer 108 | Multiplexer 109 |
| 0 | 0 | 0 | (0,0,0) | 0 | 1 | (0,1,0) | 1 |
| 1 | 1 | 0 | (x,x,x) | 0 | 0 | (x,x,x) | 0 |
| 2 | 0 | 1 | (1,2,0) | 16 | 1 | (1,2,0) | 16 |
| 3 | 1 | 0 | (1,2,0) | 16 | 0 | (x,x,x) | 0 |
| 4 | 0 | 1 | (2,3,1) | 32 | 1 | (2,3,1) | 32 |

FIG. 6

| Code word | RUN | LEVEL | LAST | Code length |
|---|---|---|---|---|
| a1 | 0 | 1 | 0 | 1 |
| b1-b16 | 1 | 2 | 0 | 16 |
| c1-c32 | 2 | 3 | 1 | 32 |
| d1-d32 | Error (Type: E) | | | 32 |

FIG. 8

| | | Table lookup unit 101 | | | Table lookup unit 102 | | |
|---|---|---|---|---|---|---|---|
| Cycle | Register 204 | Decode completion signal | Decoded data | Code length | Decode completion signal | Decoded data | Code length |
| 0 | a1 b1-b16 c1-c15 | 1 | (0,1,0) | 1 | 0 | (x,x,x) | 0 |
| 1 | b1-b16 c1-c16 | 0 | (x,x,x) | 0 | 1 | (1,2,0) | 16 |
| 2 | b1-b16 c1-c16 | 0 | (x,x,x) | 0 | 1 | (1,2,0) | 16 |
| 3 | c1-c32 | 0 | (x,x,x) | 0 | 1 | (2,3,1) | 32 |
| 4 | c1-c32 | 0 | (x,x,x) | 0 | 1 | (2,3,1) | 32 |

| Cycle | Multiplexer 103 | Register 104 | Register 105 | Register 106 | Multiplexer 107 | Multiplexer 108 | Multiplexer 109 |
|---|---|---|---|---|---|---|---|
| 0 | 0 | 0 | (0,0,0) | 0 | 1 | (0,1,0) | 1 |
| 1 | 1 | 1 | (x,x,x) | 0 | 0 | (x,x,x) | 0 |
| 2 | 0 | 0 | (1,2,0) | 16 | 1 | (1,2,0) | 16 |
| 3 | 1 | 0 | (1,2,0) | 16 | 0 | (x,x,x) | 0 |
| 4 | 0 | 1 | (2,3,1) | 32 | 1 | (2,3,1) | 32 |

| Cycle | Bit stream supplying unit 200 | Shifter 201 | Shifter 202 | Multiplexer 203 |
|---|---|---|---|---|
| 0 | a1 b1-b16 c1-c32 d1-d15 | a1 b1-b16 c1-c15 | b1-b16 c1-c16 | b1-b16 c1-c16 |
| 1 | b1-b16 c1-c32 d1-d16 | b1-b16 c1-c16 | b1-b16 c1-c16 | b1-b16 c1-c16 |
| 2 | b1-b16 c1-c32 d1-d16 | b1-b16 c1-c16 | c1-c32 | c1-c32 |
| 3 | c1-c32 d1-d32 | c1-c32 | c17-c32 d1-d16 | c1-c32 |
| 4 | c1-c32 d1-d32 | c1-c32 | d1-d32 | d1-d32 |

FIG. 10

| | | Table lookup unit 101 | | | |
|---|---|---|---|---|---|
| Cycle | Bit stream extracting unit 100 | Decode completion signal | Decoded data | Code length | |
| 0 | a1 b1-b16 c1-c15 | 1 | (0, 1, 0) | 1 | |
| 1 | b1-b16 c1-c16 | 0 | (x, x, x) | 0 | |
| 2 | b1-b16 c1-c16 | 0 | (x, x, x) | 0 | |
| 3 | c1-c32 | 0 | (x, x, x) | 0 | |

| Cycle | Multiplexer 302 | Register 303 | Register 304 | Register 305 |
| 0 | 0 | 0 | (0, 0, 0) | 0 |
| 1 | 1 | 0 | (x, x, x) | 0 |
| 2 | 0 | 1 | (1, 2, 0) | 16 |
| 3 | 0 | 0 | (1, 2, 0) | 16 |

| Cycle | Multiplexer 306 | Multiplexer 307 | Multiplexer 308 | Multiplexer 309 | Multiplexer 310 | Multiplexer 311 |
| 0 | 0 | (x, x, x) | 0 | 1 | (0, 1, 0) | 1 |
| 1 | 0 | (x, x, x) | 0 | 0 | (x, x, x) | 0 |
| 2 | 1 | (1, 2, 0) | 16 | 1 | (1, 2, 0) | 16 |
| 3 | 1 | (2, 3, 1) | 32 | 1 | (2, 3, 1) | 32 |

| | | Table lookup unit 300 | | |
|---|---|---|---|---|
| | | Decode completion signal | Decoded data | Code length |
| | | 0 | (x, x, x) | 0 |
| | | 1 | (1, 2, 0) | 16 |
| | | 1 | (1, 2, 0) | 16 |
| | | 0 | (x, x, x) | 32 |

| | | Table lookup unit 301 | | |
| | | Decode completion signal | Decoded data | Code length |
| | | 0 | (x, x, x) | 0 |
| | | 0 | (x, x, x) | 0 |
| | | 0 | (x, x, x) | 0 |
| | | 1 | (2, 3, 1) | 32 |

FIG. 12

| Code word | LAST | Code length |
|---|---|---|
| a1 | 0 | 1 |
| e1-e4 | 0 | 4 |
| f1-f4 | 0 | 4 |
| g1-g8 | 0 | 8 |
| ⋮ | ⋮ | ⋮ |

FIG. 13

| Code word | LAST | Code length |
|---|---|---|
| h1-h8 | 0 | 8 |
| b1-b16 | 0 | 16 |
| i1-i16 | 0 | 16 |
| ⋮ | ⋮ | ⋮ |
| j1-j16 | 1 | 16 |
| k1-k32 | 1 | 32 |
| c1-c32 | 1 | 32 |
| ⋮ | ⋮ | ⋮ |

FIG. 14

| Code word | RUN | LEVEL |
|---|---|---|
| a1 | 0 | 1 |
| e1-e4 | 0 | 2 |
| f1-f4 | 0 | 3 |
| g1-g8 | 0 | 4 |
| ⋮ | ⋮ | ⋮ |
| h1-h8 | 1 | 1 |
| b1-b16 | 1 | 2 |
| i1-i16 | 1 | 3 |
| ⋮ | ⋮ | ⋮ |
| j1-j16 | 2 | 1 |
| k1-k32 | 2 | 2 |
| c1-c32 | 2 | 3 |
| ⋮ | ⋮ | ⋮ |

FIG. 15

| Cycle | Bit stream extracting unit 100 | Table lookup unit 400 | | | Table lookup unit 401 | | |
|---|---|---|---|---|---|---|---|
| | | Decode completion signal | Decoded data | Code length | Decode completion signal | Decoded data | Code length |
| 0 | a1 b1-b16 c1-c15 | 1 | 0 | 1 | 0 | x | 0 |
| 1 | b1-b16 c1-c16 | 0 | x | 0 | 1 | 0 | 16 |
| 2 | b1-b16 c1-c16 | 0 | x | 0 | 1 | 0 | 16 |
| 3 | c1-c32 | 0 | x | 0 | 1 | 1 | 32 |
| 4 | c1-c32 | 0 | x | 0 | 1 | 1 | 32 |
| 5 | d1-d32 | 0 | x | 0 | 0 | x | 0 |

| Cycle | Multiplexer 103 | Multiplexer 104 | Multiplexer 105 | Multiplexer 106 | Multiplexer 107 | Multiplexer 108 | Multiplexer 109 |
|---|---|---|---|---|---|---|---|
| 0 | 0 | 0 | 0 | 0 | 1 | 0 | 1 |
| 1 | 1 | 0 | x | 0 | 0 | x | 0 |
| 2 | 0 | 1 | 0 | 16 | 1 | 0 | 16 |
| 3 | 1 | 0 | 0 | 16 | 0 | x | 0 |
| 4 | 0 | 1 | 1 | 32 | 1 | 1 | 32 |
| 5 | 0 | 0 | 1 | 32 | 0 | x | 0 |

| Cycle | Register 403 | Table lookup unit 402 |
|---|---|---|
| | | Decoded data |
| 0 | 0 | (x, x) |
| 1 | a1 b1-b16 c1-c15 | (0, 1) |
| 2 | b1-b16 c1-c16 | (1, 2) |
| 3 | b1-b16 c1-c16 | (1, 2) |
| 4 | c1-c32 | (2, 3) |
| 5 | c1-c32 | (2, 3) |

FIG. 17

| | | Table lookup unit 100 | | | Table lookup unit 101 | | |
|---|---|---|---|---|---|---|---|
| Cycle | Bit stream extracting unit 100 | Decode completion signal | Decoded data | Code length | Decode completion signal | Decoded data | Code length |
| 0 | a1 b1-b16 c1-c15 | 1 | (0,1,0) | 1 | 0 | (x,x,x) | 0 |
| 1 | b1-b16 c1-c16 | 0 | (x,x,x) | 0 | 1 | (1,2,0) | 16 |
| 2 | b1-b16 c1-c16 | 0 | (x,x,x) | 0 | 1 | (1,2,0) | 16 |
| 3 | c1-c32 | 0 | (x,x,x) | 0 | 1 | (2,3,1) | 32 |
| 4 | c1-c32 | 0 | (x,x,x) | 0 | 1 | (2,3,1) | 32 |
| 5 | d1-d32 | 0 | (x,x,x) | 0 | 0 | (x,x,x) | 0 |
| 6 | d1-d32 | 0 | (x,x,x) | 0 | 0 | (x,x,x) | 0 |

| Cycle | Multiplexer 103 | Register 105 | Register 106 | Multiplexer 107 | Multiplexer 108 | Multiplexer 109 |
|---|---|---|---|---|---|---|
| 0 | 0 | (0,0,0) | 0 | 1 | (0,1,0) | 1 |
| 1 | 1 | (x,x,x) | 0 | 0 | (x,x,x) | 0 |
| 2 | 0 | (1,2,0) | 16 | 1 | (1,2,0) | 16 |
| 3 | 1 | (x,x,x) | 16 | 0 | (x,x,x) | 0 |
| 4 | 0 | (2,3,1) | 32 | 1 | (2,3,1) | 32 |
| 5 | 0 | (x,x,x) | 32 | 0 | (x,x,x) | 0 |
| 6 | 0 | (x,x,x) | 0 | 0 | (x,x,x) | 0 |

| | | Table lookup unit 500 | Error detecting unit 501 |
|---|---|---|---|
| Cycle | Register 403 | Error type | |
| 0 | 0 | 0 | 0 |
| 1 | a1 b1-b16 c1-c15 | 0 | 0 |
| 2 | b1-b16 c1-c16 | 0 | 0 |
| 3 | b1-b16 c1-c16 | 0 | 0 |
| 4 | c1-c32 | 0 | 0 |
| 5 | c1-c32 | 0 | 1 |
| 6 | d1-d32 | E | 1 |

FIG. 19

| Cycle | Bit stream extracting unit 100 | Table lookup unit 101 | | Table lookup unit 600 | |
|---|---|---|---|---|---|
| | | Decode completion signal | Decoded data | Code length | Decode completion signal | Decoded data | Code length |
| 0 | l1 m1-m8 n1-n16 o1-o7 | 1 | (0,1,0) | 1 | 0 | (x,x,x) | 0 |
| 1 | m1-m8 n1-n16 o1-o8 | 0 | (x,x,x) | 0 | 1 | (1,2,0) | 8 |
| 2 | n1-n16 o1-o16 | 0 | (x,x,x) | 0 | 0 | (x,x,x) | 0 |
| 3 | n1-n16 o1-o16 | 0 | (x,x,x) | 0 | 0 | (x,x,x) | 0 |
| 4 | o1-o32 | 0 | (x,x,x) | 0 | 0 | (x,x,x) | 0 |

| Cycle | Table lookup unit 601 | | | Table lookup unit 602 | | |
|---|---|---|---|---|---|---|
| | Decode completion signal | Decoded data | Code length | Decode completion signal | Decoded data | Code length |
| 0 | 0 | (x,x,x) | 0 | 0 | (x,x,x) | 0 |
| 1 | 0 | (x,x,x) | 0 | 0 | (x,x,x) | 0 |
| 2 | 0 | (x,x,x) | 0 | 0 | (x,x,x) | 0 |
| 3 | 0 | (x,x,x) | 0 | 0 | (x,x,x) | 0 |
| 4 | 0 | (x,x,x) | 0 | 0 | (x,x,x) | 0 |

| Cycle | Table lookup unit 603 | | | Table lookup unit 604 | | |
|---|---|---|---|---|---|---|
| | Decode completion signal | Decoded data | Code length | Decode completion signal | Decoded data | Code length |
| 0 | 0 | (x,x,x) | 0 | 0 | (x,x,x) | 0 |
| 1 | 0 | (x,x,x) | 0 | 0 | (x,x,x) | 0 |
| 2 | 1 | (2,3,0) | 16 | 0 | (x,x,x) | 0 |
| 3 | 1 | (2,3,0) | 16 | 0 | (x,x,x) | 0 |
| 4 | 0 | (x,x,x) | 0 | 1 | (2,4,1) | 32 |

| Cycle | Multiplexer 612 | Multiplexer 613 | Multiplexer 614 | Multiplexer 622 | Multiplexer 623 | Multiplexer 624 |
|---|---|---|---|---|---|---|
| 0 | 0 | (x,x,x) | 0 | 0 | (x,x,x) | 0 |
| 1 | 1 | (1,2,0) | 8 | 0 | (x,x,x) | 0 |
| 2 | 0 | (x,x,x) | 0 | 1 | (2,3,0) | 16 |
| 3 | 0 | (x,x,x) | 0 | 1 | (2,3,0) | 16 |
| 4 | 0 | (x,x,x) | 0 | 0 | (x,x,x) | 0 |

| Cycle | Register 626 | Register 627 | Register 628 | Multiplexer 632 | Multiplexer 633 | Multiplexer 634 |
|---|---|---|---|---|---|---|
| 0 | 0 | (0,0,0) | 0 | 0 | (x,x,x) | 0 |
| 1 | 0 | (x,x,x) | 0 | 0 | (x,x,x) | 0 |
| 2 | 1 | (1,2,0) | 8 | 0 | (x,x,x) | 0 |
| 3 | 1 | (2,3,0) | 16 | 1 | (2,3,0) | 16 |
| 4 | 0 | (2,3,0) | 16 | 1 | (2,4,1) | 32 |

| Cycle | Multiplexer 625 | Multiplexer 636 | Multiplexer 637 | Multiplexer 638 |
|---|---|---|---|---|
| 0 | 0 | 0 | (0,1,0) | 1 |
| 1 | 0 | 1 | (1,2,0) | 8 |
| 2 | 1 | 0 | (x,x,x) | 0 |
| 3 | 0 | 1 | (2,3,0) | 16 |
| 4 | 0 | 1 | (2,4,1) | 32 |

| Cycle | Control unit 635 |
|---|---|
| 0 | 0 |
| 1 | 1 |
| 2 | 0 |
| 3 | 2 |
| 4 | 2 |

FIG. 20

| Code word | RUN | LEVEL | LAST | Code length |
|---|---|---|---|---|
| l1 | 0 | 1 | 0 | 1 |
| m1-m8 | 1 | 2 | 0 | 8 |
| n1-n16 | 2 | 3 | 0 | 16 |
| o1-o32 | 2 | 4 | 1 | 32 |

FIG. 22

| Cycle | Register 702 | Table lookup unit 704 | | Control unit 707 |
|---|---|---|---|---|
| | | Decode completion signal | Decoded data | Code length | |
| 0 | p1 p1-p16 p1-p15 | 1 | P0 | 1 | 0 |
| 1 | p1-p16 p1-p16 | 1 | P0 | 1 | 3 |
| 2 | p1-p16 p1-p16 | 1 | P0 | 1 | 1 |
| 3 | p1-p16 p1-p16 | 1 | P0 | 1 | 2 |

| Cycle | Register 703 | Table lookup unit 705 | | Table lookup unit 706 | |
|---|---|---|---|---|---|
| | | Decode completion signal | Decoded data | Code length | Decode completion signal | Decoded data | Code length |
| 0 | p1 p1-p16 p1-p15 | 0 | x | x | 0 | x | x |
| 1 | p1 p1-p16 p1-p15 | 0 | x | x | 0 | x | x |
| 2 | p1-p16 p1-p16 | 1 | P1 | 16 | 0 | x | x |
| 3 | p1-p32 | 1 | P1 | 16 | 1 | P2 | 32 |

| Cycle | Multiplexer 708 | Multiplexer 709 | Multiplexer 710 | Multiplexer 711 | Multiplexer 712 | Multiplexer 713 | Multiplexer 714 |
|---|---|---|---|---|---|---|---|
| 0 | 1 | 0 | x | 0 | 1 | P0 | 1 |
| 1 | 0 | 0 | x | 0 | 0 | P0 | 0 |
| 2 | 0 | 1 | P1 | 16 | 1 | P1 | 16 |
| 3 | 0 | 1 | P2 | 32 | 1 | P2 | 32 |

| Cycle | Bit stream supplying unit 200 | Barrel shifter 700 | Barrel shifter 701 |
|---|---|---|---|
| 0 | p1 p1-p16 p1-p32 q1-q15 | p1-p16 p1-p16 | p1 p1-p16 p1-p15 |
| 1 | p1-p16 p1-p32 q1-q16 | p1-p16 p1-p16 | p1-p16 p1-p16 |
| 2 | p1-p16 p1-p32 q1-q16 | p1-p16 p1-p16 | p1-p32 |
| 3 | p1-p32 q1-q32 | p1-p32 | q1-q32 |

FIG. 23

|  | Code word | Decoded data | Code length |
|---|---|---|---|
| Table lookup unit 704 | p1 | p0 | 1 |
| Table lookup unit 705 | p1-p16 | p1 | 16 |
| Table lookup unit 706 | p1-p32 | p2 | 32 |

VARIABLE LENGTH CODE DECODING APPARATUS AND METHOD WITH VARIATION IN TIMING OF EXTRACTING BIT STRING TO BE DECODED DEPENDING ON CODE WORD

BACKGROUND OF THE INVENTION (1) Field of the Invention

The present invention relates to a variable length code decoding apparatus which decodes a bit stream including a code word that is variable-length-coded data.

(2) Description of the Related Art

In recent years, significant progress has been made in the development of moving picture compressing and coding techniques. Such techniques are being practically applied in fields such as broadcasting, communication and storage. Variable length coding is a moving picture compressing and coding technique capable of enhancing coding efficiency by varying code lengths according to the occurrence frequency of a value to be coded. In decoding variable-length-coded data (hereinafter referred to as a "code word"), since the code lengths of code words included in a bit stream differ from each other, the position of a given code word cannot be confirmed. Therefore, it is necessary to decode code words in sequence starting from the beginning of the bit stream.

As a variable length code decoding apparatus which decodes a variable-length-coded code word, for example, the variable length code decoding apparatus described in Japanese Patent No. 3341962 (JP 3341962) is known.

FIG. 1 is a diagram showing a configuration of a conventional variable length code decoding apparatus described in JP 3341962. The variable length code decoding apparatus 80 shown in FIG. 1 includes an input terminal 805, lookup tables 820 and 830, and multiplexers 840 and 841.

An n-bit bit stream (where n is a natural number) is inputted to the input terminal 805. m number of MSBs of the bit stream is inputted to the lookup table 820, while k number of LSBs are inputted to the lookup table 830 (where m and k are natural numbers and $0 \leq m \leq n$, $0 \leq k \leq n$).

The lookup tables 820 and 830 store tables including code lengths indicating bit lengths of code words respectively corresponding to addresses and code values that are data obtained by decoding code words. It should be noted that the tables stored in the lookup tables 820 and 830 are tables which separate the table of code lengths and code values corresponding to code words in order to prevent overlapping of addresses corresponding to code words, thereby enabling parallel-decoding of code words.

The respective lookup tables 820 and 830 use inputted bits as an address and output a code length indicating a bit length of a code word and a code value that is data obtained by decoding a code word which are stored at the designated address. Furthermore, the lookup table 820 outputs a decode signal indicating whether the lookup table 820 has successfully decoded the code word. A decode signal of "0" indicates that the lookup table 820 has successfully decoded the variable length code. A decode signal of "1" indicates that decoding of the variable length code by the lookup table 820 was not successful.

The code values and the decode signals outputted from the lookup tables 820 and 830 are inputted to the multiplexer 840. When the decode signal is "0", the multiplexer 840 outputs the code value outputted by the lookup table 820, and when the decode signal is "1", the multiplexer 840 outputs the code value outputted by the lookup table 830.

The code lengths and the decode signals outputted from the lookup tables 820 and 830 are inputted to the multiplexer 841. When the decode signal is "0", the multiplexer 841 outputs the code length outputted by the lookup table 820, and when the decode signal is "1", the multiplexer 840 outputs the code length outputted by the lookup table 830.

According to the configuration described above, the two lookup tables 820 and 830 enable the conventional variable length code decoding apparatus 80 to decode variable-length-coded code words in parallel.

In addition, with the conventional variable length code decoding apparatus 80, one code word is decoded per each predetermined cycle. Next, using the code length of a decoded code word, a process for extracting a bit string from the beginning of an undecoded bit stream is performed. In subsequent cycles, code words are sequentially decoded from the beginning of the bit stream by repetitively performing the decoding process and the extraction process.

However, it is desired that variable length code decoding apparatuses perform decoding at higher speeds. In the conventional variable length code decoding apparatus, the time required for decoding one code word is the sum of the time required for collating the code word by the lookup tables 820 and 830 and the time required for extracting a bit string from the beginning of the undecoded bit stream using the code length of the decoded code word.

It should be noted that the object of the variable length code decoding apparatus described in JP 3341962 is to reduce the capacities of the lookup tables 820 and 830 and no significant advantage may be gained with respect to increasing speed. For example, the operation speed of the variable length code decoding apparatus described in JP 3341962 does not significantly differ from a case of a single lookup table with a hard-wired configuration which is operated at an optimized operation speed. (See. e.g., pp. 6-10, FIG. 2, and the like, of JP3341962)

SUMMARY OF THE INVENTION

In consideration thereof, it is an object of the present invention to provide a variable length code decoding apparatus capable of decoding a variable-length-coded code word at high speed.

In order to achieve the aforementioned object, the variable length code decoding apparatus according to the present invention is a variable length code decoding apparatus which decodes a bit stream including a code word that is variable-length-coded data, said variable length code decoding apparatus includes: an extracting unit which extracts a bit string of at least a maximum code length of a code word used in the variable length coding, from a beginning of an undecoded bit stream; a first storage unit for storing a plurality of code words in which one piece of data is coded, and decoded data and code lengths respectively corresponding to the code words; a second storage unit for storing a plurality of code words in which two or more pieces of data are coded, and decoded data and code lengths respectively corresponding to the code words; a first judging unit which judges whether one of the code words stored in said first storage unit is included in the bit string extracted by said extracting unit, and, when judged as being included, outputs the decoded data and the code length of the code word; and a second judging unit operable which judges whether one of the code words stored in said second storage unit is included in the bit string extracted by said extracting unit, and, when judged as being included, outputs the decoded data and the code length of the code word, wherein said extracting unit, when said first judging unit judges that the code word is included, judges the beginning of the undecoded bit stream based on the code length outputted by said first judging unit, and extracts a bit string to be decoded next in the same cycle as a cycle in which the judgment was made by said first judging unit, and said extracting unit, when said second judging unit judges that the code word is included, judges the beginning of the undecoded bit stream based on the code length outputted by said second judging unit, and extracts the bit string to be decoded next in a cycle subsequent to the cycle in which the judgment was made by said second judging unit.

According to the configuration described above, decoding of a code word in which two or more pieces of data and bit string extraction are performed in two cycles. Accordingly, a duration of a cycle is determined by whichever is longer of a time required by the second judging unit to make a judgment and a time required by the extracting unit to extract a bit string. Therefore, the duration of a cycle can be reduced in comparison to a case where both a judgment process and a bit string extraction process are performed in one cycle. Decoded data in which is decoded a code word in which two or more pieces of data are coded includes two or more pieces of data. Accordingly, the variable length code decoding apparatus according to the present invention is capable of decoding one or more pieces of data per cycle. In other words, the variable length code decoding apparatus according to the present invention is capable of decoding one or more pieces of data per cycle and, at the same time, capable of reducing the duration of a cycle. Therefore, compared to a conventional variable length code decoding apparatus, the variable length code decoding apparatus according to the present invention is capable of decoding a code word in which two or more pieces of data are coded at high speed.

Furthermore, the number of code words in which one piece of data is coded is smaller than the number of code words in which two or more pieces of data are coded. Accordingly, the time required by the first judging unit to make a judgment becomes shorter than the time required by the second judging unit to make a judgment. Therefore, the variable length code decoding apparatus according to the present invention is capable of decoding a code word in which is decoded one piece of data at high speed.

As described above, the variable length code decoding apparatus according to the present invention is capable of decoding one or more pieces of data per cycle and, at the same time, capable of decoding a variable-length-coded code word at high speed.

Furthermore, it is also possible that: said first judging unit further outputs a decode completion signal indicating whether one of the code words stored in said first storage unit is included in the bit string extracted by said extracting unit, said second judging unit further outputs a decode completion signal indicating whether one of the code words stored in said second storage unit is included in the bit string extracted by said extracting unit, said variable length code decoding apparatus further includes: a first register which retains the decode completion signal, the decoded data, and the code length outputted by said second judging unit; and a first selecting unit which selects, in accordance with the decode completion signal retained in said first register, either the decode completion signal, the decoded data, and the code length outputted by said first judging unit or the decode completion signal, the decoded data, and the code length retained in said first register, and said extracting unit judges the beginning of the undecoded bit stream based on the code length selected by said first selecting unit, and extracts the bit string to be decoded next.

According to the configuration described above, decoded data, a code length and a decode completion signal of a code word in which two or more pieces of data are encoded and which are outputted from the second judging unit are temporarily retained in the first register. In addition, in the next cycle, the decoded data, the code length and the decode completion signal retained in the first register are outputted via the first selecting unit and a bit string extraction process is performed by the extracting unit. Accordingly, decoding of a code word in which two or more pieces of data and bit string extraction are performed in two cycles.

Furthermore, it is also possible that: said extracting unit, when the decode completion signal selected by said first selecting unit indicates that code words stored in said first storage unit and said second storage unit are not included in the bit string extracted by said extracting unit, judges that the code length selected by said first selecting unit is invalid, and does not judge the beginning of the undecoded bit stream based on the code length selected by said first selecting unit.

According to the configuration described above, when an inputted bit string and code words stored in the first storage unit or the second storage unit are inconsistent, the first judging unit and the second judging unit can now output an arbitrary code length. Therefore, since the configurations of the first judging unit and the second judging unit can be simplified, higher speed and smaller capacities of the first judging unit and the second judging unit can be achieved.

Furthermore, it is also possible that: said extracting unit includes: a bit stream supplying unit which judges the beginning of the undecoded bit stream based on the code length selected by said first selecting unit, and extracts a bit string at least twice as long as the maximum code length of the code word used in the variable length coding from the judged beginning of the undecoded bit stream; a first shifter which shifts the bit string extracted by said bit stream supplying unit by the code length outputted by said first judging unit, and outputs a bit string of at least the maximum code length of the code word used in the variable length coding from the beginning of the shifted bit string; a second shifter which shifts the bit string extracted by said bit stream supplying unit by the code length retained in said first register, and outputs a bit string of at least the maximum code length of the code word used in the variable length coding from the beginning of the shifted bit string; a second selecting unit which selects either the bit string outputted by said first shifter or the bit string outputted by said second shifter, in accordance with the decode completion signal retained in said first register; and a second register which retains the bit string selected by said second selecting unit, wherein said first shifter is only capable of performing shifting by a number of bits of the code length stored in said first storage unit, said second shifter is only capable of performing shifting by a number of bits of the code length stored in said second storage unit, said first judging unit judges whether one of the code words stored in said first storage unit is included in the bit string retained in said second register, and, when judged as being included, outputs the decoded data and the code length of the code word, and said second judging unit judges whether one of the code words stored in said second storage unit is included in the bit string retained in said second register, and, when judged as being included, outputs the decoded data and the code length of the code word.

According to the configuration described above, limiting the number of bits that can be shifted by the first shifter and the second shifter to a code length outputtable by a corresponding variable length code table, the speeds of the first shifter and the second shifter can be increased. Accordingly, the variable length code decoding apparatus according to the present invention is capable of reducing the time required by a process for extracting a bit string from the beginning of an undecoded bit stream using the code length of a decoded code word. Therefore, the variable length code decoding apparatus according to the present invention is capable of decoding a variable-length-coded code word at high speed.

Furthermore, it is also possible that: the variable length code decoding apparatus further includes: a third storage unit for storing a plurality of code words in which two or more pieces of data are coded and which is not stored in said second storage unit, and decoded data and code lengths respectively corresponding to the code words; and a third judging unit which judges whether one of the code words stored in said third storage unit is included in the bit string extracted by said extracting unit, and, when judged as being included, outputs the decoded data and the code length of the code word, wherein said extracting unit, when said third judging unit judges that the code word is included, judges the beginning of the undecoded bit stream based on the code length outputted by said third judging unit, and extracts the bit string to be decoded next in the same cycle as a cycle in which the judgment was made by said third judging unit.

According to the configuration described above, since the number of code words respectively stored in the second storage unit and the third storage unit is reduced, the times required by the second judging unit and the third judging unit for making judgments can be reduced. In addition, since decoding and bit string extraction for a code word stored in the third storage unit are performed in one cycle, the number of process cycles per code word can be averagely reduced.

Furthermore, it is also possible that: the time required for the judgment by said third judging unit is equal to or shorter than the time required for the judgment by said first judging unit.

According to the configuration described above, a maximum value of the time required to make a judgment in the case where decoding and bit string extraction are performed in one cycle does not increase and, at the same time, the time required to make a judgment in the case where decoding and bit string extraction are performed in two cycles can be reduced.

Furthermore, it is also possible that: said first storage unit stores the plurality of code words in which one piece of data has been coded, decoded data respectively corresponding to the code words and which require sequential processing, and code lengths respectively corresponding to the code words, said second storage unit stores the plurality of code words in which two or more pieces of data have been coded, the decoded data respectively corresponding to the code words and which require sequential processing, and the code lengths respectively corresponding to the code words, and said variable length code decoding apparatus further includes: a third register which retains the bit string extracted by said extracting unit; a fourth storage unit for storing the plurality of code words stored in said first storage unit and second storage unit and decoded data respectively corresponding to the code words and which do not require sequential processing; and a fourth judging unit which judges whether one of the code words stored in said fourth storage unit is included in the bit string retained in said third register, and, when judged as being included, outputs the decoded data of the code word which does not require sequential processing.

According to the configuration described above, with the variable length code decoding apparatus according to the present invention, decoded data requiring sequential processing and code lengths are stored in the first storage unit and the second storage unit, and decoded data not requiring sequential processing is stored in the fourth storage unit. Accordingly, the capacities of the first storage unit and the second storage unit can be reduced in comparison to a case where all decoded data is stored in the first storage unit and the second storage unit. Thus, the times required by the first judging unit and the second judging unit to make judgments can be reduced. Therefore, the variable length code decoding apparatus according to the present invention is capable of decoding a variable-length-coded code word at high speed.

Furthermore, it is also possible that: the variable length code decoding apparatus further includes an error detecting unit which outputs, when said first judging unit judges that the code word is not included and said second judging unit judges that the code word is not included, an error detection signal indicating that an error has been detected.

According to the configuration described above, with the variable length code decoding apparatus according to the present invention, an error detection signal is outputted when a code word stored in neither the first storage unit nor the second storage unit is included in a bit string extracted by the extracting unit. Accordingly, based on an error detection signal, an external apparatus is able to judge whether a code word not defined in the variable length code table has been detected. Therefore, an external apparatus can perform processes such as terminating a bit stream when an error is detected.

Furthermore, it is also possible that: the variable length code decoding apparatus further includes: a third register which retains the bit string extracted by said extracting unit; a fifth storage unit for storing code words not stored in said first storage unit and said second storage unit, and error types corresponding to the code words; and a fifth judging unit which judges whether one of the code words stored in said fifth storage unit is included in the bit string retained in said third register, and, when judged as being included, outputs the error type of the code word.

According to the configuration described above, with the variable length code decoding apparatus according to the present invention, when a code word stored in neither the first storage unit nor the second storage unit is detected, an error type corresponding to the code word is outputted. Accordingly, for example, when an external apparatus is aware in advance that a code word stored in neither the first storage unit nor the second storage unit is included in a bit stream, the external apparatus is capable of performing adaptive error concealment such as detecting and skipping the code word or performing redecoding by replacing the code word with a code word stored in the first storage unit or the second storage unit.

Furthermore, it is also possible that: said second storage unit stores the plurality of code words in which two pieces of data are coded, and the decoded data and the code lengths respectively corresponding to the code words, said variable length code decoding apparatus further includes: a third storage unit for storing a plurality of code words in which three pieces of data are coded, and decoded data and code lengths respectively corresponding to the code words; and a third judging unit which judges whether one of the code words stored in said third storage unit is included in the bit string extracted by said extracting unit, and, when judged as being included, outputs the decoded data and the code length of the code word, said extracting unit, when said second judging unit judges that the code word is included, judges the beginning of the undecoded bit stream based on the code length outputted by said second judging unit, and extracts the bit string to be decoded next in either the same cycle as a cycle in which the judgment was made by said second judging unit or the subsequent cycle, said extracting unit, when said third judging unit judges that the code word is included, judges the beginning of the undecoded bit stream based on the code length outputted by said third judging unit, and extracts the bit string to be decoded next in any of the same cycle as a cycle in which the judgment was made by said third judging unit, the immediately subsequent cycle, and two cycles after the cycle in which the judgment was made by said third judging unit, and said variable length code decoding apparatus further includes: a first switch which switches a cycle in which bit string extraction is performed by said extracting unit, when said second judging unit judges that the code word is included, to either the same cycle as a cycle in which the judgment was made by said second judging unit or the subsequent cycle; and a second switch which switches a cycle in which bit string extraction is performed by said extracting unit, when said third judging unit judges that the code word is included, to any of the same cycle as a cycle in which the judgment was made by said third judging unit, the immediately subsequent cycle, and two cycles after the cycle in which the judgment was made by said third judging unit.

According to the configuration described above, with the variable length code decoding apparatus according to the present invention, decoding and bit stream extraction with respect to a code word including two coefficients are performed in a maximum of two cycles, and decoding and bit stream extraction with respect to a code word including three coefficients are performed in a maximum of three cycles. Accordingly, the duration of a cycle can be reduced. Therefore, the variable length code decoding apparatus according to the present invention is capable of decoding at high speed. In addition, the first switch and the second switch enables the variable length code decoding apparatus according to the present invention to switch the number of cycles required for decoding and bit string extraction. Accordingly, the time required for decoding a code word can be changed adaptively in accordance with operation frequencies and manufacturing processes.

Furthermore, the variable length code decoding apparatus according to the present invention is a variable length code decoding apparatus which decodes a bit stream including a code word that is data variable-length-coded by any of a first variable length coding, a second variable length coding, and a third variable length coding, said variable length code decoding apparatus includes: a bit stream supplying unit which extracts a bit string at least twice as long as a maximum code length of a code word used in the first variable length coding, the second variable length coding, and the third variable length coding, from a beginning of an undecoded bit stream; a first shifter which shifts the bit string extracted by said bit stream supplying unit, and outputs a bit string of at least the maximum code length of the code word used in the first variable length coding, from the beginning of the shifted bit string; a second shifter which shifts the bit string extracted by said bit stream supplying unit, and outputs a bit string of at least the maximum code length of the code word used in the second variable length coding and the third variable length coding, from the beginning of the shifted bit string; a first storage unit for storing a plurality of code words coded according to the first variable length coding, and decoded data and code lengths respectively corresponding to the code words; a second storage unit for storing a plurality of code words coded according to the second variable length coding, and decoded data and code lengths respectively corresponding to the code words; a third storage unit for storing a plurality of code words coded according to the third variable length coding, and decoded data and code lengths respectively corresponding to the code words; a first judging unit which judges whether one of the code words stored in said first storage unit is included in the bit string outputted by said first shifter, and, when judged as being included, outputs the decoded data and the code length of the code word; a second judging unit which judges whether one of the code words stored in said second storage unit is included in the bit string shifted by said second shifter, and, when judged as being included, outputs decoded data and a code length of the code word; a third judging unit which judges whether one of the code words stored in said third storage unit is included in the bit string shifted by said second shifter, and, when judged as being included, outputs decoded data and a code length of the code word; a first selecting unit which selects either the decoded data and the code length outputted by said second judging unit or the decoded data and the code length outputted by said third judging unit; and a second selecting unit which selects either the decoded data and the code length outputted by said first judging unit or the decoded data and the code length selected by said first selecting unit, wherein said bit stream supplying unit judges the beginning of the undecoded bit stream based on the code length selected by said second selecting unit, and extracts the bit string, said first shifter shifts the bit string extracted by said bit stream supplying unit by the code length outputted by said first judging unit, said second shifter shifts the bit string extracted by said bit stream supplying unit by the code length selected by said first selecting unit, a time required for the judgment by said first judging unit is longer than a time required for the judgment by said second judging unit, and a time required for the judgment by said first judging unit is longer than a time required for the judgment by said third judging unit.

According to the configuration described above, the variable length code decoding apparatus according to the present invention is capable of reducing a delay in a path of the first judging unit having maximum delay. More specifically, a code length outputted by the first judging unit is inputted to the first shifter. Meanwhile, code lengths outputted by the second judging unit and the third judging unit are inputted to the second shifter via the first selecting unit. As a result, the delay of the path of the first judging unit can be reduced in comparison to the delays in the paths of the second judging unit and the third judging unit. Accordingly, since the speed of a decoding process by the first judging unit having maximum delay can be increased, a decoding process by the variable length code decoding apparatus can now be performed at a higher speed.

Furthermore, the variable length code decoding method according to the present invention is a variable length code decoding method of decoding a bit stream including a code word that is variable-length-coded data, said variable length code decoding method includes: decoding a code word in which one piece of data is coded, and extracting a bit string to be decoded next from the bit stream based on a code length of the decoded code word, said decoding and said extracting being performed in one cycle; decoding, in a predetermined cycle, a code word in which two or more pieces of data are coded; and extracting, in a cycle subsequent to the predetermined cycle, a bit string to be decoded next from the bit stream based on a code length of the code word decoded in the predetermined cycle.

Accordingly, decoding of a code word in which two or more pieces of data are coded and bit string extraction are performed in two cycles. As a result, a duration of a cycle is determined by whichever is longer of a time required by decoding and a time required by bit string extraction. Therefore, the duration of a cycle can be reduced in comparison to a case where both a decoding process and a bit string extraction process are performed in one cycle. Consequently, the duration of a cycle can be reduced in comparison to a case where both a judgment process and a bit string extraction process are performed in one cycle. Decoded data in which is decoded a code word in which two or more pieces of data is coded includes two or more pieces of data. Therefore, the variable length code decoding method according to the present invention is capable of decoding one or more pieces of data per cycle. In other words, the variable length code decoding method according to the present invention is capable of decoding one or more pieces of data per cycle and, at the same time, reducing the duration of a cycle. Therefore, the variable length code decoding method according to the present invention is capable of decoding a code word in which is coded two or more pieces of data at high speed.

Furthermore, the number of code words in which one piece of data is coded is smaller than the number of code words in which two or more pieces of data are coded. Accordingly, the time required to decode a code word in which is coded one piece of data is shorter than the time required to decode a code word in which are coded two or more pieces of data. Therefore, the variable length code decoding method according to the present invention is capable of decoding a code word in which is coded one piece of data at high speed.

As described above, the variable length code decoding method according to the present invention is capable of decoding one or more pieces of data per cycle and, at the same time, capable of decoding a variable-length-coded code word at high speed.

It should be noted that the present invention may be realized not only as a variable length code decoding apparatus and a variable length code decoding method such as described above, but also as a program that causes a computer to execute the characteristic steps included in the variable length code decoding method. Needless to say, such programs can be distributed via a recording medium such as a CD-ROM or a transmission medium such as the Internet.

As shown, the present invention is capable of providing a variable length code decoding apparatus capable of decoding a variable-length-coded code word at high speed.

FURTHER INFORMATION ABOUT TECHNICAL BACKGROUND TO THIS APPLICATION

The disclosure of Japanese Patent Application No. 2007-117774 filed on Apr. 26, 2007 including specification, drawings and claims is incorporated herein by reference in its entirety.

BRIEF DESCRIPTION OF THE DRAWINGS

These and the other objects, advantages and features of the invention will become apparent from the following description thereof taken in conjunction with the accompanying drawings which illustrate a specific embodiment of the invention.

In the drawings:

FIG. 3 is a diagram showing an example of a variable length code table stored in a storage unit 111 according to the first embodiment of the present invention;

FIG. 4 is a diagram showing an example of a variable length code table stored in a storage unit 121 according to the first embodiment of the present invention;

FIG. 5 is a diagram showing operations of a variable length code decoding apparatus according to the first embodiment of the present invention;

FIG. 6 is a diagram showing examples of code words according to the first embodiment of the present invention;

FIG. 8 is a diagram showing operations of a variable length code decoding apparatus according to the second embodiment of the present invention;

FIG. 10 is a diagram showing operations of a variable length code decoding apparatus according to the third embodiment of the present invention;

FIG. 12 is a diagram showing an example of a variable length code table stored in a storage unit 411 according to the fourth embodiment of the present invention;

FIG. 13 is a diagram showing an example of a variable length code table stored in a storage unit 421 according to the fourth embodiment of the present invention;

FIG. 14 is a diagram showing an example of a variable length code table stored in a storage unit 431 according to the fourth embodiment of the present invention;

FIG. 15 is a diagram showing operations of a variable length code decoding apparatus according to the fourth embodiment of the present invention;

FIG. 17 is a diagram showing operations of a variable length code decoding apparatus according to the fifth embodiment of the present invention;

FIG. 19 is a diagram showing operations of a variable length code decoding apparatus according to the sixth embodiment of the present invention;

FIG. 20 is a diagram showing examples of code words according to the sixth embodiment of the present invention;

FIG. 22 is a diagram showing operations of a variable length code decoding apparatus according to the seventh embodiment of the present invention; and FIG. 23 is a diagram showing examples of code words according to the seventh embodiment of the present invention.

DESCRIPTION OF THE PREFERRED EMBODIMENTS

Variable length code decoding apparatuses according to embodiments of the present invention will now be described with reference to the drawings.

First Embodiment

A variable length code decoding apparatus according to a first embodiment of the present invention decodes a code word in which is coded two or more pieces of data in two cycles. Accordingly, since the duration of a cycle can be reduced, the speed of the variable length code decoding apparatus can be increased.

First, a configuration of a variable length code decoding apparatus according to the first embodiment of the present invention will be described.

Figure 2:
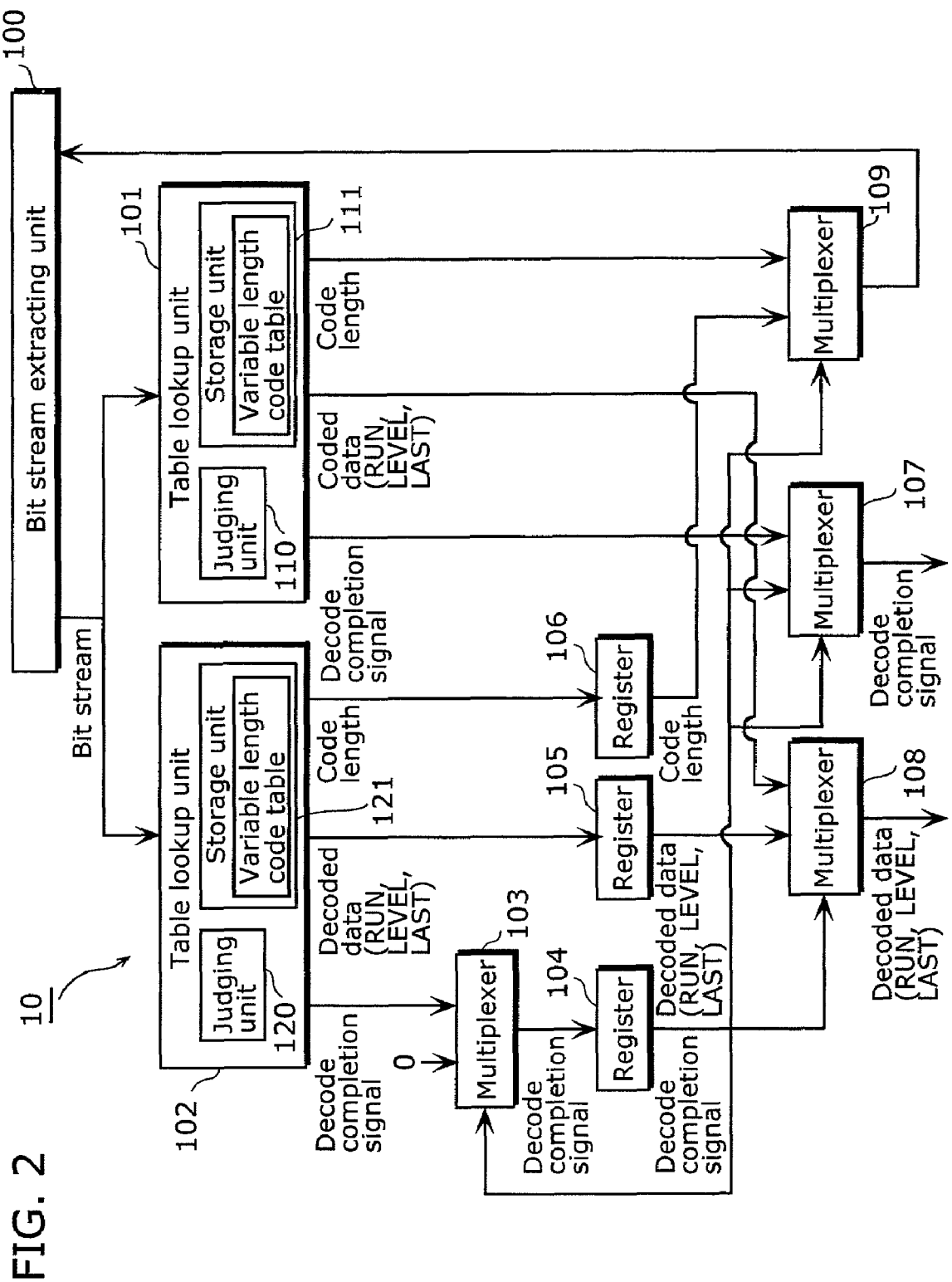
FIG. 2 is a block diagram showing a configuration of a variable length code decoding apparatus according to a first embodiment of the present invention.

FIG. 2 is a block diagram showing a configuration of a variable length code decoding apparatus according to the first embodiment of the present invention.

A variable length code decoding apparatus 10 shown in FIG. 2 decodes a bit stream including a code word that is variable-length-coded data and outputs decoded data. The variable length code decoding apparatus 10 includes a bit stream extracting unit 100, table lookup units 101 and 102, multiplexers 103, 107, 108, and 109, and registers 104, 105, and 106.

The bit stream extracting unit 100 extracts a bit string of at least a maximum code length of a code word used for variable length coding from the beginning of an undecoded bit stream. More specifically, the bit stream extracting unit 100 extracts a 32-bit bit string from the beginning of an undecoded bit stream and outputs the extracted bit string. In addition, the bit stream extracting unit 100 judges the beginning of an undecoded bit stream based on a code length selected by the multiplexer 109, and extracts a bit string.

The table lookup unit 101 includes a judging unit 110 and a storage unit 111.

The storage unit 111 stores a variable length code table that is a table of a plurality of code words including only one coefficient and decoded data and code lengths respectively corresponding to the code words. In this case, a coefficient refers to the number of pieces of data coded into a single code word by variable length coding. In other words, a code word including one coefficient is a code word into which one piece of data is coded.

The judging unit 110 collates a bit string extracted by the bit stream extracting unit 100 with a variable length code table stored in the storage unit 111, and judges whether a code word stored in the storage unit 111 is included in the bit string extracted by the bit stream extracting unit 100. The judging unit 110 outputs a decode completion signal indicating a judgment result to the multiplexer 107. More specifically, the judging unit 110 outputs a decode completion signal "1" in the case where a code word stored in the storage unit 111 is included in the bit string extracted by the bit stream extracting unit 100. It should be noted that a description such as 'a decode completion signal "1"' signifies that a logical value of "1" is outputted as a decode completion signal, and that similar notation shall be used hereinafter. The judging unit 110 outputs a decode completion signal "0" in the case where code words stored in the storage unit 111 are not included in the bit string extracted by the bit stream extracting unit 100. In addition, when a code word stored in the storage unit 111 is included in the bit string extracted by the bit stream extracting unit 100, the judging unit 110 outputs decoded data ("run", "level", "last") corresponding to the code word to the multiplexer 108 and outputs a code length corresponding to the code word to the multiplexer 109. Furthermore, when code words stored in the storage unit 111 are not included in the bit string extracted by the bit stream extracting unit 100, the judging unit 110 outputs arbitrary decoded data to the multiplexer 108 and outputs a code length "0" to the multiplexer 109.

The table lookup unit 102 includes a judging unit 120 and a storage unit 121.

The storage unit 121 stores a variable length code table that is a table of a plurality of code words including two or more coefficients as well as decoded data and code lengths respectively corresponding to the code words. In other words, the storage unit 121 stores a plurality of code words in which are coded two or more pieces of data, and decoded data and code lengths respectively corresponding to the code words.

The judging unit 120 collates a bit string extracted by the bit stream extracting unit 100 with a variable length code table stored in the storage unit 121, and judges whether a code word stored in the storage unit 121 is included in the bit string extracted by the bit stream extracting unit 100. The judging unit 120 outputs a decode completion signal indicating a judgment result to the multiplexer 103. More specifically, the judging unit 120 outputs a decode completion signal "1" in the case where a code word stored in the storage unit 121 is included in the bit string extracted by the bit stream extracting unit 100. The judging unit 120 outputs a decode completion signal "0" in the case where code words stored in the storage unit 121 are not included in the bit string extracted by the bit stream extracting unit 100. In addition, when a code word stored in the storage unit 121 is included in the bit string extracted by the bit stream extracting unit 100, the judging unit 120 outputs decoded data ("run", "level", "last") corresponding to the code word to the register 105 and outputs a code length corresponding to the code word to the register 106. Furthermore, when code words stored in the storage unit 121 are not included in the bit string extracted by the bit stream extracting unit 100, the judging unit 120 outputs arbitrary decoded data to the register 105 and outputs a code length "0" to the register 106.

The multiplexer 103 uses the decode completion signal retained in the register 104 as a selection signal and selects a signal to be outputted to the register 104. When the selection signal is "0", the multiplexer 103 selects a decode completion signal outputted by the table lookup unit 102, and when the selection signal is "1", the multiplexer 103 selects a fixed value "0".

The register 104 retains a decode completion signal selected by the multiplexer 103. The register 105 retains decoded data outputted by the table lookup unit 102. The register 106 retains a code length outputted by the table lookup unit 102.

In accordance with the decode completion signal retained in the register 104, the multiplexer 107 selects either a decode completion signal outputted by the table lookup unit 101 or the decode completion signal retained in the register 104. When the decode completion signal retained in the register 104 is "0", the multiplexer 107 selects the decode completion signal outputted by the table lookup unit 101. When the decode completion signal retained in the register 104 is "1", the multiplexer 107 selects the decode completion signal retained in the register 104.

In accordance with the decode completion signal retained in the register 104, the multiplexer 108 selects either decoded data outputted by the table lookup unit 101 or decoded data retained in the register 105. When the decode completion signal retained in the register 104 is "0", the multiplexer 108 selects decoded data outputted by the table lookup unit 101. When the decode completion signal retained in the register 104 is "1", the multiplexer 108 selects decoded data retained in the register 105.

In accordance with the decode completion signal retained in the register 104, the multiplexer 109 selects either a code length outputted by the table lookup unit 101 or a code length retained in the register 106. When the decode completion signal retained in the register 104 is "0", the multiplexer 109 selects the code length outputted by the table lookup unit 101. When the decode completion signal retained in the register 104 is "1", the multiplexer 109 selects the code length retained in the register 106.

When the judging unit 110 judges that a code word stored in the storage unit 111 is included in a bit string extracted by the bit stream extracting unit 100, the bit stream extracting unit 100 judges the beginning of an undecoded bit stream based on a code length outputted by the judging unit 110 and extracts a bit string to be next decoded in the same cycle as a cycle in which the judgment was made by the judging unit 110. In addition, when the judging unit 120 judges that a code word stored in the storage unit 121 is included in the bit string extracted by the bit stream extracting unit 100, the bit stream extracting unit 100 judges the beginning of an undecoded bit stream based on a code length outputted by the judging unit 120 and extracts a bit string to be next decoded in a cycle following the cycle in which the judgment is made by the judging unit 120.

FIG. 3 is a diagram showing an example of a variable length code table stored in the storage unit 111. FIG. 4 is a diagram showing an example of a variable length code table stored in the storage unit 121.

As shown in FIGS. 3 and 4, the variable length code tables stored in the storage units 111 and 121 include code words, "run", "level", and "last" which are decoded data of code words, and code lengths that are lengths (number of bits) of codes of code words. The variable length code tables stored in the storage units 111 and 121 are tables of variable length codes having a maximum code length of 32 bits in which is coded a single group made up of "run", "level", and "last". Note that, in FIGS. 3 and 4, reference character a1 denotes a single bit, and reference character e1-e4 and the like denote bit strings containing 4 bits of successive pieces of data, namely, e1, e2, e3 and e4. In addition, the variable length code table stored in the storage unit 111 is a table corresponding to code words including only one coefficient. The variable length code table stored in the storage unit 121 is a table corresponding to code words including two or more coefficients.

"Run" indicates the number of preceding coefficients whose values are "0". "Level" indicates the value of coefficients whose values are not "0". "Last" indicates that a code word is the last in a block made up of a total of 64 coefficients wherein 8 coefficients are arranged both horizontally and vertically.

In this case, a bit stream to be decoded by the variable length code decoding apparatus 10 is digital video data. In addition, a variable length coding to be applied uses units of blocks made up of a total of 64 coefficients wherein 8 coefficients are arranged both horizontally and vertically. In the variable length coding, a coefficient whose value is "0" and a coefficient whose value is not "0" among successive coefficients in a block are coded into a single code word. That is, "run" corresponds to the number of coefficients included in a code word, whereby the number of coefficients included in the code word is a value obtained by adding 1 to the "run" value. For example, as in the case of the code word a1 shown in FIG. 3, a code word having a "run" value of "0" is a code word including one coefficient. In addition, the code word c1-c32 shown in FIG. 4 has a "run" value of "2" and is a code word including three coefficients.

When using the tables shown in FIGS. 3 and 4, for example, with a signal represented by "1, 0, 2, 0, 0, 3", the first "1" is coded into a single code word a1. The following "0, 2" is coded into a single code word b1-b16. The following "0, 0, 3" is coded into a single code word c1-c32. As shown, by coding a plurality of coefficients including coefficients whose values are "0" into single code words, the amount of data can be efficiently reduced.

Next, operations of the variable length code decoding apparatus 10 according to the first embodiment of the present invention will be described.

The variable length code decoding apparatus 10 according to the first embodiment of the present invention decodes a code word including one coefficient and, based on a code length of the decoded code word, extracts a bit string to be next decoded from a bit stream in a single cycle. In addition, the variable length code decoding apparatus 10 decodes a code word in which two or more pieces of data are coded in a predetermined cycle and, based on a code length of the code word decoded in the predetermined cycle, extracts a bit string to be next decoded from a bit stream in a cycle following the predetermined cycle.

FIG. 5 is a diagram showing specific operations performed by the variable length code decoding apparatus 10. FIG. 6 is a diagram showing examples of code words included in a bit stream inputted to the variable length code decoding apparatus 10. An operation for decoding a bit stream "a1b1-b16c1-c32" by the variable length code decoding apparatus 10 will now be described.

Note that the code word a1 shown in FIG. 6 whose "run" value is "0" is stored in the table lookup unit 101 and the code words b1-b16 and c1-c32 whose "run" values are equal to or greater than "1" are stored in the table lookup unit 102.

In addition, the bit stream extracting unit 100 outputs "a1b1-b16c1-c15" as an initial value, the register 104 retains "0" as an initial value, the register 105 retains "(0, 0, 0)" as an initial value and the register 106 retains "0" as an initial value.

<0th Cycle>

In the 0th cycle, the bit stream extracting unit 100 outputs an initial value "a1b1-b16c1-c15".

Since the bit string "a1b1-b16c1-c15" extracted by the bit stream extracting unit 100 and the code word "a1" stored in the table lookup unit 101 are consistent, the table lookup unit 101 outputs a decode completion signal "1", outputs decoded data ("run", "level", "last") "(0, 1, 0)", and outputs a code length "1".

Since the bit string "a1b1-b16c1-c15" extracted by the bit stream extracting unit 100 and code words stored in the table lookup unit 102 are inconsistent, the table lookup unit 102 outputs a decode completion signal "0", outputs decoded data ("run", "level", "last") "(x, x, x)" (where x is an arbitrary value), and outputs a code length "0".

Since the decode completion signal retained in the register 104 is "0", the multiplexer 103 selects the decode completion signal "0" outputted by the table lookup unit 102.

The register 104 retains an initial value decode completion signal "0", the register 105 retains initial value decoded data "0, 0, 0", and the register 106 retains an initial value code length "0".

Since the decode completion signal retained in the register 104 is "0", the multiplexer 107 selects the decode completion signal "1" outputted by the table lookup unit 101. Since the decode completion signal retained in the register 104 is "0", the multiplexer 108 selects the decoded data "(0, 1, 0)" outputted by the table lookup unit 101. Since the decode completion signal retained in the register 104 is "0", the multiplexer 109 selects the code length "1" outputted by the table lookup unit 101.

Since the code length selected by the multiplexer 109 is "1", the bit stream extracting unit 100 shifts the first bit by 1 bit and extracts a bit string "b1-b16c1-c16". In the next cycle, the bit stream extracting unit 100 outputs the extracted bit string "b1-b16c1-c16".

The register 104 loads the decode completion signal "0" selected by the multiplexer 103, and outputs the decode completion signal "0" in the next cycle. The register 105 loads the decoded data "(x, x, x)" outputted by the table lookup unit 102, and outputs the decoded data "(x, x, x)" in the next cycle. The register 106 loads the code length "0" outputted by the table lookup unit 102, and outputs the code length "0" in the next cycle.

<1st Cycle>

In the 1st cycle, the bit stream extracting unit 100 outputs the bit string "b1-b16c1-c16" extracted in the 0th cycle.

Since the bit string "b1-b16c1-c16" extracted by the bit stream extracting unit 100 and code words stored in the table lookup unit 101 are inconsistent, the table lookup unit 101 outputs a decode completion signal "0", outputs decoded data ("run", "level", "last") "(x, x, x)", and outputs a code length "0".

Since the bit string "b1-b16c1-c16" extracted by the bit stream extracting unit 100 and the code word "b1-b16" stored in the table lookup unit 102 are consistent, the table lookup unit 102 outputs a decode completion signal "1", outputs decoded data ("run", "level", "last") "(1, 2, 0)", and outputs a code length "16".

Since the decode completion signal retained in the register 104 is "0", the multiplexer 103 selects the decode completion signal "1" outputted by the table lookup unit 102.

The register 104 retains the decode completion signal "0" loaded in the 0th cycle. The register 105 retains the decoded data "(x, x, x)" loaded in the 0th cycle. The register 106 retains the code length "0" loaded in the 0th cycle.

Since the decode completion signal retained in the register 104 is "0", the multiplexer 107 selects the decode completion signal "0" outputted by the table lookup unit 101. Since the decode completion signal retained in the register 104 is "0", the multiplexer 108 selects the decoded data "(x, x, x)" outputted by the table lookup unit 101. Since the decode completion signal retained in the register 104 is "0", the multiplexer 109 selects the code length "0" outputted by the table lookup unit 101.

Since the code length selected by the multiplexer 109 is "0", the bit stream extracting unit 100 extracts a bit string "b1-b16c1-c16". In the next cycle, the bit stream extracting unit 100 outputs the extracted bit string "b1-b16c1-c16".

The register 104 loads the decode completion signal "1" selected by the multiplexer 103, and outputs the decode completion signal "1" in the next cycle. The register 105 loads the decoded data "(1, 2, 0)" outputted by the table lookup unit 102, and outputs the decoded data "(1, 2, 0)" in the next cycle. The register 106 loads the code length "16" outputted by the table lookup unit 102, and outputs the code length "16" in the next cycle.

<2nd Cycle>

In the 2nd cycle, the bit stream extracting unit 100 outputs the bit string "b1-b16c1-c16" extracted in the 1st cycle.

Since the bit string "b1-b16c1-c16" extracted by the bit stream extracting unit 100 and code words stored in the table lookup unit 101 are inconsistent, the table lookup unit 101 outputs a decode completion signal "0", outputs decoded data ("run", "level", "last") "(x, x, x)", and outputs a code length "0".

Since the bit string "b1-b16c1-c16" extracted by the bit stream extracting unit 100 and the code word "b1-b16" stored in the table lookup unit 102 are consistent, the table lookup unit 102 outputs a decode completion signal "1", outputs decoded data ("run", "level", "last") "(1, 2, 0)", and outputs a code length "16".

Since the decode completion signal retained in the register 104 is "1", the multiplexer 103 selects a fixed value "0".

The register 104 retains the decode completion signal "1" loaded in the 1st cycle. The register 105 retains the decoded data "(1, 2, 0)" loaded in the 1st cycle. The register 106 retains the code length "16" loaded in the 1st cycle.

Since the decode completion signal retained in the register 104 is "1", the multiplexer 107 selects the decode completion signal "1" retained in the register 104. Since the decode completion signal retained in the register 104 is "1", the multiplexer 108 selects the decoded data "(1, 2, 0)" retained in the register 105. Since the decode completion signal retained in the register 104 is "1", the multiplexer 109 selects the code length "16" retained in the register 106.

Since the code length selected by the multiplexer 109 is "16", the bit stream extracting unit 100 shifts the first bit by 16 bits and extracts a bit string "c1-c16". In the next cycle, the bit stream extracting unit 100 outputs the extracted bit string "c1-c16".

The register 104 loads the decode completion signal "0" selected by the multiplexer 103, and outputs the decode completion signal "0" in the next cycle. The register 105 loads the decoded data "(1, 2, 0)" outputted by the table lookup unit 102, and outputs the decoded data "(1, 2, 0)" in the next cycle. The register 106 loads the code length "16" outputted by the table lookup unit 102, and outputs the code length "16" in the next cycle.

<3rd Cycle>

In the 3rd cycle, the bit stream extracting unit 100 outputs the bit string "c1-c32" extracted in the 2nd cycle.

Since the bit string "c1-c32" extracted by the bit stream extracting unit 100 and code words stored in the table lookup unit 101 are inconsistent, the table lookup unit 101 outputs a decode completion signal "0", outputs decoded data ("run", "level", "last") "(x, x, x)", and outputs a code length "0".

Since the bit string "c1-c32" extracted by the bit stream extracting unit 100 and the code word "c1-c32" stored in the table lookup unit 102 are consistent, the table lookup unit 102 outputs a decode completion signal "1", outputs decoded data ("run", "level", "last") "(2, 3, 1)", and outputs a code length "32".

Since the decode completion signal retained in the register 104 is "0", the multiplexer 103 selects the decode completion signal "1" outputted by the table lookup unit 102.

The register 104 retains the decode completion signal "0" loaded in the 2nd cycle. The register 105 retains the decoded data "(1, 2, 0)" loaded in the 2nd cycle. The register 106 retains the code length "16" loaded in the 2nd cycle.

Since the decode completion signal retained in the register 104 is "0", the multiplexer 107 selects the decode completion signal "0" outputted by the table lookup unit 101. Since the decode completion signal retained in the register 104 is "0", the multiplexer 108 selects the decoded data "(x, x, x)" outputted by the table lookup unit 101. Since the decode completion signal retained in the register 104 is "0", the multiplexer 109 selects the code length "0" outputted by the table lookup unit 101.

Since the code length selected by the multiplexer 109 is "0", the bit stream extracting unit 100 extracts a bit string "c1-c16". In the next cycle, the bit stream extracting unit 100 outputs the extracted bit string "c1-c16".

The register 104 loads the decode completion signal "1" selected by the multiplexer 103, and outputs the decode completion signal "1" in the next cycle. The register 105 loads the decoded data "(2, 3, 1)" outputted by the table lookup unit 102, and outputs the decoded data "(2, 3, 1)" in the next cycle. The register 106 loads the code length "32" outputted by the table lookup unit 102, and outputs the code length "32" in the next cycle.

<4th Cycle>

In the 4th cycle, the bit stream extracting unit 100 outputs the bit string "c1-c32" extracted in the 3rd cycle.

Since the bit string "c1-c32" extracted by the bit stream extracting unit 100 and code words stored in the table lookup unit 101 are inconsistent, the table lookup unit 101 outputs a decode completion signal "0", outputs decoded data ("run", "level", "last") "(x, x, x)", and outputs a code length "0".

Since the bit string "c1-c32" extracted by the bit stream extracting unit 100 and the code word "c1-c32" stored in the table lookup unit 102 are consistent, the table lookup unit 102 outputs a decode completion signal "1", outputs decoded data ("run", "level", "last") "(2, 3, 1)", and outputs a code length "32".

Since the decode completion signal retained in the register 104 is "1", the multiplexer 103 selects a fixed value "0".

The register 104 retains the decode completion signal "1" loaded in the 3rd cycle. The register 105 retains the decoded data "(2, 3, 1)" loaded in the 3rd cycle. The register 106 retains the code length "32" loaded in the 3rd cycle.

Since the decode completion signal retained in the register 104 is "1", the multiplexer 107 selects the decode completion signal "1" retained in the register 104. Since the decode completion signal retained in the register 104 is "1", the multiplexer 108 selects the decoded data "(2, 3, 1)" retained in the register 105. Since the decode completion signal retained in the register 104 is "1", the multiplexer 109 selects the code length "32" retained in the register 106.

Accordingly, the variable length code decoding apparatus 10 according to the first embodiment of the present embodiment decodes a code word including one coefficient using the table lookup unit 101 and decodes a code word including two or more coefficients using the table lookup unit 102.

In this case, the number of code words included in a variable length code table stored in the table lookup unit 101 is smaller than the number of code words included in a variable length code table stored in the table lookup unit 102. For example, with respect to "run" values "0" to "5" in the table lookup units 101 and 102, assuming that code words of respective levels thereof are stored, code words whose "run" values are "0" are stored in the table lookup unit 101 and code words whose "run" values range from "1" to "5" are stored in the table lookup unit 102. Therefore, the number of code words stored in the table lookup unit 101 is approximately ⅕ of the number of code words stored in the table lookup unit 102. Accordingly, the time required for collation by the table lookup unit 101 becomes shorter than the time required for collation by the table lookup unit 102.

Figure 1:
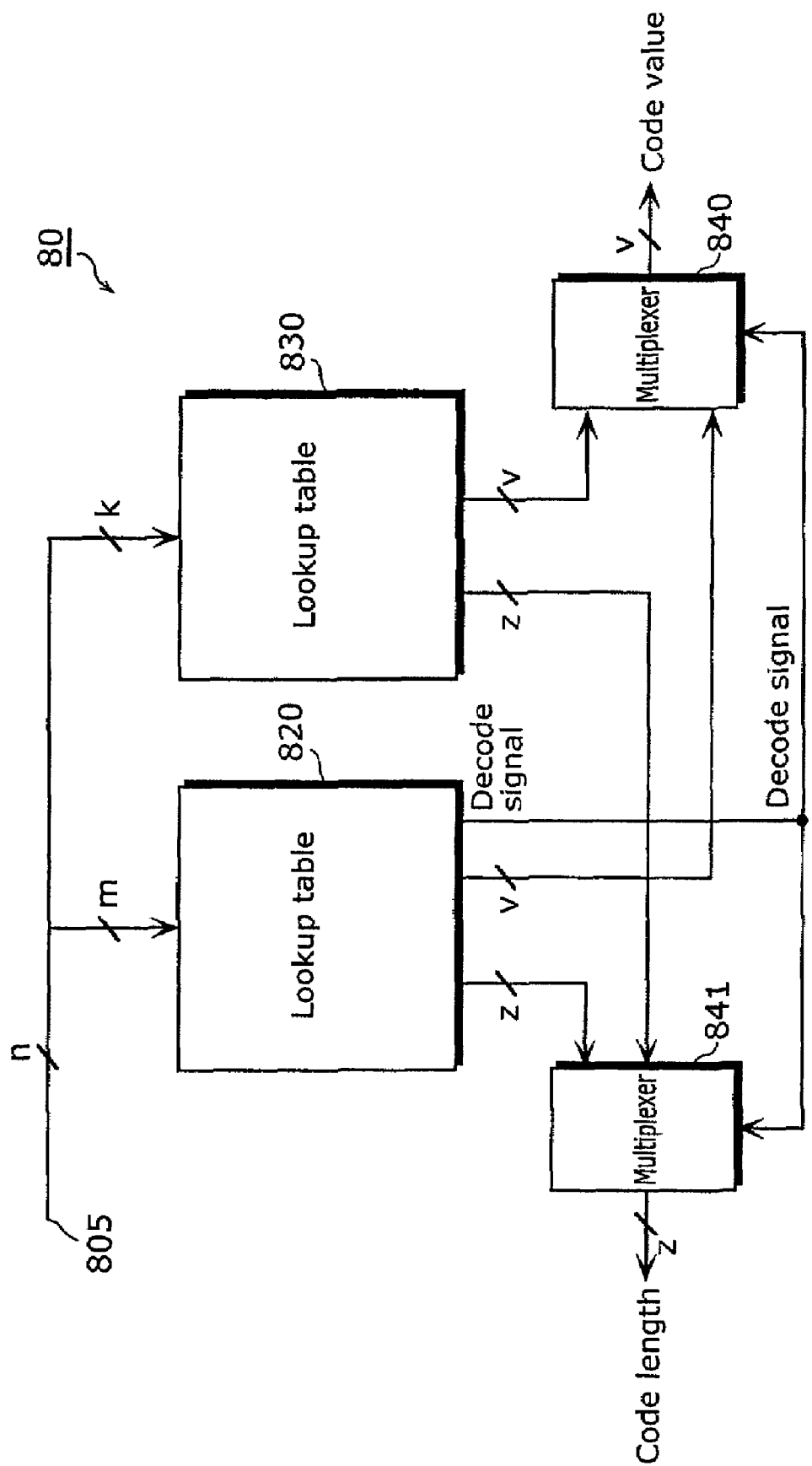
FIG. 1 is a block diagram showing a configuration of a conventional variable length code decoding apparatus.

On the other hand, when performing decoding using two lookup tables 820 and 830 as shown in FIG. 1, the time required for decoding one code word is determined by whichever is longer of the times required for collation by the lookup tables 820 and 830. In this case, the length of a code word collated by the lookup table 820 or 830 is equal to or greater than half of the entire code word. The length of a code word collated by the table lookup unit 101 of the variable length code decoding apparatus 10 according to the first embodiment of the present invention is equal to or less than half of the entire code word. Therefore, compared to a conventional variable length code decoding apparatus, the variable length code decoding apparatus 10 according to the first embodiment of the present invention is capable of decoding a code word including one coefficient at high speed.

In addition, decoded data, a code length and a decode completion signal of a code word including two or more coefficients and which is decoded by the table lookup unit 102 is temporarily retained in the registers 104, 105, and 106. Furthermore, in the next cycle, the decoded data, the code length and the decode completion signal retained in the registers 104, 105, and 106 are outputted via the multiplexers 107, 108, and 109, and a bit string extraction process is performed by the bit stream extracting unit 100. More specifically, decoding of a code word including two more coefficients and bit string extraction are performed in two cycles. Accordingly, the duration of a cycle is determined by whichever is longer of a time required for collation by the table lookup unit 102 and a time required for bit string extraction by the bit stream extracting unit 100. Consequently, the duration of a cycle can be reduced in comparison to a case where both a collation process and a bit string extraction process are performed in one cycle, as is the case with a conventional variable length code decoding apparatus.

In this case, decoded data in which is decoded a code word including two or more coefficients includes two or more pieces of data. Accordingly, even when a code word including two or more coefficients is decoded in two cycles, one or more pieces of data can be decoded per cycle. Therefore, the variable length code decoding apparatus 10 according to the first embodiment of the present invention achieves increased speed by decoding one or more pieces of data per cycle with respect to a code word including two or more coefficients and by reducing the duration of a cycle.

In addition, since a code word including one coefficient is decoded in one cycle, the variable length code decoding apparatus 10 according to the first embodiment of the present invention is capable of decoding one or more pieces of data per cycle.

As described above, the variable length code decoding apparatus 10 according to the first embodiment of the present invention is capable of decoding one or more pieces of data per cycle and, at the same time, decoding a variable-length-coded code word at high speed.

It should be noted that while the above description assumes that, when there are no consistent code words, a code length of "0" is outputted by the table lookup units 101 and 102 to prevent the bit stream extracting unit 100 from performing a process for shifting the starting position of the bit stream, the following process may be performed instead.

The bit stream extracting unit 100 may judge whether a code length selected by the multiplexer 109 is valid based on a decode completion signal selected by the multiplexer 107. In other words, when the decode completion signal selected by the multiplexer 107 is "0", the bit stream extracting unit 100 judges that the code length selected by the multiplexer 109 is invalid and does not judge the beginning of an undecoded bit stream on the basis of the code length. In addition, when the decode completion signal selected by the multiplexer 107 is "1", the bit stream extracting unit 100 judges that the code length selected by the multiplexer 109 is valid, judges the beginning of an undecoded bit stream on the basis of the code length, and performs bit string extraction.

Accordingly, the table lookup unit 101 and the table lookup unit 102 are able to output an arbitrary code length when an inputted bit string and stored code words are inconsistent. Therefore, since the configurations of the table lookup unit 101 and the table lookup unit 102 can be simplified, higher speeds and smaller capacities of the table lookup unit 101 and the table lookup unit 102 can be achieved.

Furthermore, in the above description, while the storage unit 111 of the table lookup unit 101 is arranged to store code words including one coefficient, a portion of code words including two or more coefficients may be stored in addition to the code words including one coefficient.

Second Embodiment

In a variable length code decoding apparatus according to a second embodiment of the present invention, the bit stream extracting unit is provided with shifters respectively corresponding to the table lookup units 101 and 102. Consequently, a bit string extraction process can be performed at high speed.

First, a configuration of a variable length code decoding apparatus according to the second embodiment of the present invention will be described.

Figure 7:
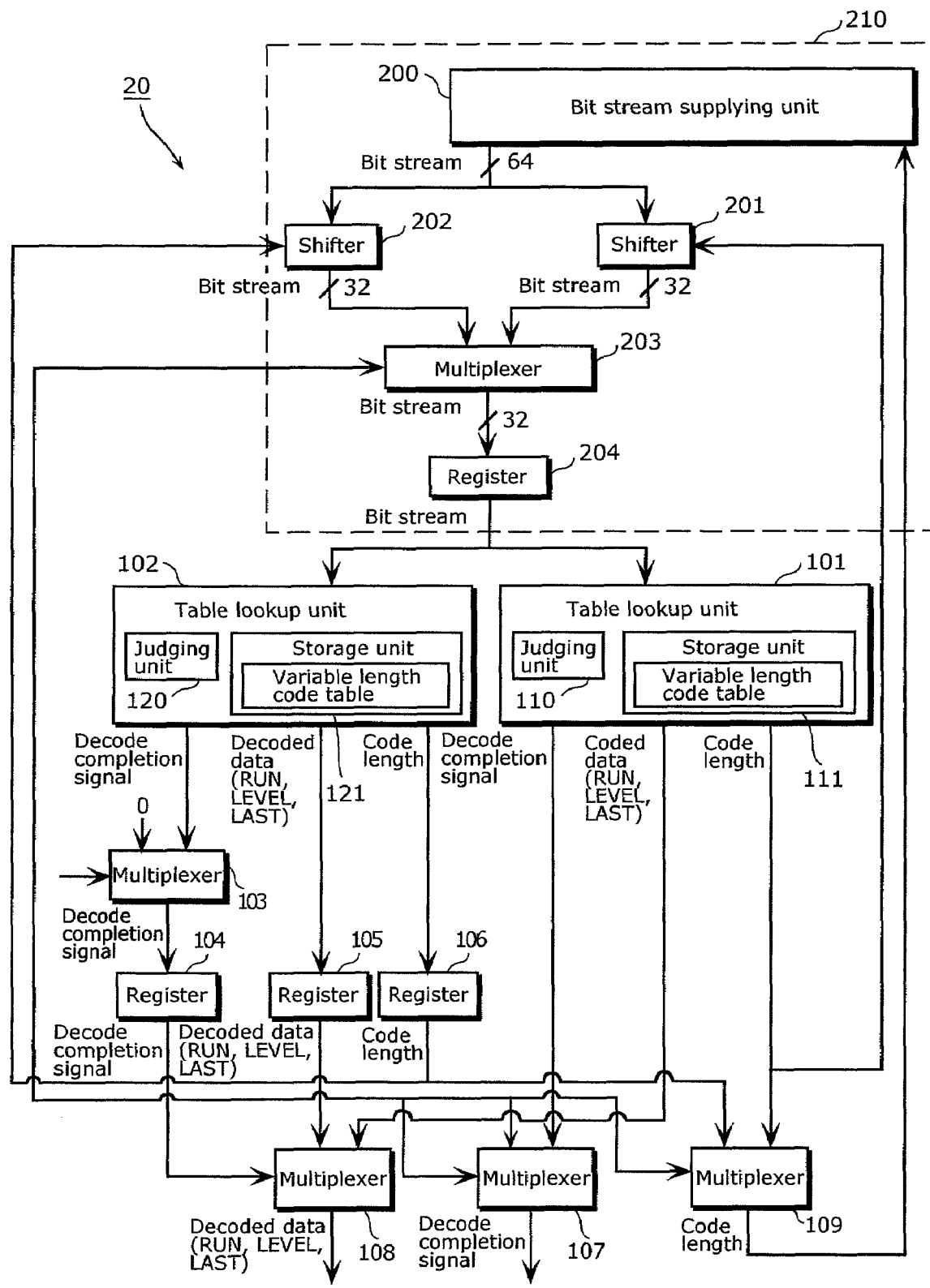
FIG. 7 is a block diagram showing a configuration of a variable length code decoding apparatus according to a second embodiment of the present invention.

FIG. 7 is a block diagram showing a configuration of a variable length code decoding apparatus 20 according to the second embodiment of the present invention. Note that like elements to those shown in FIG. 2 are assigned like reference numerals and descriptions thereof will be omitted.

The variable length code decoding apparatus 20 shown in FIG. 7 decodes a bit stream including a code word that is variable-length-coded data and outputs decoded data. The variable length code decoding apparatus 20 includes a bit stream extracting unit 210, table lookup units 101 and 102, multiplexers 103, 107, 108, and 109, and registers 104, 105, and 106. The variable length code decoding apparatus 20 differs from the variable length code decoding apparatus 10 according to the first embodiment in the configuration of the bit stream extracting unit 210.

The bit stream extracting unit 210 extracts a bit string of at least a maximum code length of a code word used for variable length coding from the beginning of an undecoded bit stream. The bit stream extracting unit 210 includes a bit stream supplying unit 200, shifters 201 and 202, a multiplexer 203, and a register 204.

The bit stream supplying unit 200 judges a beginning of an undecoded bit stream based on a code length selected by the multiplexer 109. The bit stream supplying unit 200 extracts a bit string that is at least twice as long as a maximum code length of a code word used for variable length coding from the beginning of the judged undecoded bit stream. More specifically, the bit stream supplying unit 200 extracts a 64-bit bit string and outputs the same to the shifters 201 and 202.

The shifter 201 shifts the bit string extracted by the bit stream supplying unit 200 to the left by a code length outputted by the table lookup unit 101, and outputs a bit string of at least a maximum code length of the code word used in the variable length coding from the beginning of the shifted bit string. More specifically, the shifter 201 outputs a 32-bit bit string. In addition, the shifter 201 is capable of shifting only by the number of bits of a code length stored in the storage unit 111. For example, when code lengths of 1 to 4 and 8 bits are stored in the storage unit 111, shifting by 1 to 4 bits and 8 bits can be performed while shifting by other numbers of bits (5 to 7 bits and the like) cannot be performed.

The shifter 202 shifts the bit string extracted by the bit stream supplying unit 200 to the left by a code length outputted by the table lookup unit 102, and outputs a bit string of at least a maximum code length of the code word used in the variable length coding from the beginning of the shifted bit string. More specifically, the shifter 202 outputs a 32-bit bit string. In addition, the shifter 202 is capable of shifting only by the number of bits of a code length stored in the storage unit 121. For example, when code lengths of 5 to 32 are stored in the storage unit 121, shifting by 5 to 32 bits can be performed while shifting by other numbers of bits (1 to 4 bits and the like) cannot be performed.

In accordance with the decode completion signal retained in the register 104, the multiplexer 203 selects either the bit string outputted by the shifter 201 or the bit string outputted by the shifter 202. When the decode completion signal retained in the register 104 is "0", the multiplexer 203 selects and outputs the bit string outputted by the shifter 201. When the decode completion signal retained in the register 104 is "1", the multiplexer 203 selects and outputs the bit string outputted by the shifter 202.

The register 204 retains the bit string selected by the multiplexer 203.

Next, operations of the variable length code decoding apparatus 20 according to the second embodiment of the present invention will be described.

FIG. 8 is a diagram showing specific operations performed by the variable length code decoding apparatus 20. An operation for decoding a bit stream "a1b1-b16c1-c32" by the variable length code decoding apparatus 20 will now be described. Note that code words a1, b1-b16 and c1-c32 are code words shown in FIG. 6. In addition, descriptions on like operations to those shown in FIG. 5 will be omitted, and only the operations of the bit stream extracting unit 210 will be described.

The bit stream supplying unit 200 outputs "a1b1-b16c1-c32d1-d15" as an initial value, and the register 204 retains "a1b1-b16c1-c15" as an initial value.

<0th Cycle>

In the 0th cycle, the bit stream supplying unit 200 outputs an initial value "a1b1-b16c1-c32d1-d15".

The shifter 201 shifts the bit string "a1b1-b16c1-c32d1-d15" outputted by the bit stream supplying unit 200 to the left by a code length "1" outputted by the table lookup unit 101, and outputs a bit string "b1-b16c1-c16".

The shifter 202 shifts the bit string "a1b1-b16c1-c32d1-d15" outputted by the bit stream supplying unit 200 to the left by a code length "0" retained in the register 106, and outputs a bit string "a1b1-b16c1-c15".

Since the decode completion signal retained in the register 104 is "0", the multiplexer 203 selects the bit string "b1-b16c1-c16" outputted by the shifter 201.

The register 204 retains an initial value "a1b1-b16c1-c15".

Since the code length selected by the multiplexer 109 is "1", the bit stream supplying unit 200 shifts the first bit by 1 bit and extracts a bit string "b1-b16c1-c32d1-d16". In the next cycle, the bit stream supplying unit 200 outputs the extracted bit string "b1-b16c1-c32d1-d16".

The register 204 loads the bit string "b1-b16c1-c16" selected by the multiplexer 203, and outputs the bit string "b1-b16c1-c16" in the next cycle.

<1st Cycle>

In the 1st cycle, the bit stream supplying unit 200 outputs the bit string "b1-b16c1-c32d1-d16" extracted in the 0th cycle.

The shifter 201 shifts the bit string "b1-b16c1-c32d1-d16" outputted by the bit stream supplying unit 200 to the left by a code length "0" outputted by the table lookup unit 101, and outputs a bit string "b1-b16c1-c16".

The shifter 202 shifts the bit string "b1-b16c1-c32d1-d16" outputted by the bit stream supplying unit 200 to the left by the code length "0" retained in the register 106, and outputs a bit string "b1-b16c1-c16".

Since the decode completion signal retained in the register 104 is "0", the multiplexer 203 selects the bit string "b1-b16c1-c16" outputted by the shifter 201.

The register 204 retains "b1-b16c1-c16" loaded in the 0th cycle.

Since the code length selected by the multiplexer 109 is "0", the bit stream supplying unit 200 extracts the bit string "b1-b16c1-c32d1-d16". In the next cycle, the bit stream supplying unit 200 outputs the extracted bit string "b1-b16c1-c32d1-d16".

The register 204 loads the bit string "b1-b16c1-c16" selected by the multiplexer 203, and outputs the bit string "b1-b16c1-c16" in the next cycle.

<2nd Cycle>

In the 2nd cycle, the bit stream supplying unit 200 outputs the bit string "b1-b16c1-c32d1-d16" extracted in the 1st cycle.

The shifter 201 shifts the bit string "b1-b16c1-c32d1-d16" outputted by the bit stream supplying unit 200 to the left by a code length "0" outputted by the table lookup unit 101, and outputs a bit string "b1-b16c1-c16".

The shifter 202 shifts the bit string "b1-b16c1-c32d1-d16" outputted by the bit stream supplying unit 200 to the left by a code length "16" retained in the register 106, and outputs a bit string "c1-c32".

Since the decode completion signal retained in the register 104 is "1", the multiplexer 203 selects the bit string "c1-c32" outputted by the shifter 202.

The register 204 retains "b1-b16c1-c16" loaded in the 1st cycle.

Since the code length selected by the multiplexer 109 is "16", the bit stream supplying unit 200 shifts the first bit by 16 bits and extracts a bit string "c1-c32d1-d32". In the next cycle, the bit stream supplying unit 200 outputs the extracted bit string "c1-c32d1-d32".

The register 204 loads the bit string "c1-c32" selected by the multiplexer 203, and outputs the bit string "c1-c32" in the next cycle.

<3rd Cycle>

In the 3rd cycle, the bit stream supplying unit 200 outputs the bit string "c1-c32d1-d32" extracted in the 2nd cycle.

The shifter 201 shifts the bit string "c1-c32d1-d32" outputted by the bit stream supplying unit 200 to the left by a code length "0" outputted by the table lookup unit 101, and outputs a bit string "c1-c32".

The shifter 202 shifts the bit string "c1-c32d1-d32" outputted by the bit stream supplying unit 200 to the left by a code length "0" retained in the register 106, and outputs a bit string "c1-c32".

Since the decode completion signal retained in the register 104 is "0", the multiplexer 203 selects the bit string "c1-c32" outputted by the shifter 201.

The register 204 retains "c1-c32" loaded in the 2nd cycle.

Since the code length selected by the multiplexer 109 is "0", the bit stream supplying unit 200 extracts a bit string "c1-c32d1-d32". In the next cycle, the bit stream supplying unit 200 outputs the extracted bit string "c1-c32d1-d32".

The register 204 loads the bit string "c1-c32" selected by the multiplexer 203, and outputs the bit string "c1-c32" in the next cycle.

<4th Cycle>

In the 4th cycle, the bit stream supplying unit 200 outputs the bit string "c1-c32d1-d32" extracted in the 3rd cycle.

The shifter 201 shifts the bit string "c1-c32d1-d32" outputted by the bit stream supplying unit 200 to the left by a code length "0" outputted by the table lookup unit 101, and outputs a bit string "c1-c32".

The shifter 202 shifts the bit string "c1-c32d1-d32" outputted by the bit stream supplying unit 200 to the left by a code length "32" retained in the register 106, and outputs a bit string "d1-d32".

Since the decode completion signal retained in the register 104 is "1", the multiplexer 203 selects the bit string "d1-d32" outputted by the shifter 202.

The register 204 retains "c1-c32" loaded in the 3rd cycle.

As shown, the bit stream extracting unit 210 is capable of extracting a bit string of a maximum code length (32 bits) of a code word used for variable length coding from the beginning of an undecoded bit stream and outputting the extracted bit string to the table lookup units 101 and 102.

Accordingly, the bit stream extracting unit 210 of the variable length code decoding apparatus 20 according to the second embodiment of the present invention includes the shifter 201 corresponding to the table lookup unit 101 that decodes code words including only one coefficient and the shifter 202 corresponding to the table lookup unit 102 that decodes code words including a plurality of coefficients. In this case, the shifter 201 is only provided with a function for performing shifting by the number of bits equivalent to a code length of a code word stored in the storage unit 111 of the table lookup unit 101. In addition, the shifter 202 is only provided with a function for performing shifting by the number of bits equivalent to a code length of a code word stored in the storage unit 121 of the table lookup unit 102. In other words, providing a configuration wherein the numbers of bits that can be shifted by the shifters 201 and 202 are limited to code lengths outputtable by the corresponding variable length code tables, the speeds of the shifters 201 and 202 can be increased. Accordingly, the variable length code decoding apparatus 20 according to the second embodiment of the present invention is capable of reducing the time required by a process for extracting a bit string from the beginning of an undecoded bit stream using the code length of a decoded code word. Therefore, the variable length code decoding apparatus 20 according to the second embodiment of the present invention is capable of decoding a variable-length-coded code word at high speed.

Third Embodiment

A variable length code decoding apparatus according to a third embodiment of the present invention is a modification of the variable length code decoding apparatus 10 according to the first embodiment, and further includes a table lookup unit that decodes a code word including two or more coefficients in one cycle. Consequently, the time required for decoding a code word including two or more coefficients can be reduced.

First, a configuration of a variable length code decoding apparatus according to the third embodiment of the present invention will be described.

Figure 9:
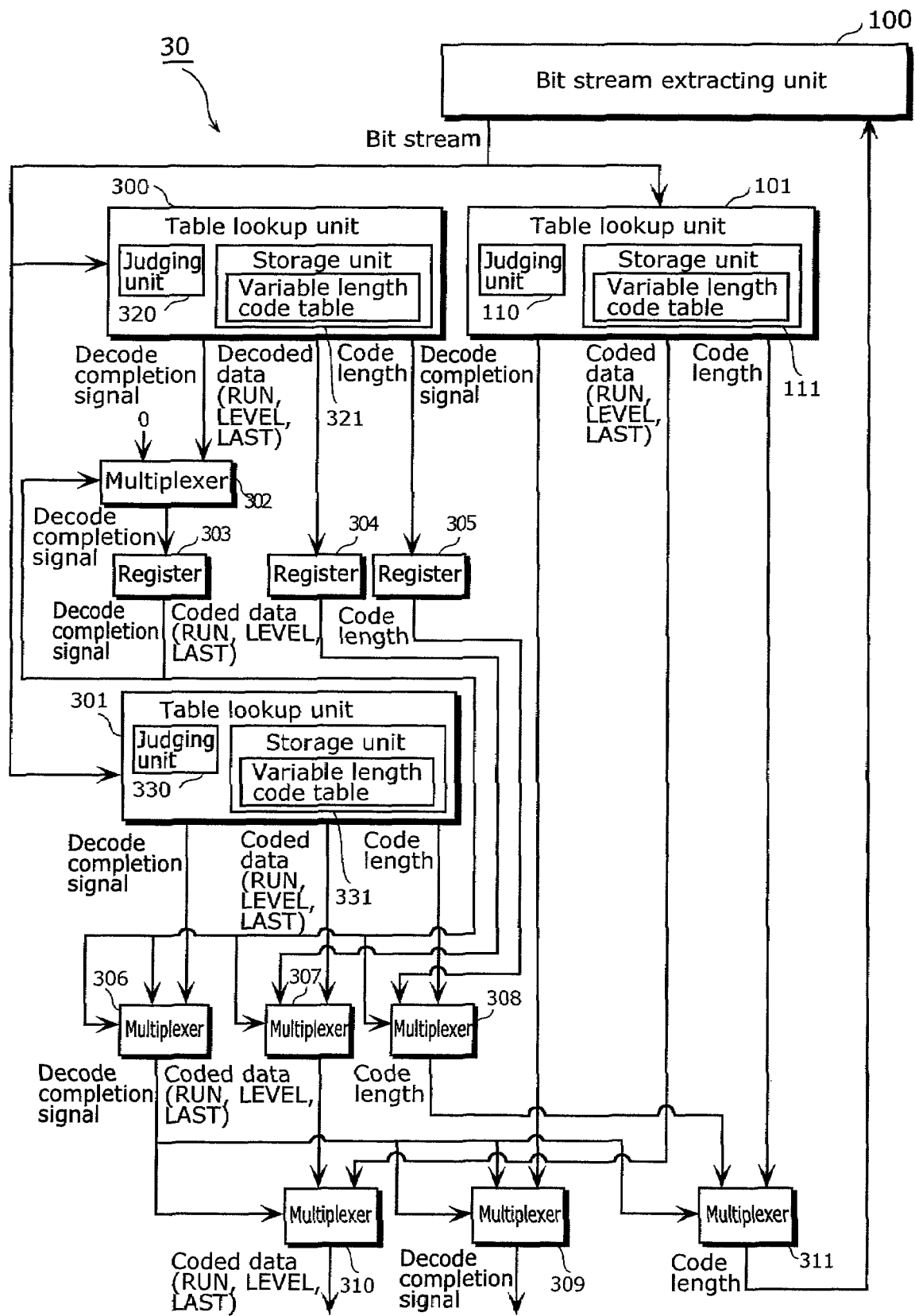
FIG. 9 is a block diagram showing a configuration of a variable length code decoding apparatus according to a third embodiment of the present invention.

FIG. 9 is a block diagram showing a configuration of a variable length code decoding apparatus 30 according to the third embodiment of the present invention. Note that like elements to those shown in FIG. 2 are assigned like reference numerals and descriptions thereof will be omitted.

The variable length code decoding apparatus 30 shown in FIG. 9 decodes a bit stream including a code word that is variable-length-coded data and outputs decoded data. The variable length code decoding apparatus 30 includes a bit stream extracting unit 100, table lookup units 101, 300, and 301, multiplexers 302, 306, 307, 308, 309, 310, and 311, and registers 303, 304, and 305. The variable length code decoding apparatus 30 differs from the variable length code decoding apparatus 10 according to the first embodiment in the configurations or connection relationships of the table lookup unit 300, the multiplexers 302, 309, 310, and 311 and the register 303, and in that the table lookup unit 301 and the multiplexers 306, 307, and 308 are provided.

The table lookup unit 300 includes a judging unit 320 and a storage unit 321.

The storage unit 321 stores a variable length code table that is a table of a plurality of code words including two or more coefficients as well as decoded data and code lengths respectively corresponding to the code words.

The judging unit 320 collates a bit string extracted by the bit stream extracting unit 100 with a variable length code table stored in the storage unit 321, and judges whether a code word stored in the storage unit 321 is included in the bit string extracted by the bit stream extracting unit 100. The judging unit 320 outputs a decode completion signal indicating a judgment result. More specifically, the judging unit 320 outputs a decode completion signal "1" in the case where a code word stored in the storage unit 321 is included in the bit string extracted by the bit stream extracting unit 100. The judging unit 320 outputs a decode completion signal "0" in the case where code words stored in the storage unit 321 are not included in the bit string extracted by the bit stream extracting unit 100. In addition, when a code word stored in the storage unit 321 is included in the bit string extracted by the bit stream extracting unit 100, the judging unit 320 outputs decoded data ("run", "level", "last") and a code length corresponding to the code word. Furthermore, the judging unit 320 outputs arbitrary decoded data and a code length "0" in the case where code words stored in the storage unit 321 are not included in the bit string extracted by the bit stream extracting unit 100.

The table lookup unit 301 includes a judging unit 330 and a storage unit 331.

The storage unit 331 stores a variable length code table that is a table of a plurality of code words not stored in the storage unit 321 and which includes two or more coefficients as well as decoded data and code lengths respectively corresponding to the code words.

The judging unit 330 collates a bit string extracted by the bit stream extracting unit 100 with a variable length code table stored in the storage unit 331, and judges whether a code word stored in the storage unit 331 is included in the bit string extracted by the bit stream extracting unit 100. The judging unit 330 outputs a decode completion signal indicating a judgment result. More specifically, the judging unit 330 outputs a decode completion signal "1" in the case where a code word stored in the storage unit 331 is included in the bit string extracted by the bit stream extracting unit 100. The judging unit 330 outputs a decode completion signal "0" in the case where code words stored in the storage unit 331 are not included in the bit string extracted by the bit stream extracting unit 100. In addition, when a code word stored in the storage unit 331 is included in the bit string extracted by the bit stream extracting unit 100, the judging unit 330 outputs decoded data ("run", "level", "last") and a code length corresponding to the code word. Furthermore, the judging unit 330 outputs arbitrary decoded data and a code length "0" in the case where code words stored in the storage unit 331 are not included in the bit string extracted by the bit stream extracting unit 100.

The multiplexer 302 uses the decode completion signal retained in the register 303 as a selection signal and selects a signal to be outputted to the register 303. When the selection signal is "0", the multiplexer 302 selects a decode completion signal outputted by the table lookup unit 300, and when the selection signal is "1", the multiplexer 302 selects a fixed value "0".

The register 303 retains a decode completion signal selected by the multiplexer 302. The register 304 retains decoded data outputted by the table lookup unit 300. The register 305 retains a code length outputted by the table lookup unit 300.

In accordance with the decode completion signal retained in the register 303, the multiplexer 306 selects either a decode completion signal outputted by the table lookup unit 301 or the decode completion signal retained in the register 303. When the decode completion signal retained in the register 303 is "0", the multiplexer 306 selects the decode completion signal outputted by the table lookup unit 301. When the decode completion signal retained in the register 303 is "1", the multiplexer 306 selects the decode completion signal retained in the register 303.

In accordance with the decode completion signal retained in the register 303, the multiplexer 307 selects either decoded data outputted by the table lookup unit 301 or decoded data retained in the register 304. When the decode completion signal retained in the register 303 is "0", the multiplexer 307 selects decoded data outputted by the table lookup unit 301. When the decode completion signal retained in the register 303 is "1", the multiplexer 307 selects decoded data retained in the register 304.

In accordance with the decode completion signal retained in the register 303, the multiplexer 308 selects either a code length outputted by the table lookup unit 301 or a code length retained in the register 305. When the decode completion signal retained in the register 303 is "0", the multiplexer 308 selects the code length outputted by the table lookup unit 301. When the decode completion signal retained in the register 303 is "1", the multiplexer 308 selects the code length retained in the register 305.

In accordance with a decode completion signal selected by the multiplexer 306, the multiplexer 309 selects either a decode completion signal outputted by the table lookup unit 101 or a decode completion signal selected by the multiplexer 306. When the decode completion signal selected by the multiplexer 306 is "0", the multiplexer 309 selects a decode completion signal outputted by the table lookup unit 101. When the decode completion signal selected by the multiplexer 306 is "1", the multiplexer 309 selects the decode completion signal selected by the multiplexer 306.

In accordance with a decode completion signal selected by the multiplexer 306, the multiplexer 310 selects either decoded data outputted by the table lookup unit 101 or decoded data selected by the multiplexer 307. When the decode completion signal selected by the multiplexer 306 is "0", the multiplexer 310 selects decoded data outputted by the table lookup unit 101. When the decode completion signal selected by the multiplexer 306 is "1", the multiplexer 310 selects decoded data selected by the multiplexer 307.

In accordance with a decode completion signal selected by the multiplexer 306, the multiplexer 311 selects either a code length outputted by the table lookup unit 101 or a code length selected by the multiplexer 308. When the decode completion signal selected by the multiplexer 306 is "0", the multiplexer 311 selects the code length outputted by the table lookup unit 101. When the decode completion signal selected by the multiplexer 306 is "1", the multiplexer 311 selects the code length selected by the multiplexer 308.

When the judging unit 320 judges that a code word stored in the storage unit 321 is included in a bit string extracted by the bit stream extracting unit 100, in a cycle following the cycle in which a judgment was made by the judging unit 320, the bit stream extracting unit 100 judges the beginning of an undecoded bit stream based on a code length outputted by the judging unit 320 and extracts a bit string to be next decoded. In addition, when the judging unit 330 judges that a code word stored in the storage unit 331 is included in the bit string extracted by the bit stream extracting unit 100, in the same cycle as a cycle in which the judgment was made by the judging unit 330, the bit stream extracting unit 100 judges the beginning of an undecoded bit stream based on a code length outputted by the judging unit 330 and extracts a bit string to be next decoded.

Next, operations of the variable length code decoding apparatus 30 according to the third embodiment of the present invention will be described.

FIG. 10 is a diagram showing specific operations performed by the variable length code decoding apparatus 30. An operation for decoding a bit stream "a1b1-b16c1-c32" by the variable length code decoding apparatus 30 will now be described. Note that code words a1, b1-b16 and c1-c32 are code words shown in FIG. 6. In addition, descriptions of like operations to those shown in FIG. 5 will be omitted.

It should be noted that the code word b1-b16 whose "run" value is equal to or greater than 1 is stored in the table lookup unit 300 and the code word c1-c32 is stored in the table lookup unit 301. In addition, the register 303 retains "0" as an initial is value, the register 304 retains "(0, 0, 0)" as an initial value, and the register 305 retains "0" as an initial value.

<0th Cycle>

In the 0th cycle, since the bit string "a1b1-b16c1-c15" extracted by the bit stream extracting unit 100 and code words stored in the table lookup unit 300 are inconsistent, the table lookup unit 300 outputs a decode completion signal "0", outputs decoded data ("run", "level", "last") "(x, x, x)", and outputs a code length "0".

Since the bit string "a1b1-b16c1-c15" extracted by the bit stream extracting unit 100 and code words stored in the table lookup unit 301 are inconsistent, the table lookup unit 301 outputs a decode completion signal "0", outputs decoded data ("run", "level", "last") "(x, x, x)", and outputs a code length "0".

Since the decode completion signal retained in the register 303 is "0", the multiplexer 302 selects the decode completion signal "0" outputted by the table lookup unit 300.

The register 303 retains an initial value decode completion signal "0", the register 304 retains initial value decoded data "(0, 0, 0)", and the register 305 retains an initial value code length "0".

Since the decode completion signal retained in the register 303 is "0", the multiplexer 306 selects the decode completion signal "0" outputted by the table lookup unit 301. Since the decode completion signal retained in the register 303 is "0", the multiplexer 307 selects the decoded data "(x, x, x)" outputted by the table lookup unit 301. Since the decode completion signal retained in the register 303 is "0", the multiplexer 308 selects the code length "0" outputted by the table lookup unit 301.

Since the decode completion signal selected by the multiplexer 306 is "0", the multiplexer 309 selects the decode completion signal "0" outputted by the table lookup unit 101. Since the decode completion signal selected by the multiplexer 306 is "0", the multiplexer 310 selects the decoded data "(0, 1, 0)" outputted by the table lookup unit 101. Since the decode completion signal selected by the multiplexer 306 is "0", the multiplexer 311 selects the code length "1" outputted by the table lookup unit 101.

The register 303 loads the decode completion signal "0" selected by the multiplexer 302, and outputs the decode completion signal "0" in the next cycle. The register 304 loads the decoded data "(x, x, x)" outputted by the table lookup unit 300, and outputs the decoded data "(x, x, x)" in the next cycle. The register 305 loads the code length "0" outputted by the table lookup unit 300, and outputs the code length "0" in the next cycle.

<1st Cycle>

In the 1st cycle, since the bit string "b1-b16c1-c16" extracted by the bit stream extracting unit 100 and the code word "b1-b16" stored in the table lookup unit 300 are consistent, the table lookup unit 300 outputs a decode completion signal "1", outputs decoded data ("run", "level", "last") "(1, 2, 0)", and outputs a code length "16".

Since the bit string "b1-b16c1-c16" extracted by the bit stream extracting unit 100 and the code words stored in the table lookup unit 301 are inconsistent, the table lookup unit 301 outputs a decode completion signal "0", outputs decoded data ("run", "level", "last") "(x, x, x)", and outputs a code length "0".

Since the decode completion signal retained in the register 303 is "0", the multiplexer 302 selects the decode completion signal "1" outputted by the table lookup unit 300.

The register 303 retains the decode completion signal "0" loaded in the 0th cycle. The register 304 retains the decoded data "(x, x, x)" loaded in the 0th cycle. The register 305 retains the code length "0" loaded in the 0th cycle.

Since the decode completion signal retained in the register 303 is "0", the multiplexer 306 selects the decode completion signal "0" outputted by the table lookup unit 301. Since the decode completion signal retained in the register 303 is "0", the multiplexer 307 selects the decoded data "(x, x, x)" outputted by the table lookup unit 301. Since the decode completion signal retained in the register 303 is "0", the multiplexer 308 selects the code length "0" outputted by the table lookup unit 301.

Since the decode completion signal selected by the multiplexer 306 is "0", the multiplexer 309 selects the decode completion signal "0" outputted by the table lookup unit 101. Since the decode completion signal selected by the multiplexer 306 is "0", the multiplexer 310 selects the decoded data "(x, x, x)" outputted by the table lookup unit 101. Since the decode completion signal selected by the multiplexer 306 is "0", the multiplexer 311 selects the code length "0" outputted by the table lookup unit 101.

The register 303 loads the decode completion signal "1" selected by the multiplexer 302, and outputs the decode completion signal "1" in the next cycle. The register 304 loads the decoded data "(1, 2, 0)" outputted by the table lookup unit 300, and outputs the decoded data "(1, 2, 0)" in the next cycle. The register 305 loads the code length "16" outputted by the table lookup unit 300, and outputs the code length "16" in the next cycle.

<2nd Cycle>

In the 2nd cycle, since the bit string "b1-b16c1-c16" extracted by the bit stream extracting unit 100 and the code word "b1-b16" stored in the table lookup unit 300 are consistent, the table lookup unit 300 outputs a decode completion signal "1", outputs decoded data ("run", "level", "last") "(1, 2, 0)", and outputs a code length "16".

Since the bit string "b1-b16c1-c16" extracted by the bit stream extracting unit 100 and code words stored in the table lookup unit 301 are inconsistent, the table lookup unit 301 outputs a decode completion signal "0", outputs decoded data ("run", "level", "last") "(x, x, x)", and outputs a code length "0".

Since the decode completion signal retained in the register 303 is "1", the multiplexer 302 selects a fixed value "0".

The register 303 retains the decode completion signal "1" loaded in the 1st cycle. The register 304 retains the decoded data "(1, 2, 0)" loaded in the 1st cycle. The register 305 retains the code length "16" loaded in the 1st cycle.

Since the decode completion signal retained in the register 303 is "1", the multiplexer 306 selects the decode completion signal "1" retained in the register 303. Since the decode completion signal retained in the register 303 is "1", the multiplexer 307 selects the decoded data "(1, 2, 0)" retained in the register 304. Since the decode completion signal retained in the register 303 is "1", the multiplexer 308 selects the code length "16" retained in the register 305.

Since the decode completion signal selected by the multiplexer 306 is "1", the multiplexer 309 selects the decode completion signal "1" selected by the multiplexer 306. Since the decode completion signal selected by the multiplexer 306 is "1", the multiplexer 310 selects the decoded data "(1, 2, 0)" selected by the multiplexer 307. Since the decode completion signal selected by the multiplexer 306 is "1", the multiplexer 311 selects the code length "16" selected by the multiplexer 308.

The register 303 loads the decode completion signal "0" selected by the multiplexer 302, and outputs the decode completion signal "0" in the next cycle. The register 304 loads the decoded data "(1, 2, 0)" outputted by the table lookup unit 300, and outputs the decoded data "(1, 2, 0)" in the next cycle. The register 305 loads the code length "16" outputted by the table lookup unit 300, and outputs the code length "16" in the next cycle.

<3rd Cycle>

In the third cycle, since the bit string "c1-c32" extracted by the bit stream extracting unit 100 and code words stored in the table lookup unit 300 are inconsistent, the table lookup unit 300 outputs a decode completion signal "0", outputs decoded data ("run", "level", "last") "(x, x, x)", and outputs a code length "0".

Since the bit string "c1-c32" extracted by the bit stream extracting unit 100 and the code word "c1-c32" stored in the table lookup unit 301 are consistent, the table lookup unit 301 outputs a decode completion signal "1", outputs decoded data ("run", "level", "last") "(2, 3, 1)", and outputs a code length "32".

Since the decode completion signal retained in the register 303 is "0", the multiplexer 302 selects the decode completion signal "0" outputted by the table lookup unit 300.

The register 303 retains the decode completion signal "0" loaded in the 2nd cycle. The register 304 retains the decoded data "(1, 2, 0)" loaded in the 2nd cycle. The register 305 retains the code length "16" loaded in the 2nd cycle.

Since the decode completion signal retained in the register 303 is "0", the multiplexer 306 selects the decode completion signal "1" outputted by the table lookup unit 301. Since the decode completion signal retained in the register 303 is "0", the multiplexer 307 selects the decoded data "(2, 3, 1)" outputted by the table lookup unit 301. Since the decode completion signal retained in the register 303 is "0", the multiplexer 308 selects the code length "32" outputted by the table lookup unit 301.

Since the decode completion signal selected by the multiplexer 306 is "1", the multiplexer 309 selects the decode completion signal "1" selected by the multiplexer 306. Since the decode completion signal selected by the multiplexer 306 is "1", the multiplexer 310 selects the decoded data "(2, 3, 1)" selected by the multiplexer 307. Since the decode completion signal selected by the multiplexer 306 is "1", the multiplexer 311 selects the code length "32" selected by the multiplexer 308.

As shown, the variable length code decoding apparatus 30 according to the third embodiment of the present invention includes the table lookup units 300 and 301 that decode code words including a plurality of coefficients. Accordingly, since the number of code words respectively stored in the table lookup units 300 and 301 are reduced, the time required by the table lookup units 300 and 301 for collation can be reduced.

In addition, with respect to code words decoded by the table lookup unit 300, bit string extraction is performed in the next cycle. With respect to code words decoded by the table lookup unit 301, bit string extraction is performed in the same cycle. Since one decoding process and one bit string extraction process are performed in one cycle with respect to a code word decoded by the table lookup unit 301, the number of process cycles per code word can be averagely reduced. This is particularly effective in the case where, in the variable length code decoding apparatus 10 according to the first embodiment described above, the time required by the table lookup unit 102 for collation is longer than the sum of the time required by the table lookup unit 101 for collation and the time required by the bit stream extracting unit 100 for bit string extraction.

In this case, it is preferable that code words stored in the table lookup units 300 and 301 are segmented so that the time required by the table lookup unit 301 for performing a judgment process (collation process) is equal to or shorter than the time required by the table lookup unit 101 for performing a judgment process (collation process). Consequently, it is possible to prevent the maximum value of the time required for collation from increasing when performing decoding in one cycle and, at the same time, the time required for collation when performing decoding in two cycles can be reduced.

Fourth Embodiment

A variable length code decoding apparatus according to the fourth embodiment of the present invention is a modification of the variable length code decoding apparatus 10 according to the first embodiment. A variable length code decoding apparatus according to the fourth embodiment of the present invention includes a table lookup unit that stores a variable length code table of decoded data that requires sequential processing and a table lookup unit that stores a variable length code table of decoded data that does not require sequential processing. Consequently, decoded data requiring sequential processing can be outputted at a higher speed.

First, a configuration of a variable length code decoding apparatus according to the fourth embodiment of the present invention will be described.

Figure 11:
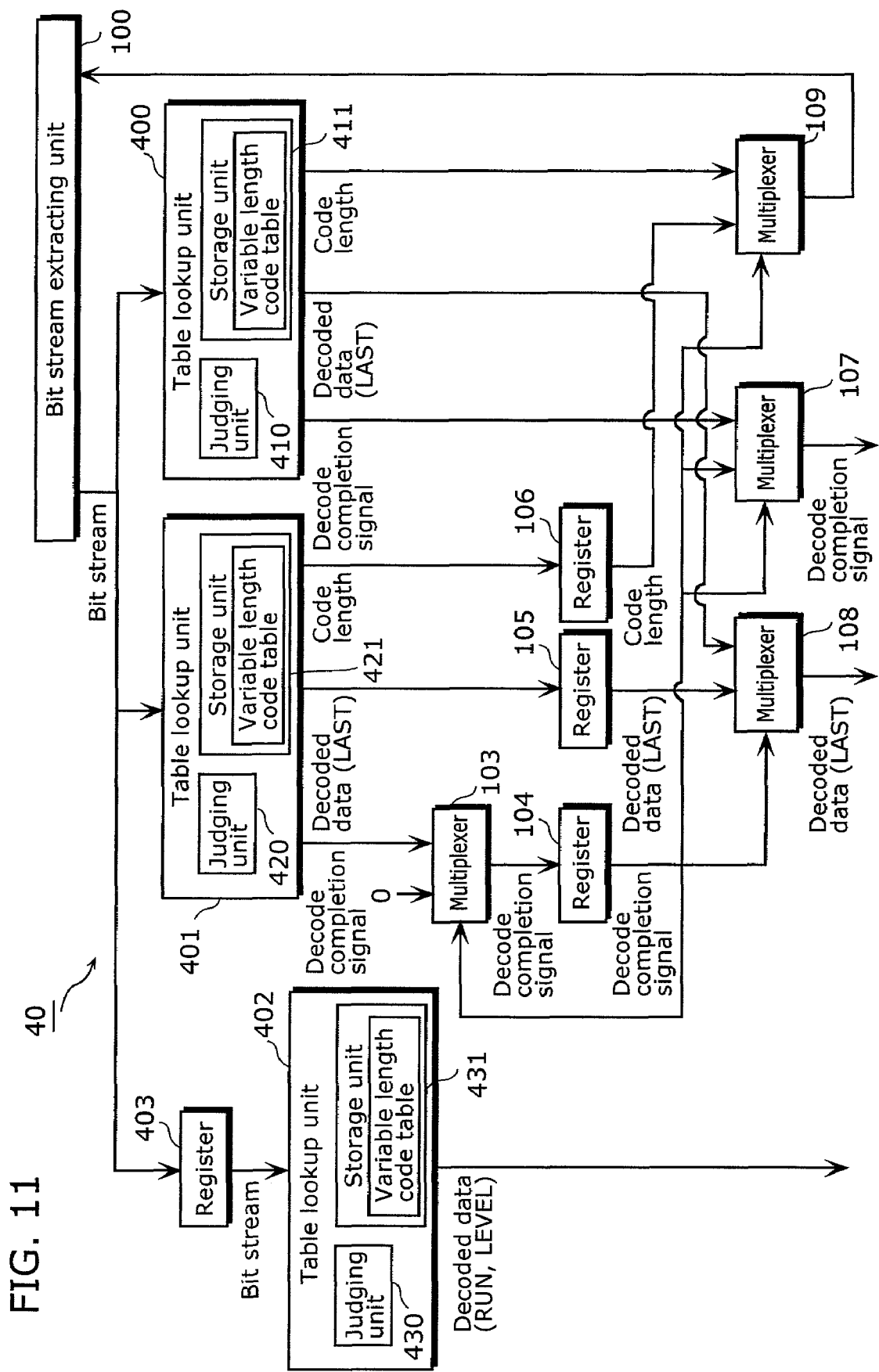
FIG. 11 is a block diagram showing a configuration of a variable length code decoding apparatus according to a fourth embodiment of the present invention.

FIG. 11 is a block diagram showing a configuration of a variable length code decoding apparatus 40 according to the fourth embodiment of the present invention. Note that like elements to those shown in FIG. 2 are assigned like reference numerals and descriptions thereof will be omitted.

The variable length code decoding apparatus 40 shown in FIG. 11 decodes a bit stream including a code word that is variable-length-coded data and outputs decoded data. The variable length code decoding apparatus 40 includes a bit stream extracting unit 100, table lookup units 400, 401, and 402, multiplexers 103, 107, 108, and 109, and registers 104, 105, 106, and 403. The variable length code decoding apparatus 40 differs from the variable length code decoding apparatus 10 according to the first embodiment in the configurations of the table lookup units 400 and 401 and that the table lookup unit 402 and the register 403 are provided.

The table lookup unit 400 includes a judging unit 410 and a storage unit 411.

The storage unit 411 stores a variable length code table that is a table of a plurality of code words including only one coefficient, decoded data respectively corresponding to the code words and which require sequential processing, and code lengths respectively corresponding to the code words.

FIG. 12 is a diagram showing an example of a variable length code table stored in the storage unit 411. As shown in FIG. 12, the variable length code table stored in the storage unit 411 includes code words having one coefficient, "last" requiring sequential processing among decoded data of the code words, and code lengths that is a length (number of bits) of codes of the code words.

In this case, "last" requires sequential processing because there may be cases where data of a different type is sent as a subsequent bit stream and that such information must be promptly notified to the outside. For example, there is a case where data other than image data is sent following variable-length-coded image data.

The judging unit 410 collates a bit string extracted by the bit stream extracting unit 100 with a variable length code table stored in the storage unit 411, and judges whether a code word stored in the storage unit 411 is included in the bit string extracted by the bit stream extracting unit 100. The judging unit 410 outputs a decode completion signal indicating a judgment result to the multiplexer 107. More specifically, the judging unit 410 outputs a decode completion signal "1" in the case where a code word stored in the storage unit 411 is included in the bit string extracted by the bit stream extracting unit 100. The judging unit 410 outputs a decode completion signal "0" in the case where code words stored in the storage unit 411 are not included in the bit string extracted by the bit stream extracting unit 100. In addition, when a code word stored in the storage unit 411 is included in the bit string extracted by the bit stream extracting unit 100, the judging unit 410 outputs decoded data ("last") corresponding to the code word to the multiplexer 108 and outputs a code length corresponding to the code word to the multiplexer 109. Furthermore, when code words stored in the storage unit 411 are not included in the bit string extracted by the bit stream extracting unit 100, the judging unit 410 outputs arbitrary decoded data ("last") to the multiplexer 108 and outputs a code length "0" to the multiplexer 109.

The table lookup unit 401 includes a judging unit 420 and a storage unit 421.

The storage unit 421 stores a variable length code table that is a table of a plurality of code words including two or more coefficients, decoded data respectively corresponding to the code words, and code lengths respectively corresponding to the code words.

FIG. 13 is a diagram showing an example of a variable length code table stored in the storage unit 421. As shown in FIG. 13, the variable length code table stored in the storage unit 421 includes code words having two or more coefficients, "last" requiring sequential processing among decoded data of the code words, and code lengths that is a length (number of bits) of codes of the code words.

The judging unit 420 collates a bit string extracted by the bit stream extracting unit 100 with a variable length code table stored in the storage unit 421, and judges whether a code word stored in the storage unit 421 is included in the bit string extracted by the bit stream extracting unit 100. The judging unit 420 outputs a decode completion signal indicating a judgment result to the multiplexer 103. More specifically, the judging unit 420 outputs a decode completion signal "1" in the case where a code word stored in the storage unit 421 is included in the bit string extracted by the bit stream extracting unit 100. The judging unit 420 outputs a decode completion signal "0" in the case where code words stored in the storage unit 421 are not included in the bit string extracted by the bit stream extracting unit 100. In addition, when a code word stored in the storage unit 421 is included in the bit string extracted by the bit stream extracting unit 100, the judging unit 420 outputs decoded data ("last") corresponding to the code word to the register 105 and outputs a code length corresponding to the code word to the register 106. Furthermore, when code words stored in the storage unit 421 are not included in the bit string extracted by the bit stream extracting unit 100, the judging unit 420 outputs arbitrary decoded data ("last") to the register 105 and outputs a code length "0" to the register 106.

The table lookup unit 402 includes a judging unit 430 and a storage unit 431.

The storage unit 431 stores a variable length code table that is a table of a plurality of code words stored in the storage units 411 and 421, and decoded data respectively corresponding to the code words and which does not require sequential processing.

FIG. 14 is a diagram showing an example of a variable length code table stored in the storage unit 431. As shown in FIG. 14, the variable length code table stored in the storage unit 431 includes code words, and "run" and "level" which do not require sequential processing among the decoded data of the code words. In addition, the storage unit 431 stores code words stored in the storage unit 411 and code words stored in the storage unit 421.

The judging unit 430 collates a bit string retained in the register 403 with a variable length code table stored in the storage unit 431, and judges whether a code word stored in the storage unit 431 is included in the bit string retained in the register 403. When a code word stored in the storage unit 431 is included in the bit string retained in the register 403, the judging unit 430 outputs decoded data ("run", "level") corresponding to the code word. When code words stored in the storage unit 431 are not included in the bit string retained in the register 403, the judging unit 430 outputs arbitrary decoded data ("run", "level").

In this case, decoded data outputted by the judging unit 430 is valid in a cycle subsequent to a cycle in which the decode completion signal selected by the multiplexer 107 assumes a value of "1".

The register 403 retains the bit string extracted by the bit stream extracting unit 100.

Next, operations of the variable length code decoding apparatus 40 according to the fourth embodiment of the present invention will be described.

FIG. 15 is a diagram showing specific operations performed by the variable length code decoding apparatus 40. An operation for decoding a bit stream "a1b1-b16c1-c32" by the variable length code decoding apparatus 40 will now be described. Note that descriptions of like operations to those shown in FIG. 5 will be omitted.

Also note that the register 403 retains "0" as an initial value.

<0th Cycle>

In the 0th cycle, since the bit string "a1b1-b16c1-c15" extracted by the bit stream extracting unit 100 and the code word "a1" stored in the table lookup unit 400 are consistent, the table lookup unit 400 outputs a decode completion signal "1", outputs decoded data ("last") "0", and outputs a code length "1".

Since the bit string "a1b1-b16c1-c15" extracted by the bit stream extracting unit 100 and code words stored in the table lookup unit 401 are inconsistent, the table lookup unit 401 outputs a decode completion signal "0", outputs decoded data ("last") "x", and outputs a code length "0".

The register 403 outputs the initial value "0".

Since the bit string "0" retained by the register 403 and code words stored in the table lookup unit 402 are inconsistent, the table lookup unit 402 outputs decoded data ("run", "level") "(x, x)".

The register 403 loads the bit string "a1b1-b16c1-c15" extracted by the bit stream extracting unit 100, and outputs the bit string "a1b1-b16c1-c15" in the next cycle.

<1st Cycle>

In the 1st cycle, since the bit string "b1-b16c1-c16" extracted by the bit stream extracting unit 100 and code words stored in the table lookup unit 400 are inconsistent, the table lookup unit 400 outputs a decode completion signal "0", outputs decoded data ("last") "x", and outputs a code length "0".

Since the bit string "b1-b16c1-c16" extracted by the bit stream extracting unit 100 and the code word "b1-b16" stored in the table lookup unit 401 are consistent, the table lookup unit 401 outputs a decode completion signal "1", outputs decoded data ("last") "0", and outputs a code length "16".

The register 403 outputs "a1b1-b16c1-c15" loaded in the 0th cycle.

Since the bit string "a1b1-b16c1-c15" retained by the register 403 and the code word "a1" stored in the table lookup unit 402 are consistent, the table lookup unit 402 outputs decoded data ("run", "level") "(0, 1)".

The register 403 loads the bit string "b1-b16c1-c16" extracted by the bit stream extracting unit 100, and outputs the bit string "b1-b16c1-c16" in the next cycle.

<2nd Cycle>

In the 2nd cycle, since the bit string "b1-b16c1-c16" extracted by the bit stream extracting unit 100 and code words stored in the table lookup unit 400 are inconsistent, the table lookup unit 400 outputs a decode completion signal "0", outputs decoded data ("last") "x", and outputs a code length "0".

Since the bit string "b1-b16c1-c16" extracted by the bit stream extracting unit 100 and the code word "b1-b16" stored in the table lookup unit 401 are consistent, the table lookup unit 401 outputs a decode completion signal "1", outputs decoded data ("last") "0", and outputs a code length "16".

The register 403 outputs "b1-b16c1-c16" loaded in the 1st cycle.

Since the bit string "b1-b16c1-c16" retained by the register 403 and the code word "b1-b16" stored in the table lookup unit 402 are consistent, the table lookup unit 402 outputs decoded data ("run", "level") "(1, 2)".

The register 403 loads the bit string "b1-b16c1-c16" extracted by the bit stream extracting unit 100, and outputs the bit string "b1-b16c1-c16" in the next cycle.

<3rd Cycle>

In the 3rd cycle, since the bit string "c1-c32" extracted by the bit stream extracting unit 100 and code words stored in the table lookup unit 400 are inconsistent, the table lookup unit 400 outputs a decode completion signal "0", outputs decoded data ("last") "x", and outputs a code length "0".

Since the bit string "c1-c32" extracted by the bit stream extracting unit 100 and the code word "c1-c32" stored in the table lookup unit 401 are consistent, the table lookup unit 401 outputs a decode completion signal "1", outputs decoded data ("last") "1", and outputs a code length "32".

The register 403 retains "b1-b16c1-c16" loaded in the 2nd cycle.

Since the bit string "b1-b16c1-c16" retained by the register 403 and the code word "b1-b16" stored in the table lookup unit 402 are consistent, the table lookup unit 402 outputs decoded data ("run", "level") "(1, 2)".

The register 403 loads the bit string "c1-c32" extracted by the bit stream extracting unit 100, and outputs the bit string "c1-c32" in the next cycle.

<4th Cycle>

In the 4th cycle, since the bit string "c1-c32" extracted by the bit stream extracting unit 100 and code words stored in the table lookup unit 400 are inconsistent, the table lookup unit 400 outputs a decode completion signal "0", outputs decoded data ("last") "x", and outputs a code length "0".

Since the bit string "c1-c32" extracted by the bit stream extracting unit 100 and the code word "c1-c32" stored in the table lookup unit 401 are consistent, the table lookup unit 401 outputs a decode completion signal "1", outputs decoded data ("last") "1", and outputs a code length "32".

The register 403 retains "c1-c32" loaded in the 3rd cycle.

Since the bit string "c1-c32" retained by the register 403 and the code word "c1-c32" stored in the table lookup unit 402 are consistent, the table lookup unit 402 outputs decoded data ("run", "level") "(2, 3)".

The register 403 loads the bit string "c1-c32" extracted by the bit stream extracting unit 100, and outputs the bit string "c1-c32" in the next cycle.

<5th Cycle>

In the 5th cycle, since the bit string "d1-d32" extracted by the bit stream extracting unit 100 and code words stored in the table lookup unit 400 are inconsistent, the table lookup unit 400 outputs a decode completion signal "0", outputs decoded data ("last") "x", and outputs a code length "0".

Since the bit string "d1-d32" extracted by the bit stream extracting unit 100 and code words stored in the table lookup unit 401 are inconsistent, the table lookup unit 401 outputs a decode completion signal "0", outputs decoded data ("last") "x", and outputs a code length "0".

The register 403 retains "c1-c32" loaded in the 4th cycle.

Since the bit string "c1-c32" retained by the register 403 and the code word "c1-c32" stored in the table lookup unit 402 are consistent, the table lookup unit 402 outputs decoded data ("run", "level") "(2, 3)".

As described above, decoded data ("run", "level") which does not require sequential processing is outputted by the table lookup units 402 in a cycle next to the cycle in which collation processing was performed by the table lookup units 400 and 401.

With the variable length code decoding apparatus 40 according to the fourth embodiment of the present invention, decoded data requiring sequential processing, and code lengths are stored in the table lookup units 400 and 401, and decoded data not requiring sequential processing is stored in the table lookup unit 402. Accordingly, the capacities of the table lookup units 400 and 401 can be reduced in comparison to a case where all decoded data is stored in the table lookup units 400 and 401. Thus, the times required by the table lookup units 400 and 401 to perform collation processes can be reduced. Therefore, the variable length code decoding apparatus 40 according to the fourth embodiment of the present invention is capable of decoding a variable-length-coded code word at high speed.

It should be noted that while a configuration is described above in which decoded data not requiring sequential processing is outputted in the next cycle, decoded data not requiring sequential processing may instead be outputted after two or more cycles.

Fifth Embodiment

A variable length code decoding apparatus according to a fifth embodiment of the present invention is a modification of the variable length code decoding apparatus 10 according to the first embodiment, and further includes an error detecting unit that detects an error in the case where a code word consistent with the table lookup units 101 and 102 is not stored. Consequently, an occurrence of an error can be notified to the outside.

First, a configuration of a variable length code decoding apparatus according to the fifth embodiment of the present invention will be described.

Figure 16:
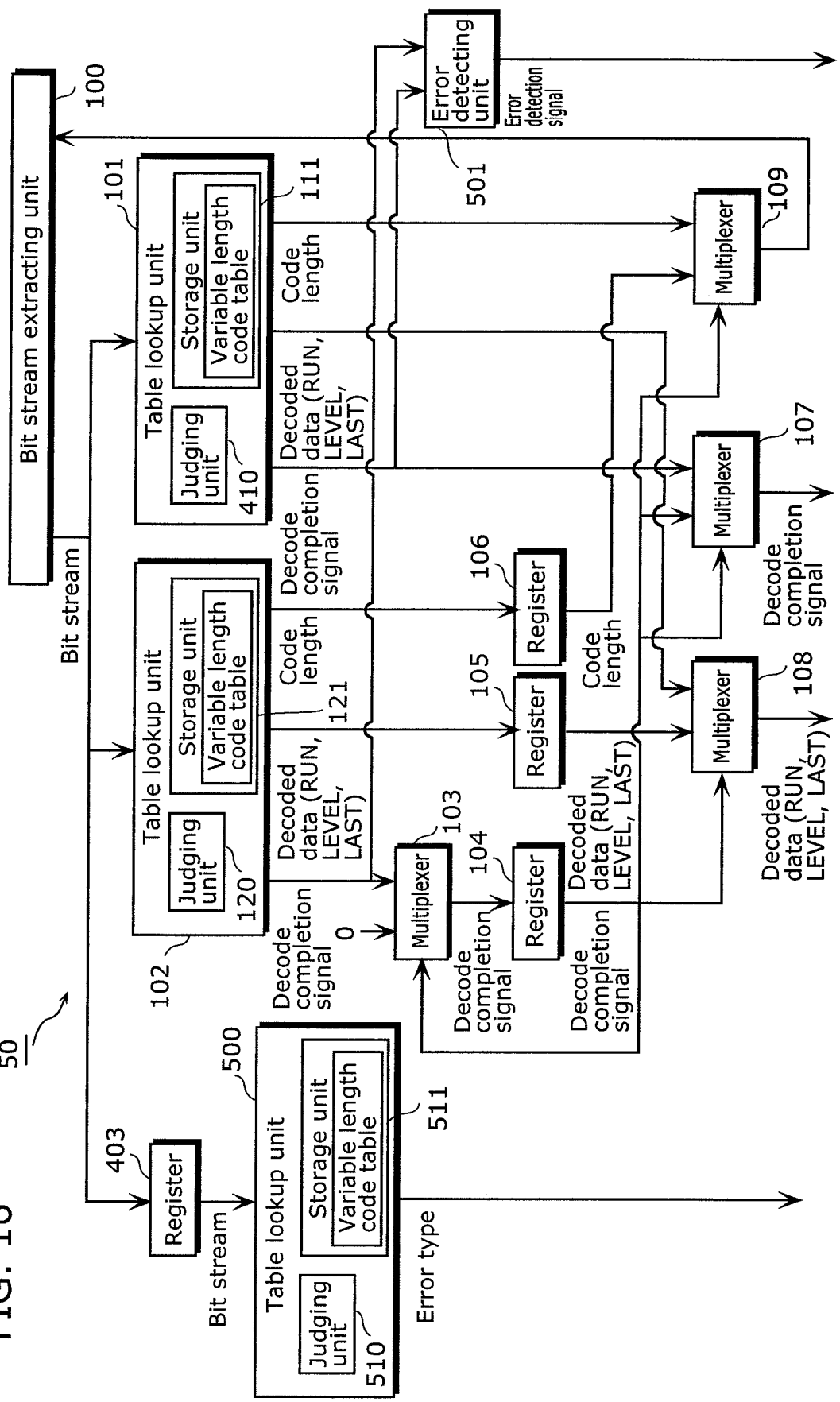
FIG. 16 is a block diagram showing a configuration of a variable length code decoding apparatus according to a fifth embodiment of the present invention.

FIG. 16 is a block diagram showing a configuration of a variable length code decoding apparatus 50 according to the fifth embodiment of the present invention. Note that like elements to those shown in FIG. 2 are assigned like reference numerals and descriptions thereof will be omitted.

The variable length code decoding apparatus 50 shown in FIG. 16 decodes a bit stream including a code word that is variable-length-coded data and outputs decoded data. The variable length code decoding apparatus 50 includes a bit stream extracting unit 100, table lookup units 101, 102, and 500, multiplexers 103, 107, 108, and 109, registers 104, 105, 106, and 403, and an error detecting unit 501. In addition to the configuration of the variable length code decoding apparatus 10 according to the first embodiment, the variable length code decoding apparatus 50 includes the register 403, the table lookup unit 500 and the error detecting unit 501.

The register 403 retains a bit string extracted by the bit stream extracting unit 100.

The table lookup unit 500 includes a judging unit 510 and a storage unit 511.

The storage unit 511 stores a variable length code table that is a table of a plurality of code words not stored in the storage units 111 and 121, and error types respectively corresponding to the code words. In other words, the storage unit 511 stores code words not defined under the variable length code decoding method used for code words decoded by the variable length code decoding apparatus 50, and error types respectively corresponding to the code words. In this case, an error type is information used for identifying a code word type. An error type can be arbitrarily defined with respect to a code word.

The judging unit 510 collates a bit string retained in the register 403 with a variable length code table stored in the storage unit 511, and judges whether a code word stored in the storage unit 511 is included in the bit string retained in the register 403. When a code word stored in the storage unit 511 is included in the bit string retained in the register 403, the judging unit 320 outputs an error type corresponding to the code word. In addition, when code words stored in the storage unit 511 are not included in the bit string retained in the register 403, the judging unit 510 outputs an error type "0".

When both a decode completion signal outputted by the table lookup unit 101 and a decode completion signal outputted by the table lookup unit 102 are "0", the error detecting unit 501 outputs an error detection signal "1" indicating that a code word not defined in the variable length code tables has been detected. In other words, the error detecting unit 501 outputs an error detection signal "1" indicating that an error has been detected when the judging unit 110 judges that code words stored in the storage unit 111 are not included in the bit string extracted by the bit stream extracting unit 100 and, at the same time, when the judging unit 120 judges that code words stored in the storage unit 121 are not included in the bit string extracted by the bit stream extracting unit 100. In addition, the error detecting unit 501 outputs an error detection signal "0" when either one of or both a decode completion signal outputted by the table lookup unit 101 and a decode completion signal outputted by the table lookup unit 102 are "1".

Next, operations of the variable length code decoding apparatus 50 according to the fifth embodiment of the present invention will be described.

FIG. 17 is a diagram showing specific operations performed by the variable length code decoding apparatus 50. An operation for decoding a bit stream "a1b1-b16c1-c32d1-d32" by the variable length code decoding apparatus 50 will now be described. Note that the code word d1-d32 is a code word shown in FIG. 6. In addition, descriptions of like operations to those shown in FIG. 5 will be omitted. In addition, operations performed by the register 403 are similar to those shown in FIG. 15 and descriptions thereon will be omitted.

It should be noted that the code word d1-d32 is a code word not defined in the variable length code table and is stored in the storage unit 511. Furthermore, an error type corresponding to the code word d1-d32 has been defined as "E".

<0th Cycle>

In the 0th cycle, since the bit string "0" retained by the register 403 and code words stored in the table lookup unit 500 are inconsistent, the table lookup unit 500 outputs an error type "0".

Since the decode completion signal outputted by the table lookup unit 101 is "1", the error detecting unit 501 outputs an error detection signal "0".

<1st Cycle>

In the 1st cycle, since the bit string "a1b1-b16c1-c15" retained by the register 403 and code words stored in the table lookup unit 500 are inconsistent, the table lookup unit 500 outputs an error type "0".

Since the decode completion signal outputted by the table lookup unit 102 is "1", the error detecting unit 501 outputs an error detection signal "0".

<2nd Cycle>

In the 2nd cycle, since the bit string "b1-b16c1-c16" retained by the register 403 and code words stored in the table lookup unit 500 are inconsistent, the table lookup unit 500 outputs an error type "0".

Since the decode completion signal outputted by the table lookup unit 102 is "1", the error detecting unit 501 outputs an error detection signal "0".

<3rd Cycle>

In the 3rd cycle, since the bit string "b1-b16c1-c16" retained by the register 403 and code words stored in the table lookup unit 500 are inconsistent, the table lookup unit 500 outputs an error type "0".

Since the decode completion signal outputted by the table lookup unit 102 is "1", the error detecting unit 501 outputs an error detection signal "0".

<4th Cycle>

In the 4th cycle, since the bit string "c1c32" retained by the register 403 and code words stored in the table lookup unit 500 are inconsistent, the table lookup unit 500 outputs an error type "0".

Since the decode completion signal outputted by the table lookup unit 102 is "1", the error detecting unit 501 outputs an error detection signal "0".

<5th Cycle>

In the 5th cycle, since the bit string "c1c32" retained by the register 403 and code words stored in the table lookup unit 500 are inconsistent, the table lookup unit 500 outputs an error type "0".

Since both the decode completion signal outputted by the table lookup unit 101 and the decode completion signal outputted by the table lookup unit 102 are "0", the error detecting unit 501 outputs an error detecting signal "1".

<6th Cycle>

In the 6th cycle, since the bit string "d1-d32" retained by the register 403 and the code word "d1-d32" stored in the table lookup unit 500 are consistent, the table lookup unit 500 outputs an error type "E".

Since both the decode completion signal outputted by the table lookup unit 101 and the decode completion signal outputted by the table lookup unit 102 are "0", the error detecting unit 501 outputs an error detecting signal "1".

As shown, with the variable length code decoding apparatus 50 according to the fifth embodiment of the present invention, an error detection signal "1" is outputted when a code word stored in neither the table lookup unit 101 nor the table lookup unit 102 is included in a bit string extracted by the bit stream extracting unit 100. Accordingly, based on the error detection signal, an external apparatus is able to judge whether a code word not defined in a variable length code table stored in the storage unit 111 and the storage unit 121 has been detected. Therefore, when an error is detected, an external apparatus can perform a process such as terminating a bit stream.

In addition, in a case where a code word not defined in the variable length code table is detected, the variable length code decoding apparatus 50 according to the fifth embodiment of the present invention outputs an error type corresponding to the code word. Accordingly, for example, when an external apparatus is aware in advance that a code word not defined in the variable length code table is included in a bit stream, the external apparatus is capable of performing adaptive error concealment such as detecting and skipping the code word or performing redecoding by replacing the code word with a code word defined in the variable length code table.

It should be noted that while the table lookup unit 500 has been arranged so as to output an error type corresponding to a code word in the above description, in the case where a code word retained in the register 403 and a code word stored in the storage unit 511 are consistent, the code word may be outputted without modification. In addition, a code word and an error type may be outputted. Furthermore, when outputting only a code word, the storage unit 511 is not necessarily required to store an error type.

Sixth Embodiment

A variable length code decoding apparatus according to a sixth embodiment of the present invention performs decoding and bit string extraction in accordance with the number of coefficients included in a code word in, at maximum, a number of cycles corresponding to the number of coefficients. In addition, a variable length code decoding apparatus according to the sixth embodiment of the present invention is capable of changing the number of cycles required for decoding. Consequently, a variable length code decoding apparatus according to the sixth embodiment of the present invention is capable of adaptively changing the number of cycles required for decoding a single code word and extracting a bit string according to operation frequencies and manufacturing processes.

First, a configuration of a variable length code decoding apparatus according to the sixth embodiment of the present invention will be described.

Figure 18A:
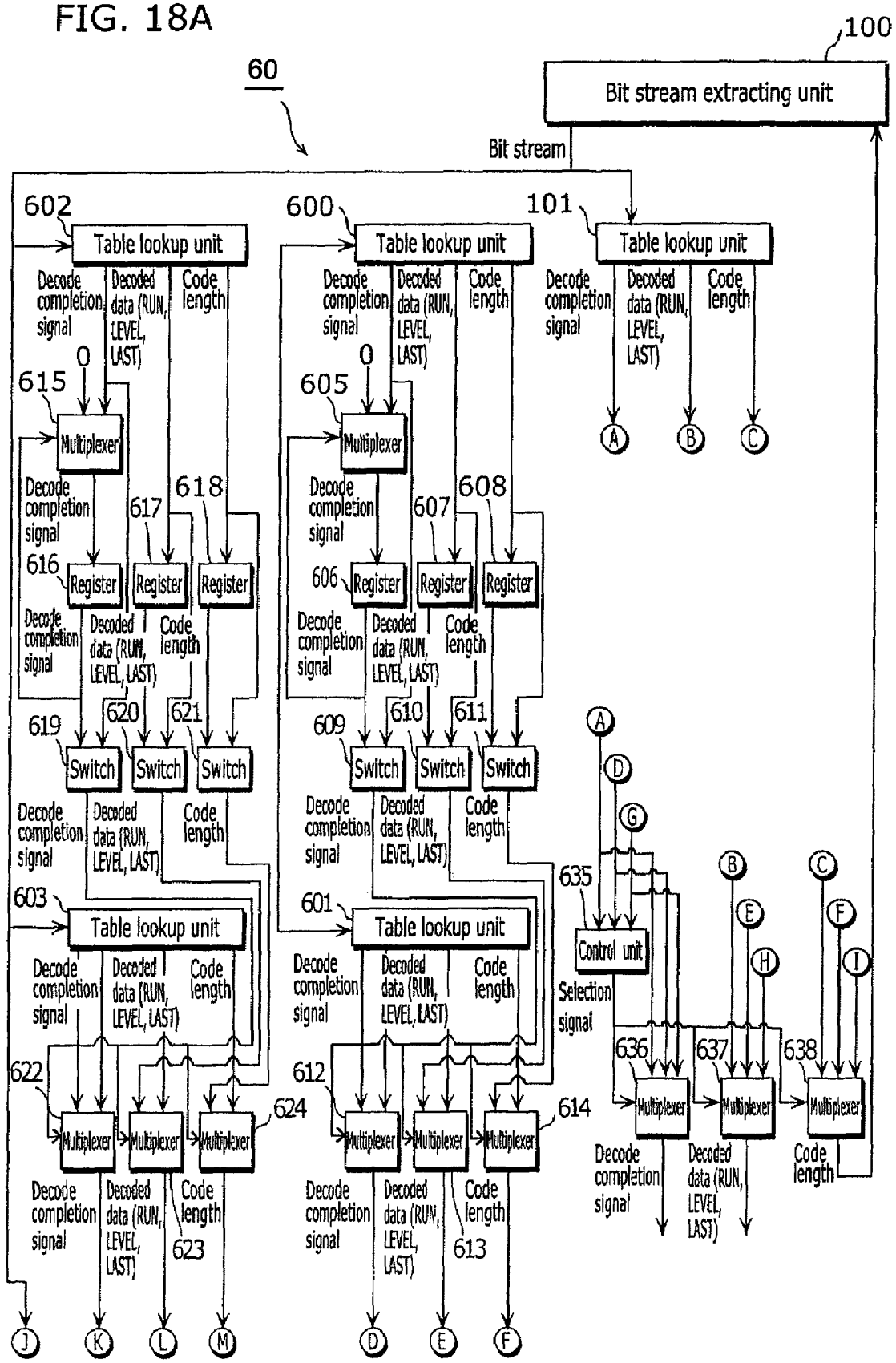
FIGS. 18A and 18B are block diagrams showing a configuration of a variable length code decoding apparatus according to a sixth embodiment of the present invention.
Figure 18B:
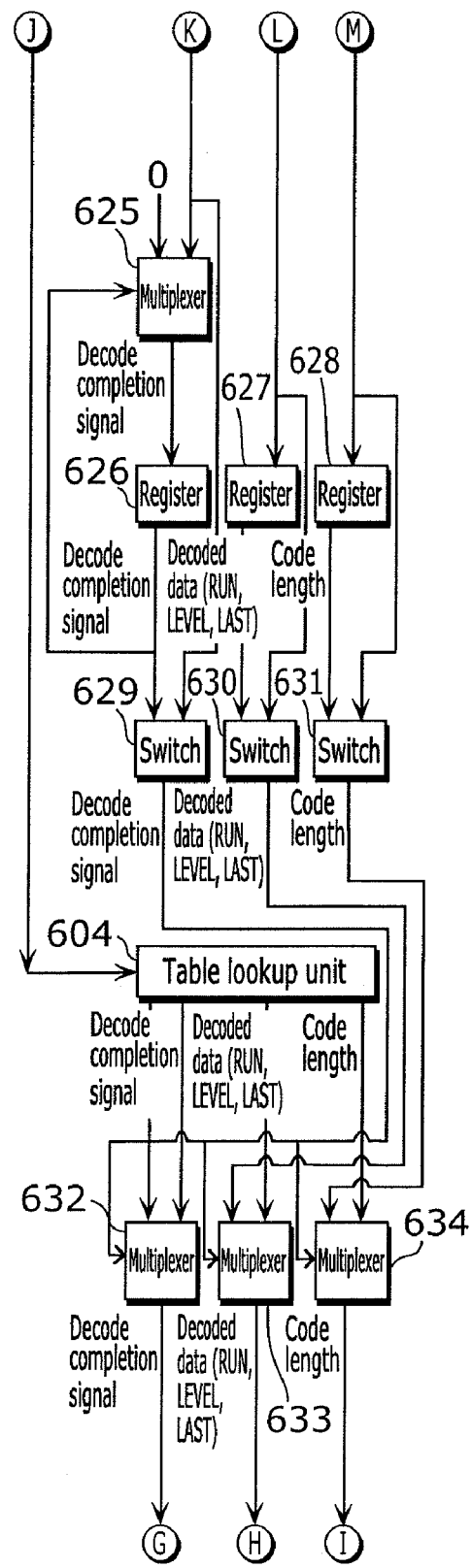

FIGS. 18A and 18B are block diagrams showing a configuration of a variable length code decoding apparatus 60 according to the sixth embodiment of the present invention. Note that like elements to those shown in FIG. 2 are assigned like reference numerals and descriptions thereof will be omitted.

The variable length code decoding apparatus 60 shown in FIGS. 18A and 18B decodes a bit stream including a code word that is variable-length-coded data and outputs decoded data. The variable length code decoding apparatus 60 includes a bit stream extracting unit 100, table lookup units 101, 600, 601, 602, 603, and 604, multiplexers 605, 612, 613, 614, 615, 622, 623, 624, 625, 632, 633, 634, 636, 637, and 638, registers 606, 607, 608, 616, 617, 618, 626, 627, and 628, switches 609, 610, 611, 619, 620, 621, 629, 630, and 631, and a control unit 635.

In addition, it is assumed that the code words to be decoded by the variable length code decoding apparatus 60 are code words including one to three coefficients.

The table lookup unit 600 includes a judging unit 640 and a storage unit 641 (not shown).

The storage unit 641 stores a variable length code table that is a table of a plurality of code words including two coefficients as well as decoded data and code lengths respectively corresponding to the code words.

The judging unit 640 collates a bit string extracted by the bit stream extracting unit 100 with a variable length code table stored in the storage unit 641, and judges whether a code word stored in the storage unit 641 is included in the bit string extracted by the bit stream extracting unit 100. The judging unit 640 outputs a decode completion signal indicating a judgment result. More specifically, the judging unit 640 outputs a decode completion signal "1" in the case where a code word stored in the storage unit 641 is included in the bit string extracted by the bit stream extracting unit 100. The judging unit 640 outputs a decode completion signal "0" in the case where code words stored in the storage unit 641 are not included in the bit string extracted by the bit stream extracting unit 100. In addition, when a code word stored in the storage unit 641 is included in the bit string extracted by the bit stream extracting unit 100, the judging unit 640 outputs decoded data ("run", "level", "last") and a code length corresponding to the code word. Furthermore, the judging unit 640 outputs arbitrary decoded data and a code length "0" in the case where code words stored in the storage unit 641 are not included in the bit string extracted by the bit stream extracting unit 100.

The table lookup unit 601 includes a judging unit 650 and a storage unit 651 (not shown).

The storage unit 651 stores a variable length code table that is a table of a plurality of code words not stored in the storage unit 641 and which includes two coefficients as well as decoded data and code lengths respectively corresponding to the code words.

The judging unit 650 collates a bit string extracted by the bit stream extracting unit 100 with a variable length code table stored in the storage unit 651, and judges whether a code word stored in the storage unit 651 is included in the bit string extracted by the bit stream extracting unit 100. The judging unit 650 outputs a decode completion signal indicating a judgment result. More specifically, the judging unit 650 outputs a decode completion signal "1" in the case where a code word stored in the storage unit 651 is included in the bit string extracted by the bit stream extracting unit 100. The judging unit 650 outputs a decode completion signal "0" in the case where code words stored in the storage unit 651 are not included in the bit string extracted by the bit stream extracting unit 100. In addition, when a code word stored in the storage unit 651 is included in the bit string extracted by the bit stream extracting unit 100, the judging unit 650 outputs decoded data ("run", "level", "last") and a code length corresponding to the code word. Furthermore, the judging unit 650 outputs arbitrary decoded data and a code length "0" in the case where code words stored in the storage unit 651 are not included in the bit string extracted by the bit stream extracting unit 100.

The table lookup unit 602 includes a judging unit 660 and a storage unit 661 (not shown).

The storage unit 661 stores a variable length code table that is a table of a plurality of code words including three coefficients as well as decoded data and code lengths respectively corresponding to the code words.

The judging unit 660 collates a bit string extracted by the bit stream extracting unit 100 with a variable length code table stored in the storage unit 661, and judges whether a code word stored in the storage unit 661 is included in the bit string extracted by the bit stream extracting unit 100. The judging unit 660 outputs a decode completion signal indicating a judgment result. More specifically, the judging unit 660 outputs a decode completion signal "1" in the case where a code word stored in the storage unit 661 is included in the bit string extracted by the bit stream extracting unit 100. The judging unit 660 outputs a decode completion signal "0" in the case where code words stored in the storage unit 661 are not included in the bit string extracted by the bit stream extracting unit 100. In addition, when a code word stored in the storage unit 661 is included in the bit string extracted by the bit stream extracting unit 100, the judging unit 660 outputs decoded data ("run", "level", "last") and a code length corresponding to the code word. Furthermore, the judging unit 660 outputs arbitrary decoded data and a code length "0" in the case where code words stored in the storage unit 661 are not included in the bit string extracted by the bit stream extracting unit 100.

The table lookup unit 603 includes a judging unit 670 and a storage unit 671 (not shown).

The storage unit 671 stores a variable length code table that is a table of a plurality of code words not stored in the storage unit 661 and which includes three coefficients as well as decoded data and code lengths respectively corresponding to the code words.

The judging unit 670 collates a bit string extracted by the bit stream extracting unit 100 with a variable length code table stored in the storage unit 671, and judges whether a code word stored in the storage unit 671 is included in the bit string extracted by the bit stream extracting unit 100. The judging unit 670 outputs a decode completion signal indicating a judgment result. More specifically, the judging unit 670 outputs a decode completion signal "1" in the case where a code word stored in the storage unit 671 is included in the bit string extracted by the bit stream extracting unit 100. The judging unit 670 outputs a decode completion signal "0" in the case where code words stored in the storage unit 671 are not included in the bit string extracted by the bit stream extracting unit 100. In addition, when a code word stored in the storage unit 671 is included in the bit string extracted by the bit stream extracting unit 100, the judging unit 670 outputs decoded data ("run", "level", "last") and a code length corresponding to the code word. Furthermore, the judging unit 670 outputs arbitrary decoded data and a code length "0" in the case where code words stored in the storage unit 671 are not included in the bit string extracted by the bit stream extracting unit 100.

The table lookup unit 604 includes a judging unit 680 and a storage unit 681 (not shown).

The storage unit 681 stores a variable length code table that is a table of a plurality of code words neither stored in the storage unit 661 nor the storage unit 671 and which includes three coefficients as well as decoded data and code lengths respectively corresponding to the code words.

The judging unit 680 collates a bit string extracted by the bit stream extracting unit 100 with a variable length code table stored in the storage unit 681, and judges whether a code word stored in the storage unit 681 is included in the bit string extracted by the bit stream extracting unit 100. The judging unit 680 outputs a decode completion signal indicating a judgment result. More specifically, the judging unit 680 outputs a decode completion signal "1" in the case where a code word stored in the storage unit 681 is included in the bit string extracted by the bit stream extracting unit 100. The judging unit 680 outputs a decode completion signal "0" in the case where code words stored in the storage unit 681 are not included in the bit string extracted by the bit stream extracting unit 100. In addition, when a code word stored in the storage unit 681 is included in the bit string extracted by the bit stream extracting unit 100, the judging unit 680 outputs decoded data ("run", "level", "last") and a code length corresponding to the code word. Furthermore, the judging unit 680 outputs arbitrary decoded data and a code length "0" in the case where code words stored in the storage unit 681 are not included in the bit string extracted by the bit stream extracting unit 100.

In other words, the table lookup unit 600 and the table lookup unit 601 store decoded data ("run", "level", "last") and code lengths corresponding to code words arbitrarily segmented into two segments and which include two coefficients.

The table lookup unit 602, the table lookup unit 603 and the table lookup unit 604 store decoded data ("run", "level", "last") and code lengths corresponding to code words arbitrarily segmented into three segments and which include three coefficients.

The multiplexer 605 uses the decode completion signal retained in the register 606 as a selection signal and selects a signal to be outputted to the register 606. When the selection signal is "0", the multiplexer 605 selects a decode completion signal outputted by the table lookup unit 600, and when the selection signal is "1", the multiplexer 605 selects a fixed value "0".

The register 606 retains a decode completion signal selected by the multiplexer 605. The register 607 retains decoded data outputted by the table lookup unit 600. The register 608 retains a code length outputted by the table lookup unit 600.

The switches 609, 610, 611, 619, 620, 621, 629, 630, and 631 are switches capable of arbitrarily setting which of two types of inputted signals is to be outputted according a supplied setting value of "0" or "1".

The switch 609, the switch 610, and the switch 611 retain the same setting value. The switch 609 outputs either a decode completion signal outputted by the table lookup unit 600 and the decode completion signal retained in the register 606 to the multiplexer 612. More specifically, when the setting value of the switch 609 is "0", the switch 609 outputs the decode completion signal outputted by the table lookup unit 600, and when the setting value of the switch 609 is "1", the switch 609 outputs the decode completion signal retained in the register 606.

The switch 610 outputs either decoded data outputted by the table lookup unit 600 or decoded data retained in the register 607 to the multiplexer 613. More specifically, when the setting value of the switch 610 is "0", the switch 610 outputs the decoded data outputted by the table lookup unit 600, and when the setting value of the switch 610 is "1", the switch 610 outputs the decoded data retained in the register 607.

The switch 611 outputs either a code length outputted by the table lookup unit 600 or a code length retained in the register 608 to the multiplexer 614. More specifically, when the setting value of the switch 611 is "0", the switch 611 outputs the code length outputted by the table lookup unit 600, and when the setting value of the switch 611 is "1", the switch 611 outputs the code length retained in the register 608.

In accordance with a decode completion signal outputted by the switch 609, the multiplexer 612 selects either a decode completion signal outputted by the table lookup unit 601 or a decode completion signal outputted by the switch 609. When the decode completion signal outputted by the switch 609 is "0", the multiplexer 612 selects the decode completion signal outputted by the table lookup unit 601. When the decode completion signal outputted by the switch 609 is "1", the multiplexer 612 selects the decode completion signal outputted by the switch 609.

In accordance with a decode completion signal outputted by the switch 609, the multiplexer 613 selects either decoded data outputted by the table lookup unit 601 or decoded data outputted by the switch 610. When the decode completion signal outputted by the switch 609 is "0", the multiplexer 613 selects the decoded data outputted by the table lookup unit 601. When the decode completion signal outputted by the switch 609 is "1", the multiplexer 613 selects the decoded data outputted by the switch 610.

In accordance with a decode completion signal outputted by the switch 609, the multiplexer 614 selects either a code length outputted by the table lookup unit 601 or a code length outputted by the switch 611. When the decode completion signal outputted by the switch 609 is "0", the multiplexer 614 selects the code length outputted by the table lookup unit 601. When the decode completion signal outputted by the switch 609 is "1", the multiplexer 614 selects the code length outputted by the switch 611.

The multiplexer 615 uses the decode completion signal retained in the register 616 as a selection signal and selects a signal to be outputted to the register 616. When the selection signal is "0", the multiplexer 615 selects a decode completion signal outputted by the table lookup unit 602, and when the selection signal is "1", the multiplexer 615 selects a fixed value "0".

The register 616 retains a decode completion signal selected by the multiplexer 615. The register 617 retains decoded data outputted by the table lookup unit 602. The register 618 retains a code length outputted by the table lookup unit 602.

The switch 619, the switch 620, and the switch 621 retain the same setting value. The switch 619 outputs either a decode completion signal outputted by the table lookup unit 602 or the decode completion signal retained in the register 616 to the multiplexer 622. More specifically, when the setting value of the switch 619 is "0", the switch 619 outputs the decode completion signal outputted by the table lookup unit 602, and when the setting value of the switch 619 is "1", the switch 619 outputs the decode completion signal retained in the register 616.

The switch 620 outputs either decoded data outputted by the table lookup unit 602 or decoded data retained in the register 617 to the multiplexer 623. More specifically, when the setting value of the switch 620 is "0", the switch 620 outputs the decoded data outputted by the table lookup unit 602, and when the setting value of the switch 620 is "1", the switch 620 outputs the decoded data retained in the register 617.

The switch 621 outputs either a code length outputted by the table lookup unit 602 or a code length retained in the register 618 to the multiplexer 624. More specifically, when the setting value of the switch 621 is "0", the switch 621 outputs the code length outputted by the table lookup unit 602, and when the setting value of the switch 621 is "1", the switch 621 outputs the code length retained in the register 618.

In accordance with a decode completion signal outputted by the switch 619, the multiplexer 622 selects either a decode completion signal outputted by the table lookup unit 603 or a decode completion signal outputted by the switch 619. When the decode completion signal outputted by the switch 619 is "0", the multiplexer 622 selects the decode completion signal outputted by the table lookup unit 603. When the decode completion signal outputted by the switch 619 is "1", the multiplexer 622 selects the decode completion signal outputted by the switch 619.

In accordance with a decode completion signal outputted by the switch 619, the multiplexer 623 selects either decoded data outputted by the table lookup unit 603 or decoded data outputted by the switch 620. When the decode completion signal outputted by the switch 619 is "0", the multiplexer 623 selects decoded data outputted by the table lookup unit 603. When the decode completion signal outputted by the switch 619 is "1", the multiplexer 623 selects decoded data outputted by the switch 620.

In accordance with a decode completion signal outputted by the switch 619, the multiplexer 624 selects either a code length outputted by the table lookup unit 603 or a code length outputted by the switch 621. When the decode completion signal outputted by the switch 619 is "0", the multiplexer 624 selects the code length outputted by the table lookup unit 603. When the decode completion signal outputted by the switch 619 is "1", the multiplexer 624 selects the code length outputted by the switch 621.

The multiplexer 625 uses the decode completion signal retained in the register 626 as a selection signal and selects a signal to be outputted to the register 626. When the selection signal is "0", the multiplexer 625 selects a decode completion signal selected by the multiplexer 622, and when the selection signal is "1", the multiplexer 625 selects a fixed value "0".

The register 626 retains a decode completion signal selected by the multiplexer 625. The register 627 retains decoded data selected by the multiplexer 623. The register 628 retains a code length selected by the multiplexer 624.

The switch 629, the switch 630, and the switch 631 retain the same setting value. The switch 629 outputs either a decode completion signal selected by the multiplexer 622 or the decode completion signal retained in the register 626 to the multiplexer 632. More specifically, when the setting value of the switch 629 is "0", the switch 629 outputs the decode completion signal selected by the multiplexer 622, and when the setting value of the switch 629 is "1", the switch 629 outputs the decode completion signal retained in the register 626.

The switch 630 outputs either decoded data selected by the multiplexer 623 or decoded data retained in the register 627 to the multiplexer 633. More specifically, when the setting value of the switch 630 is "0", the switch 630 outputs the decoded data selected by the multiplexer 623, and when the setting value of the switch 630 is "1", the switch 630 outputs the decoded data retained in the register 627.

The switch 631 outputs either a code length selected by the multiplexer 624 or a code length retained in the register 628 to the multiplexer 634. More specifically, when the setting value of the switch 631 is "0", the switch 631 outputs the code length selected by the multiplexer 624, and when the setting value of the switch 631 is "1", the switch 631 outputs the code length retained in the register 628.

In accordance with a decode completion signal outputted by the switch 629, the multiplexer 632 selects either a decode completion signal outputted by the table lookup unit 604 or a decode completion signal outputted by the switch 629. When the decode completion signal outputted by the switch 629 is "0", the multiplexer 632 selects the decode completion signal outputted by the table lookup unit 604. When the decode completion signal outputted by the switch 629 is "1", the multiplexer 632 selects the decode completion signal outputted by the switch 629.

In accordance with a decode completion signal outputted by the switch 629, the multiplexer 633 selects either decoded data outputted by the table lookup unit 604 or decoded data outputted by the switch 630. When the decode completion signal outputted by the switch 629 is "0", the multiplexer 633 selects the decoded data outputted by the table lookup unit 604. When the decode completion signal outputted by the switch 629 is "1", the multiplexer 633 selects the decoded data outputted by the switch 630.

In accordance with a decode completion signal outputted by the switch 629, the multiplexer 634 selects either a code length outputted by the table lookup unit 604 or a code length outputted by the switch 631. When the decode completion signal outputted by the switch 629 is "0", the multiplexer 634 selects the code length outputted by the table lookup unit 604. When the decode completion signal outputted by the switch 629 is "1", the multiplexer 634 selects the code length outputted by the switch 631.

The control unit 635 outputs selection signals to the multiplexers 636, 637 and 638. When the decode completion signal outputted by the table lookup unit 101 is "1", the control unit 635 outputs a selection signal "0"; when the decode completion signal selected by the multiplexer 612 is "1", the control unit 635 outputs a selection signal "1"; and when the decode completion signal selected by the multiplexer 632 is "1", the control unit 635 outputs a selection signal "2". In addition, when a decode completion signal outputted by the table lookup unit 101, a decode completion signal selected by the multiplexer 612, and a decode completion signal selected by the multiplexer 632 are all "0", the control unit 635 outputs a selection signal "0".

The multiplexer 636, the multiplexer 637, and the multiplexer 638 select a signal to be outputted using a selection signal outputted by the control unit 635.

When the selection signal outputted by the control unit 635 is "0", the multiplexer 636 selects a decode completion signal outputted by the table lookup unit 101. When the selection signal outputted by the control unit 635 is "1", the multiplexer 636 selects a decode completion signal selected by the multiplexer 612. When the selection signal outputted by the control unit 635 is "2", the multiplexer 636 selects a decode completion signal selected by the multiplexer 632.

When the selection signal outputted by the control unit 635 is "0", the multiplexer 637 selects decoded data outputted by the table lookup unit 101. When the selection signal outputted by the control unit 635 is "1", the multiplexer 637 selects decoded data selected by the multiplexer 613. When the selection signal outputted by the control unit 635 is "2", the multiplexer 637 selects decoded data selected by the multiplexer 633.

When the selection signal outputted by the control unit 635 is "0", the multiplexer 638 selects a code length outputted by the table lookup unit 101. When the selection signal outputted by the control unit 635 is "1", the multiplexer 638 selects a code length selected by the multiplexer 614. When the selection signal outputted by the control unit 635 is "2", the multiplexer 638 selects a code length selected by the multiplexer 634.

In this case, decoded data selected by the multiplexer 637 is valid only in a cycle in which the decode completion signal selected by the multiplexer 636 assumes a value of "1".

When the judging unit 640 judges that a code word stored in the storage unit 641 is included in a bit string extracted by the bit stream extracting unit 100, the bit stream extracting unit 100 judges the beginning of an undecoded bit stream based on a code length outputted by the judging unit 640 and extracts a bit string to be next decoded either in the same cycle as a cycle in which the judgment was made by the judging unit 640 or in a subsequent cycle.

When the judging unit 650 judges that a code word stored in the storage unit 651 is included in a bit string extracted by the bit stream extracting unit 100, the bit stream extracting unit 100 judges the beginning of an undecoded bit stream based on a code length outputted by the judging unit 650 and extracts a bit string to be next decoded in the same cycle as a cycle in which the judgment was made by the judging unit 650.

When the judging unit 660 judges that a code word stored in the storage unit 661 is included in a bit string extracted by the bit stream extracting unit 100, the bit stream extracting unit 100 judges the beginning of an undecoded bit stream based on a code length outputted by the judging unit 660 and extracts a bit string to be next decoded in the same cycle as a cycle in which the judgment was made by the judging unit 660, an immediately subsequent cycle, or two cycles after the cycle in which the judgment was made by the judging unit 660.

When the judging unit 670 judges that a code word stored in the storage unit 671 is included in a bit string extracted by the bit stream extracting unit 100, the bit stream extracting unit 100 judges the beginning of an undecoded bit stream based on a code length outputted by the judging unit 670 and extracts a bit string to be next decoded either in the same cycle as a cycle in which the judgment was made by the judging unit 670 or in a subsequent cycle.

When the judging unit 680 judges that a code word stored in the storage unit 681 is included in a bit string extracted by the bit stream extracting unit 100, the bit stream extracting unit 100 judges the beginning of an undecoded bit stream based on a code length outputted by the judging unit 680 and extracts a bit string to be next decoded in the same cycle as a cycle in which the judgment was made by the judging unit 680.

The switches 609, 610, and 611 switch the cycle in which bit string extraction by the bit stream extracting unit 100 is performed when the judging unit 640 judges that a code word stored in the storage unit 641 is included in a bit string extracted by the bit stream extracting unit 100 to the same cycle as a cycle in which the judgment was made by the judging unit 640 or to a subsequent cycle.

The switches 619, 620, 621, 629, 630, and 631 switch the cycle in which bit string extraction by the bit stream extracting unit 100 is performed when the judging unit 660 judges that a code word stored in the storage unit 661 is included in a bit string extracted by the bit stream extracting unit 100 to the same cycle as a cycle in which the judgment was made by the judging unit 660, the immediately subsequent cycle, or two cycles after the cycle in which the judgment was made by the judging unit 660.

The switches 629, 630, and 631 switch the cycle in which bit string extraction by the bit stream extracting unit 100 is performed when the judging unit 670 judges that a code word stored in the storage unit 671 is included in a bit string extracted by the bit stream extracting unit 100 to the same cycle as a cycle in which the judgment was made by the judging unit 670 or a subsequent cycle.

Next, operations of the variable length code decoding apparatus 60 according to the sixth embodiment of the present invention will be described.

FIG. 19 is a diagram showing specific operations performed by the variable length code decoding apparatus 60. FIG. 20 is a diagram showing examples of code words included in a bit stream inputted to the variable length code decoding apparatus 60. An operation for decoding a bit stream "l1m1-m8n1-n16o1-o32" by the variable length code decoding apparatus 60 will now be described.

A code word l1 shown in FIG. 20 whose "run" value is "0" is stored in the table lookup unit 101; a code word m1-m8 whose "run" value is "1" is stored in the table lookup unit 600; a code word n1-n16 whose "run" value is "2" is stored in the table lookup unit 603; and a code word o1-o32 whose "run" value is "2" is stored in the table lookup unit 603.

In addition, the switch 609, the switch 610, and the switch 611 retain the same setting value "0"; the switch 619, the switch 620, and the switch 621 retain the same setting value "0"; and the switch 629, the switch 630, and the switch 631 retain the same setting value "1".

In addition, the bit stream extracting unit 100 outputs "l1m1-m8n1-n16o1-o7" as an initial value, the register 626 retains "0" as an initial value, the register 627 retains "(0, 0, 0)" as an initial value, and the register 628 retains "0" as an initial value.

<0th Cycle>

In the 0th cycle, the bit stream extracting unit 100 outputs an initial value "l1m1-m8n1-n16o1-o7".

Since the bit string "l1m1-m8n1-n16o1-o7" extracted by the bit stream extracting unit 100 and the code word "l1" stored in the table lookup unit 101 are consistent, the table lookup unit 101 outputs a decode completion signal "1", outputs decoded data ("run", "level", "last") "(0, 1, 0)", and outputs a code length "1".

Since the bit string "l1m1-m8n1-n16o1-o7" extracted by the bit stream extracting unit 100 and code words stored in the table lookup unit 600 are inconsistent, the table lookup unit 600 outputs a decode completion signal "0", outputs decoded data ("run", "level", "last") "(x, x, x)", and outputs a code length "0".

Since the bit string "l1m1-m8n1-n16o1-o7" extracted by the bit stream extracting unit 100 and code words stored in the table lookup unit 601 are inconsistent, the table lookup unit 601 outputs a decode completion signal "0", outputs decoded data ("run", "level", "last") "(x, x, x)", and outputs a code length "0".

Since the bit string "l1m1-m8n1-n16o1-o7" extracted by the bit stream extracting unit 100 and code words stored in the table lookup unit 602 are inconsistent, the table lookup unit 602 outputs a decode completion signal "0", outputs decoded data ("run", "level", "last") "(x, x, x)", and outputs a code length "0".

Since the bit string "l1m1-m8n1-n16o1-o7" extracted by the bit stream extracting unit 100 and code words stored in the table lookup unit 603 are inconsistent, the table lookup unit 603 outputs a decode completion signal "0", outputs decoded data ("run", "level", "last") "(x, x, x)", and outputs a code length "0".

Since the bit string "l1m1-m8n1-n16o1-o7" extracted by the bit stream extracting unit 100 and code words stored in the table lookup unit 604 are inconsistent, the table lookup unit 604 outputs a decode completion signal "0", outputs decoded data ("run", "level", "last") "(x, x, x)", and outputs a code length "0".

Since the setting value of the switch 609 is "0", the switch 609 outputs the decode completion signal "0" outputted by the table lookup unit 600. Since the setting value of the switch 610 is "0", the switch 610 outputs the decoded data "(x, x, x)" outputted by the table lookup unit 600. Since the setting value of the switch 611 is "0", the switch 611 outputs the code length "0" outputted by the table lookup unit 600.

Since the decode completion signal outputted by the switch 609 is "0", the multiplexer 612 selects the decode completion signal "0" outputted by the table lookup unit 601. Since the decode completion signal outputted by the switch 609 is "0", the multiplexer 613 selects the decoded data "(x, x, x)" outputted by the table lookup unit 601. Since the decode completion signal outputted by the switch 609 is "0", the multiplexer 614 selects the code length "0" outputted by the table lookup unit 601.

Since the setting value of the switch 619 is "0", the switch 619 outputs the decode completion signal "0" outputted by the table lookup unit 602. Since the setting value of the switch 620 is "0", the switch 620 outputs the decoded data "(x, x, x)" outputted by the table lookup unit 602. Since the setting value of the switch 621 is "0", the switch 621 outputs the code length "0" outputted by the table lookup unit 602.

Since the decode completion signal outputted by the switch 619 is "0", the multiplexer 622 selects the decode completion signal "0" outputted by the table lookup unit 603. Since the decode completion signal outputted by the switch 619 is "0", the multiplexer 623 selects the decoded data "(x, x, x)" outputted by the table lookup unit 603. Since the decode completion signal outputted by the switch 619 is "0", the multiplexer 624 selects the code length "0" outputted by the table lookup unit 603.

The register 626 retains an initial value "0". The register 627 retains an initial value "(0, 0, 0)". The register 628 retains an initial value "0".

Since the decode completion signal retained in the register 626 is "0", the multiplexer 625 selects the decode completion signal "0" selected by the multiplexer 622.

Since the setting value of the switch 629 is "1", the switch 629 outputs the decode completion signal "0" retained in the register 626. Since the setting value of the switch 630 is "1", the switch 630 outputs the decoded data "(x, x, x)" retained in the register 627. Since the setting value of the switch 631 is. "1", the switch 631 outputs the code length "0" retained in the register 628.

Since the decode completion signal outputted by the switch 629 is "0", the multiplexer 632 selects the decode completion signal "0" outputted by the table lookup unit 604. Since the decode completion signal outputted by the switch 629 is "0", the multiplexer 633 selects the decoded data "(x, x, x)" outputted by the table lookup unit 604. Since the decode completion signal outputted by the switch 629 is "0", the multiplexer 634 selects the code length "0" outputted by the table lookup unit 604.

Since the decode completion signal outputted by the table lookup unit 101 is "1", the control unit 635 outputs a selection signal "0".

Since the selection signal outputted by the control unit 635 is "0", the multiplexer 636 selects the decode completion signal "1" outputted by the table lookup unit 101. Since the selection signal outputted by the control unit 635 is "0", the multiplexer 637 selects the decoded data "(0, 1, 0)" outputted by the table lookup unit 101. Since the selection signal outputted by the control unit 635 is "0", the multiplexer 638 selects the code length "1" outputted by the table lookup unit 101.

Since the code length selected by the multiplexer 638 is "1", the bit stream extracting unit 100 shifts the first bit by 1 bit and extracts a bit string "m1-m8n1-n16o1-o8". In the subsequent cycle, the bit stream extracting unit 100 outputs the extracted bit string "m1-m8n1-n16o1-o8".

The register 626 loads the decode completion signal "0" selected by the multiplexer 625, and outputs the decode completion signal "0" in the next cycle. The register 627 loads the decoded data "(x, x, x)" selected by the multiplexer 623, and outputs the decoded data "(x, x, x)" in the next cycle. The register 628 loads the code length "0" selected by the multiplexer 624, and outputs the code length "0" in the next cycle.

<1st Cycle>

In the 1st cycle, the bit stream extracting unit 100 outputs the bit string "m1-m8n1-n16o1-o8" extracted in the 0th cycle.

Since the bit string "m1-m8n1-n16o1-o8" extracted by the bit stream extracting unit 100 and code words stored in the table lookup unit 101 are inconsistent, the table lookup unit 101 outputs a decode completion signal "0", outputs decoded data ("run", "level", "last") "(x, x, x)", and outputs a code length "0".

Since the bit string "m1-m8n1-n16o1-o8" extracted by the bit stream extracting unit 100 and the code word "m1-m8" stored in the table lookup unit 600 are consistent, the table lookup unit 600 outputs a decode completion signal "1", outputs decoded data ("run", "level", "last") "(1, 2, 0)", and outputs a code length "8".

Since the bit string "m1-m8n1-n16o1-o8" extracted by the bit stream extracting unit 100 and code words stored in the table lookup unit 601 are inconsistent, the table lookup unit 601 outputs a decode completion signal "0", outputs decoded data ("run", "level", "last") "(x, x, x)", and outputs a code length "0".

Since the bit string "m1-m8n1-n16o1-o8" extracted by the bit stream extracting unit 100 and code words stored in the table lookup unit 602 are inconsistent, the table lookup unit 602 outputs a decode completion signal "0", outputs decoded data ("run", "level", "last") "(x, x, x)", and outputs a code length "0".

Since the bit string "m1-m8n1-n16o1-o8" extracted by the bit stream extracting unit 100 and code words stored in the table lookup unit 603 are inconsistent, the table lookup unit 603 outputs a decode completion signal "0", outputs decoded data ("run", "level", "last") "(x, x, x)", and outputs a code length "0".

Since the bit string "m1-m8n1-n16o1-o8" extracted by the bit stream extracting unit 100 and code words stored in the table lookup unit 604 are inconsistent, the table lookup unit 604 outputs a decode completion signal "0", outputs decoded data ("run", "level", "last") "(x, x, x)", and outputs a code length "0".

Since the setting value of the switch 609 is "0", the switch 609 outputs the decode completion signal "1" outputted by the table lookup unit 600. Since the setting value of the switch 610 is "0", the switch 610 outputs the decoded data "(1, 2, 0)" outputted by the table lookup unit 600. Since the setting value of the switch 611 is "0", the switch 611 outputs the code length "8" outputted by the table lookup unit 600.

Since the decode completion signal outputted by the switch 609 is "1", the multiplexer 612 selects the decode completion signal "1" outputted by the switch 609. Since the decode completion signal outputted by the switch 609 is "1", the multiplexer 613 selects the decoded data "(1, 2, 0)" outputted by the switch 610. Since the decode completion signal outputted by the switch 609 is "1", the multiplexer 614 selects the code length "8" outputted by the switch 611.

Since the setting value of the switch 619 is "0", the switch 619 outputs the decode completion signal "0" outputted by the table lookup unit 602. Since the setting value of the switch 620 is "0", the switch 620 outputs the decoded data "(x, x, x)" outputted by the table lookup unit 602. Since the setting value of the switch 621 is "0", the switch 621 outputs the code length "0" outputted by the table lookup unit 602.

Since the decode completion signal outputted by the switch 619 is "0", the multiplexer 622 selects the decode completion signal "0" outputted by the table lookup unit 603. Since the decode completion signal outputted by the switch 619 is "0", the multiplexer 623 selects the decoded data "(x, x, x)" outputted by the table lookup unit 603. Since the decode completion signal outputted by the switch 619 is "0", the multiplexer 624 selects the code length "0" outputted by the table lookup unit 603.

The register 626 retains the decode completion signal "0" loaded in the 0th cycle. The register 627 retains the decoded data "(x, x, x)" loaded in the 0th cycle. The register 628 retains the code length "0" loaded in the 0th cycle.

Since the decode completion signal retained in the register 626 is "0", the multiplexer 625 selects the decode completion signal "0" selected by the multiplexer 622.

Since the setting value of the switch 629 is "1", the switch 629 outputs the decode completion signal "0" retained in the register 626. Since the setting value of the switch 630 is "1", the switch 630 outputs the decoded data "(x, x, x)" retained in the register 627. Since the setting value of the switch 631 is "1", the switch 631 outputs the code length "0" retained in the register 628.

Since the decode completion signal outputted by the switch 629 is "0", the multiplexer 632 selects the decode completion signal "0" outputted by the table lookup unit 604. Since the decode completion signal outputted by the switch 629 is "0", the multiplexer 633 selects the decoded data "(x, x, x)" outputted by the table lookup unit 604. Since the decode completion signal outputted by the switch 629 is "0", the multiplexer 634 selects the code length "0" outputted by the table lookup unit 604.

Since the decode completion signal selected by the multiplexer 612 is "1", the control unit 635 outputs a selection signal "1".

Since the selection signal outputted by the control unit 635 is "1", the multiplexer 636 selects the decode completion signal "1" selected by the multiplexer 612. Since the selection signal outputted by the control unit 635 is "1", the multiplexer 637 selects the decoded data "(1, 2, 0)" selected by the multiplexer 613. Since the selection signal outputted by the control unit 635 is "1", the multiplexer 638 selects the code length "8" selected by the multiplexer 614.

Since the code length selected by the multiplexer 638 is "8", the bit stream extracting unit 100 shifts the first bit by 8 bits and extracts a bit string "n1-n16o1-o16". In the next cycle, the bit stream extracting unit 100 outputs the extracted bit string "n1-n16o1-o16".

The register 626 loads the decode completion signal "0" selected by the multiplexer 625, and outputs the decode completion signal "0" in the next cycle. The register 627 loads the decoded data "(x, x, x)" selected by the multiplexer 623, and outputs the decoded data "(x, x, x)" in the next cycle. The register 628 loads the code length "0" selected by the multiplexer 624, and outputs the code length "0" in the next cycle.

<2nd Cycle>

In the 2nd cycle, the bit stream extracting unit 100 outputs the bit string "n1-n16o1-o16" extracted in the 1st cycle.

Since the bit string "n1-n16o1-o16" extracted by the bit stream extracting unit 100 and code words stored in the table lookup unit 101 are inconsistent, the table lookup unit 101 outputs a decode completion signal "0", outputs decoded data ("run", "level", "last") "(x, x, x)", and outputs a code length "0".

Since the bit string "n1-n16o1-o16" extracted by the bit stream extracting unit 100 and the code words stored in the table lookup unit 600 are inconsistent, the table lookup unit 600 outputs a decode completion signal "0", outputs decoded data ("run", "level", "last") "(x, x, x)", and outputs a code length "0".

Since the bit string "n1-n16o1-o16" extracted by the bit stream extracting unit 100 and the code words stored in the table lookup unit 601 are inconsistent, the table lookup unit 601 outputs a decode completion signal "0", outputs decoded data ("run", "level", "last") "(x, x, x)", and outputs a code length "0".

Since the bit string "n1-n16o1-o16" extracted by the bit stream extracting unit 100 and code words stored in the table lookup unit 602 are inconsistent, the table lookup unit 602 outputs a decode completion signal "0", outputs decoded data ("run", "level", "last") "(x, x, x)", and outputs a code length "0".

Since the bit string "n1-n16o1-o16" extracted by the bit stream extracting unit 100 and the code word "n1-n16" stored in the table lookup unit 603 are consistent, the table lookup unit 603 outputs a decode completion signal "1", outputs decoded data ("run", "level", "last") "(2, 3, 0)", and outputs a code length "16".

Since the bit string "n1-n16o1-o16" extracted by the bit stream extracting unit 100 and code words stored in the table lookup unit 604 are inconsistent, the table lookup unit 604 outputs a decode completion signal "0", outputs decoded data ("run", "level", "last") "(x, x, x)", and outputs a code length "0".

Since the setting value of the switch 609 is "0", the switch 609 outputs the decode completion signal "0" outputted by the table lookup unit 600. Since the setting value of the switch 610 is "0", the switch 610 outputs the decoded data "(x, x, x)" outputted by the table lookup unit 600. Since the setting value of the switch 611 is "0", the switch 611 outputs the code length "0" outputted by the table lookup unit 600.

Since the decode completion signal outputted by the switch 609 is "0", the multiplexer 612 selects the decode completion signal "0" outputted by the table lookup unit 601. Since the decode completion signal outputted by the switch 609 is "0", the multiplexer 613 selects the decoded data "(x, x, x)" outputted by the table lookup unit 601. Since the decode completion signal outputted by the switch 609 is "0", the multiplexer 614 selects the code length "0" outputted by the table lookup unit 601.

Since the setting value of the switch 619 is "0", the switch 619 outputs the decode completion signal "0" outputted by the table lookup unit 602. Since the setting value of the switch 620 is "0", the switch 620 outputs the decoded data "(x, x, x)" outputted by the table lookup unit 602. Since the setting value of the switch 621 is "0", the switch 621 outputs the code length "0" outputted by the table lookup unit 602.

Since the decode completion signal outputted by the switch 619 is "0", the multiplexer 622 selects the decode completion signal "1" outputted by the table lookup unit 603. Since the decode completion signal outputted by the switch 619 is "0", the multiplexer 623 selects the decoded data "(2, 3, 0)" outputted by the table lookup unit 603. Since the decode completion signal outputted by the switch 619 is "0", the multiplexer 624 selects the code length "16" outputted by the table lookup unit 603.

The register 626 retains the decode completion signal "0" loaded in the 1st cycle. The register 627 retains the decoded data "(x, x, x)" loaded in the 1st cycle. The register 628 retains the code length "0" loaded in the 1st cycle.

Since the decode completion signal retained in the register 626 is "0", the multiplexer 625 selects the decode completion signal "1" selected by the multiplexer 622.

Since the setting value of the switch 629 is "1", the switch 629 outputs the decode completion signal "0" retained in the register 626. Since the setting value of the switch 630 is "1", the switch 630 outputs the decoded data "(x, x, x)" retained in the register 627. Since the setting value of the switch 631 is "1", the switch 631 outputs the code length "0" retained in the register 628.

Since the decode completion signal outputted by the switch 629 is "0", the multiplexer 632 selects the decode completion signal "0" outputted by the table lookup unit 604. Since the decode completion signal outputted by the switch 629 is "0", the multiplexer 633 selects the decoded data "(x, x, x)" outputted by the table lookup unit 604. Since the decode completion signal outputted by the switch 629 is "0", the multiplexer 634 selects the code length "0" outputted by the table lookup unit 604.

Since a decode completion signal outputted by the table lookup unit 101, a decode completion signal selected by the multiplexer 612, and a decode completion signal selected by the multiplexer 632 are all "0", the control unit 635 outputs a selection signal "0".

Since the selection signal outputted by the control unit 635 is "0", the multiplexer 636 selects the decode completion signal "0" outputted by the table lookup unit 101. Since the selection signal outputted by the control unit 635 is "0", the multiplexer 637 selects the decoded data "(x, x, x)" outputted by the table lookup unit 101. Since the selection signal outputted by the control unit 635 is "0", the multiplexer 638 selects the code length "0" outputted by the table lookup unit 101.

Since the code length selected by the multiplexer 638 is "10", the bit stream extracting unit 100 extracts a bit string "n1-n16o1-o16". In the next cycle, the bit stream extracting unit 100 outputs the extracted bit string "n1-n16o1-o16".

The register 626 loads the decode completion signal "1" selected by the multiplexer 625, and outputs the decode completion signal "1" in the next cycle. The register 627 loads the decoded data "(2, 3, 0)" selected by the multiplexer 623, and outputs the decoded data "(2, 3, 0)" in the next cycle. The register 628 loads the code length "16" selected by the multiplexer 624, and outputs the code length "16" in the next cycle.

<3rd Cycle>

In the 3rd cycle, the bit stream extracting unit 100 outputs the bit string "n1-n16o1-o16" extracted in the 2nd cycle.

Since the bit string "n1-n16o1-o16" extracted by the bit stream extracting unit 100 and code words stored in the table lookup unit 101 are inconsistent, the table lookup unit 101 outputs a decode completion signal "0", outputs decoded data ("run", "level", "last") "(x, x, x)", and outputs a code length "0".

Since the bit string "n1-n16o1-o16" extracted by the bit stream extracting unit 100 and code words stored in the table lookup unit 600 are inconsistent, the table lookup unit 600 outputs a decode completion signal "0", outputs decoded data ("run", "level", "last") "(x, x, x)", and outputs a code length "0".

Since the bit string "n1-n16o1-o16" extracted by the bit stream extracting unit 100 and code words stored in the table lookup unit 601 are inconsistent, the table lookup unit 601 outputs a decode completion signal "0", outputs decoded data ("run", "level", "last") "(x, x, x)", and outputs a code length "0".

Since the bit string "n1-n16o1-o16" extracted by the bit stream extracting unit 100 and code words stored in the table lookup unit 602 are inconsistent, the table lookup unit 602 outputs a decode completion signal "0", outputs decoded data ("run", "level", "last") "(x, x, x)", and outputs a code length "0".

Since the bit string "n1-n16o1-o16" extracted by the bit stream extracting unit 100 and the code word "n1-n16" stored in the table lookup unit 603 are consistent, the table lookup unit 603 outputs a decode completion signal "1", outputs decoded data ("run", "level", "last") "(2, 3, 0)", and outputs a code length "16".

Since the bit string "n1-n16o1-o16" extracted by the bit stream extracting unit 100 and code words stored in the table lookup unit 604 are inconsistent, the table lookup unit 604 outputs a decode completion signal "0", outputs decoded data ("run", "level", "last") "(x, x, x)", and outputs a code length "0".

Since the setting value of the switch 609 is "0", the switch 609 outputs the decode completion signal "0" outputted by the table lookup unit 600. Since the setting value of the switch 610 is "0", the switch 610 outputs the decoded data "(x, x, x)" outputted by the table lookup unit 600. Since the setting value of the switch 611 is "0", the switch 611 outputs the code length "0" outputted by the table lookup unit 600.

Since the decode completion signal outputted by the switch 609 is "0", the multiplexer 612 selects the decode completion signal "0" outputted by the table lookup unit 601. Since the decode completion signal outputted by the switch 609 is "0", the multiplexer 613 selects the decoded data "(x, x, x)" outputted by the table lookup unit 601. Since the decode completion signal outputted by the switch 609 is "0", the multiplexer 614 selects the code length "0" outputted by the table lookup unit 601.

Since the setting value of the switch 619 is "0", the switch 619 outputs the decode completion signal "0" outputted by the table lookup unit 602. Since the setting value of the switch 620 is "0", the switch 620 outputs the decoded data "(x, x, x)" outputted by the table lookup unit 602. Since the setting value of the switch 621 is "0", the switch 621 outputs the code length "0" outputted by the table lookup unit 602.

Since the decode completion signal outputted by the switch 619 is "0", the multiplexer 622 selects the decode completion signal "1" outputted by the table lookup unit 603. Since the decode completion signal outputted by the switch 619 is "0", the multiplexer 623 selects the decoded data "(2, 3, 0)" outputted by the table lookup unit 603. Since the decode completion signal outputted by the switch 619 is "0", the multiplexer 624 selects the code length "16" outputted by the table lookup unit 603.

The register 626 retains the decode completion signal "1" loaded in the 2nd cycle. The register 627 retains the decoded data "(2, 3, 0)" loaded in the 2nd cycle. The register 628 retains the code length "16" loaded in the 2nd cycle.

Since the decode completion signal retained in the register 626 is "1", the multiplexer 625 selects a fixed value "0".

Since the setting value of the switch 629 is "1", the switch 629 outputs the decode completion signal "1" retained in the register 626. Since the setting value of the switch 630 is "1", the switch 630 outputs the decoded data "(2, 3, 0)" retained in the register 627. Since the setting value of the switch 631 is "1", the switch 631 outputs the code length "16" retained in the register 628.

Since the decode completion signal outputted by the switch 629 is "1", the multiplexer 632 selects the decode completion signal "1" outputted by the switch 629. Since the decode completion signal outputted by the switch 629 is "1", the multiplexer 633 selects the decoded data "(2, 3, 0)" outputted by the switch 630. Since the decode completion signal outputted by the switch 629 is "1", the multiplexer 634 selects the code length "16" outputted by the switch 631.

Since the decode completion signal selected by the multiplexer 632 is "1", the control unit 635 outputs a selection signal "2".

Since the selection signal outputted by the control unit 635 is "2", the multiplexer 636 selects the decode completion signal "1" selected by the multiplexer 632. Since the selection signal outputted by the control unit 635 is "2", the multiplexer 637 selects the decoded data "(2, 3, 0)" selected by the multiplexer 633. Since the selection signal outputted by the control unit 635 is "2", the multiplexer 638 selects the code length "16" selected by the multiplexer 634.

Since the code length selected by the multiplexer 638 is "16", the bit stream extracting unit 100 shifts the first bit by 16 bits and extracts a bit string "o1-o32". In the next cycle, the bit stream extracting unit 100 outputs the extracted bit string "o1-o32".

The register 626 loads the decode completion signal "0" selected by the multiplexer 625, and outputs the decode completion signal "0" in the next cycle. The register 627 loads the decoded data "(2, 3, 0)" selected by the multiplexer 623, and outputs the decoded data "(2, 3, 0)" in the next cycle. The register 628 loads the code length "16" selected by the multiplexer 624, and outputs the code length "16" in the next cycle.

<4th Cycle>

In the 4th cycle, the bit stream extracting unit 100 outputs the bit string "o1-o32" extracted in the 3rd cycle.

Since the bit string "o1-o32" extracted by the bit stream extracting unit 100 and code words stored in the table lookup unit 101 are inconsistent, the table lookup unit 101 outputs a decode completion signal "0", outputs decoded data ("run", "level", "last") "(x, x, x)", and outputs a code length "0".

Since the bit string "o1-o32" extracted by the bit stream extracting unit 100 and code words stored in the table lookup unit 600 are inconsistent, the table lookup unit 600 outputs a decode completion signal "0", outputs decoded data ("run", "level", "last") "(x, x, x)", and outputs a code length "0".

Since the bit string "o1-o32" extracted by the bit stream extracting unit 100 and code words stored in the table lookup unit 601 are inconsistent, the table lookup unit 601 outputs a decode completion signal "0", outputs decoded data ("run", "level", "last") "(x, x, x)", and outputs a code length "0".

Since the bit string "o1-o32" extracted by the bit stream extracting unit 100 and code words stored in the table lookup unit 602 are inconsistent, the table lookup unit 602 outputs a decode completion signal "0", outputs decoded data ("run", "level", "last") "(x, x, x)", and outputs a code length "0".

Since the bit string "o1-o32" extracted by the bit stream extracting unit 100 and code words stored in the table lookup unit 603 are inconsistent, the table lookup unit 603 outputs a decode completion signal "0", outputs decoded data ("run", "level", "last") "(x, x, x)", and outputs a code length "0".

Since the bit string "o1-o32" extracted by the bit stream extracting unit 100 and the code word "o1-o32" stored in the table lookup unit 604 are consistent, the table lookup unit 604 outputs a decode completion signal "1", outputs decoded data ("run", "level", "last") "(2, 4, 1)", and outputs a code length "32".

Since the setting value of the switch 609 is "0", the switch 609 outputs the decode completion signal "0" outputted by the table lookup unit 600. Since the setting value of the switch 610 is "0", the switch 610 outputs the decoded data "(x, x, x)" outputted by the table lookup unit 600. Since the setting value of the switch 611 is "0", the switch 611 outputs the code length "0" outputted by the table lookup unit 600.

Since the decode completion signal outputted by the switch 609 is "0", the multiplexer 612 selects the decode completion signal "0" outputted by the table lookup unit 601. Since the decode completion signal outputted by the switch 609 is "0", the multiplexer 613 selects the decoded data "(x, x, x)" outputted by the table lookup unit 601. Since the decode completion signal outputted by the switch 609 is "0", the multiplexer 614 selects the code length "0" outputted by the table lookup unit 601.

Since the setting value of the switch 619 is "0", the switch 619 outputs the decode completion signal "0" outputted by the table lookup unit 602. Since the setting value of the switch 620 is "0", the switch 620 outputs the decoded data "(x, x, x)" outputted by the table lookup unit 602. Since the setting value of the switch 621 is "0", the switch 621 outputs the code length "0" outputted by the table lookup unit 602.

Since the decode completion signal outputted by the switch 619 is "0", the multiplexer 622 selects the decode completion signal "0" outputted by the table lookup unit 603. Since the decode completion signal outputted by the switch 619 is "0", the multiplexer 623 selects the decoded data "(x, x, x)" outputted by the table lookup unit 603. Since the decode completion signal outputted by the switch 619 is "0", the multiplexer 624 selects the code length "0" outputted by the table lookup unit 603.

The register 626 retains the decode completion signal "0" loaded in the 3rd cycle. The register 627 retains the decoded data "(2, 3, 0)" loaded in the 3rd cycle. The register 628 retains the code length "16" loaded in the 3rd cycle.

Since the decode completion signal retained in the register 626 is "0", the multiplexer 625 outputs the decode completion signal "0" selected by the multiplexer 622.

Since the setting value of the switch 629 is "1", the switch 629 outputs the decode completion signal "0" retained in the register 626. Since the setting value of the switch 630 is "1", the switch 630 outputs the decoded data "(2, 3, 0)" retained in the register 627. Since the setting value of the switch 631 is "1", the switch 631 outputs the code length "16" retained in the register 628.

Since the decode completion signal outputted by the switch 629 is "0", the multiplexer 632 selects the decode completion signal "1" outputted by the table lookup unit 604. Since the decode completion signal outputted by the switch 629 is "0", the multiplexer 633 selects the decoded data "(2, 4, 1)" outputted by the table lookup unit 604. Since the decode completion signal outputted by the switch 629 is "0", the multiplexer 634 selects the code length "32" outputted by the table lookup unit 604.

Since the decode completion signal selected by the multiplexer 632 is "1", the control unit 635 outputs a selection signal "2".

Since the selection signal outputted by the control unit 635 is "2", the multiplexer 636 selects the decode completion signal "1" selected by the multiplexer 632. Since the selection signal outputted by the control unit 635 is "2", the multiplexer 637 selects the decoded data "(2, 4, 1)" selected by the multiplexer 633. Since the selection signal outputted by the control unit 635 is "2", the multiplexer 638 selects the code length "32" selected by the multiplexer 634.

As described above, with respect to code words stored in the table lookup unit 604 among code words including one coefficient, code words including two coefficients, and code words including three coefficients, decoding and bit string extraction are performed in one cycle. In addition, with respect to code words stored in the table lookup units 602 and 603 among code words including three coefficients, decoding and bit string extraction are performed in two cycles.

Furthermore, by setting setting values of "1" for the switches 609, 610, and 611, decoding and bit string extraction of code words stored in the table lookup unit 600 and which include two coefficients can be performed in two cycles.

Moreover, by setting setting values of "1" for the switches 619, 620, and 621 and setting setting values of "1" for the switches 629, 630, and 631, decoding and bit string extraction of code words stored in the table lookup unit 602 and which include three coefficients can be performed in three cycles and decoding and bit string extraction of code words stored in the table lookup unit 603 and which include three coefficients can be performed in two cycles.

In addition, by setting setting values of "1" for the switches 619, 620, and 621 and setting setting values of "0" for the switches 629, 630, and 631, decoding and bit string extraction of code words stored in the table lookup unit 602 and which include three coefficients can be performed in two cycles and decoding and bit string extraction of code words stored in the table lookup unit 603 and which include three coefficients can be performed in one cycle.

Furthermore, by setting setting values of "0" for the switches 619, 620, and 621 and setting setting values of "0" for the switches 629, 630, and 631, decoding and bit string extraction of code words stored in the table lookup unit 602 and which include three coefficients can be performed in one cycle and decoding and bit string extraction of code words stored in the table lookup unit 603 and which include three coefficients can be performed in one cycle.

As shown, the variable length code decoding apparatus 60 according to the sixth embodiment of the present invention includes n number (where n is a natural number) of table lookup units for each of n number of coefficients included in a code word. In addition, each table lookup unit stores one of n number of tables created by segmenting a table corresponding to a code word including n number of code words. Consequently, the number of code words to be stored by each table lookup unit can be reduced. As a result, the time required for collation by each table lookup unit can be reduced.

In addition, the variable length code decoding apparatus 60 according to the sixth embodiment of the present invention performs decoding and bit string extraction with respect to a code word including n number of coefficients in a maximum of n cycles. Accordingly, the duration of a cycle can be reduced. As a result, decoding can be performed at high speed. In particular, by connecting outputs of the respective table lookup units in series, decoding can be performed efficiently when a table is hierarchically segmented. For example, decoding can be performed efficiently when a table stored in each table lookup unit is segmented into tables corresponding to a plurality of higher order bits and a plurality of lower order bits of 32-bit bit string.

Furthermore, switches enable the variable length code decoding apparatus 60 according to the sixth embodiment of the present invention to switch the number of cycles required for decoding process and bit string extraction process. Consequently, the time required for decoding a code word can be changed adaptively in accordance with operation frequencies and manufacturing processes. For example, by increasing the number of cycles required for decoding, the duration of a cycle can be reduced and operations at a high frequency can be accommodated. In addition, when operating at a low frequency, the average number of cycles required for decoding can be reduced by reducing the number of cycles required for decoding.

It should be noted that while an example wherein code words including one to three coefficients has been described above, the present invention may also be applied to a case where a code word including four or more coefficients is decoded. When the present invention is applied to a code word including four or more coefficients, the code word including four or more coefficients may either be stored in any of the table lookup units 101, 600, 601, 602, 603, and 604 or a table lookup unit corresponding to four or more coefficients may be provided. In other words, a configuration shall suffice wherein decoding and bit string extraction on a code word including n number of coefficients (where n is a natural number) is performed in a maximum of n cycles.

Moreover, in the above description, while the variable length code decoding apparatus 60 is provided with the table lookup units 600 and 601 as table lookup units that decode code words including two coefficients, only one of the table lookup units 600 and 601 may be provided instead. In this case, the table lookup unit 600 or 601 stores all code words including two coefficients. Furthermore, in the above description, while the variable length code decoding apparatus 60 is provided with the table lookup units 602, 603 and 604 as table lookup units that decode code words including three coefficients, one or more of the table lookup unit 602, 603 and 604 may be provided instead.

Seventh Embodiment

A variable length code decoding apparatus according to a seventh embodiment of the present invention decodes a code word coded by three or more types of variable length coding methods. A variable length code decoding apparatus according to a seventh embodiment of the present invention includes a plurality of table lookup units that respectively decode code words coded by each variable length coding method, and further includes a dedicated register for performing bit string extraction with respect to a table lookup unit that requires the longest decoding time. Consequently, a path delay with respect to the table lookup unit that requires the longest decoding time can be reduced and an increase in speed can be achieved.

First, a configuration of a variable length code decoding apparatus according to the seventh embodiment of the present invention will be described.

Figure 21:
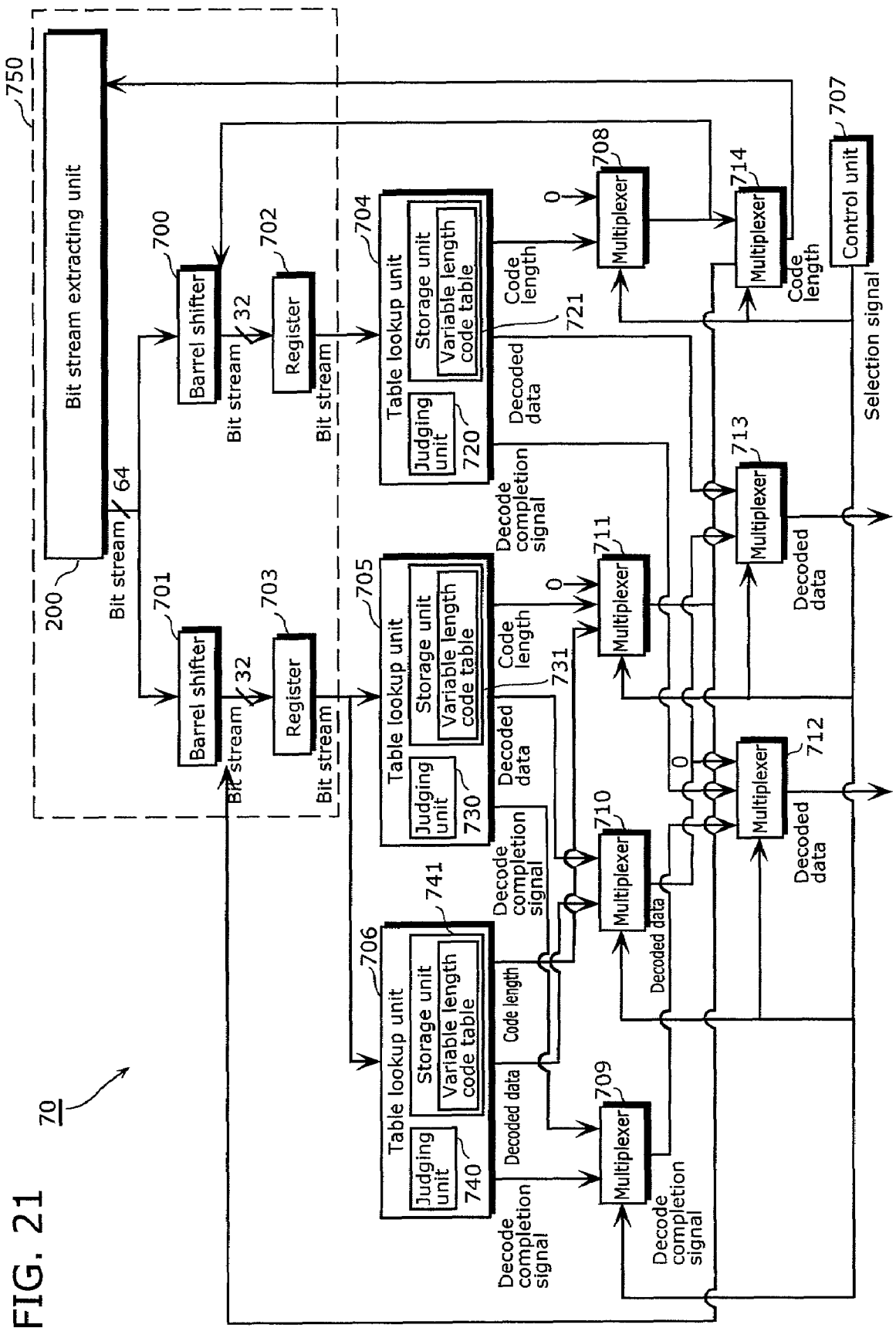
FIG. 21 is a block diagram showing a configuration of a variable length code decoding apparatus according to a seventh embodiment of the present invention.

FIG. 21 is a block diagram showing a configuration of a variable length code decoding apparatus 70 according to the seventh embodiment of the present invention. Note that like elements to those shown in FIG. 7 are assigned like reference numerals and descriptions thereof will be omitted.

The variable length code decoding apparatus 70 shown in FIG. 21 decodes a bit stream including a code word that is data variable-length-coded by any of a first variable length coding, a second variable length coding, and a third variable length coding, and outputs decoded data. In this case, the first variable length coding, the second variable length coding, and the third variable length coding are assumed to be variable length coding methods that are mutually different. The variable length code decoding apparatus 70 includes a bit stream extracting unit 750, table lookup units 704, 705, and 706, a control unit 707, and multiplexers 708, 709, 710, 711, 712, 713, and 714.

The bit stream extracting unit 750 extracts a bit string of at least a maximum code length of a code word used for variable length coding from the beginning of an undecoded bit stream. The bit stream extracting unit 750 includes a bit stream supplying unit 200, barrel shifters 700 and 701, and registers 702 and 703.

The bit stream supplying unit 200 judges a beginning of an undecoded bit stream based on a code length selected by the multiplexer 714. The bit stream supplying unit 200 extracts a bit string that is at least twice as long as a maximum code length of a code word used in the first variable length coding, the second variable length coding and the third variable length coding from the beginning of the judged undecoded bit stream. More specifically, the bit stream supplying unit 200 extracts a 64-bit bit string and outputs the extracted bit string to the barrel shifters 700 and 701.

The barrel shifter 700 shifts the bit string extracted by the bit stream supplying unit 200 to the left by a code length selected by the multiplexer 708, and outputs a bit string of at least a maximum code length of a code word used in the first variable length coding from the beginning of the shifted bit string. More specifically, the barrel shifter 700 outputs a 32-bit bit string to the register 702.

The barrel shifter 701 shifts the bit string extracted by the bit stream supplying unit 200 to the left by a code length selected by the multiplexer 711, and outputs a bit string of at least a maximum code length of a code word used in the second variable length coding and the third variable length coding from the beginning of the shifted bit string. More specifically, the barrel shifter 701 outputs a 32-bit bit string to the register 703.

The register 702 retains the bit string outputted by the barrel shifter 700. The register 703 retains the bit string outputted by the barrel shifter 701.

The table lookup unit 704, the table lookup unit 705, and the table lookup unit 706 store decoded data of code words coded by variable length coding methods of different types. Among the table lookup units 704, 705, and 706, the table lookup unit 704 requires the longest time for collating a code word.

The table lookup unit 704 includes a judging unit 720 and a storage unit 721.

The storage unit 721 stores a variable length code table that is a table of a plurality of code words coded by the first variable length coding method as well as decoded data and code lengths respectively corresponding to the code words.

The judging unit 720 collates a bit string stored in the register 702 with a variable length code table stored in the storage unit 721, and judges whether a code word stored in the storage unit 721 is included in the bit string stored in the register 702. The judging unit 720 outputs a decode completion signal indicating a judgment result. More specifically, when a code word stored in the storage unit 721 is included in the bit string stored in the register 702, the judging unit 720 outputs a decode completion signal "1". When code words stored in the storage unit 721 are not included in the bit string stored in the register 702, the judging unit 720 outputs a decode completion signal "0". In addition, when a code word stored in the storage unit 721 is included in the bit string stored in the register 702, the judging unit 720 outputs decoded data ("run", "level", "last") and a code length corresponding to the code word. Furthermore, when code words stored in the storage unit 721 are not included in the bit string stored in the register 702, the judging unit 720 outputs arbitrary decoding data and a code length of "0".

The table lookup unit 705 includes a judging unit 730 and a storage unit 731.

The storage unit 731 stores a variable length code table that is a table of a plurality of code words coded by the second variable length coding method as well as decoded data and code lengths respectively corresponding to the code words.

The judging unit 730 collates a bit string stored in the register 703 with a variable length code table stored in the storage unit 731, and judges whether a code word stored in the storage unit 731 is included in the bit string stored in the register 703. The judging unit 730 outputs a decode completion signal indicating a judgment result. More specifically, when a code word stored in the storage unit 731 is included in the bit string stored in the register 703, the judging unit 730 outputs a decode completion signal "1". When code words stored in the storage unit 731 are not included in the bit string stored in the register 703, the judging unit 730 outputs a decode completion signal "0". In addition, when a code word stored in the storage unit 731 is included in the bit string stored in the register 703, the judging unit 730 outputs decoded data ("run", "level", "last") and a code length corresponding to the code word. Furthermore, when code words stored in the storage unit 731 are not included in the bit string stored in the register 703, the judging unit 730 outputs arbitrary decoding data and a code length of "0".

The table lookup unit 706 includes a judging unit 740 and a storage unit 741.

The storage unit 741 stores a variable length code table that is a table of a plurality of code words coded by the third variable length coding method as well as decoded data and code lengths respectively corresponding to the code words.

The judging unit 740 collates a bit string stored in the register 703 with a variable length code table stored in the storage unit 741, and judges whether a code word stored in the storage unit 741 is included in the bit string stored in the register 703. The judging unit 740 outputs a decode completion signal indicating a judgment result. More specifically, when a code word stored in the storage unit 741 is included in the bit string stored in the register 703, the judging unit 740 outputs a decode completion signal "1". When code words stored in the storage unit 741 are not included in the bit string stored in the register 703, the judging unit 740 outputs a decode completion signal "0". In addition, when a code word stored in the storage unit 741 is included in the bit string stored in the register 703, the judging unit 740 outputs decoded data ("run", "level", "last") and a code length corresponding to the code word. Furthermore, when code words stored in the storage unit 741 are not included in the bit string stored in the register 703, the judging unit 740 outputs arbitrary decoding data and a code length of "0".

Moreover, the time required by the judging unit 720 for judging whether a code word stored in the storage unit 721 is included in the bit string stored in the register 702 is longer than the time required by the judging unit 730 for judging whether a code word stored in the storage unit 731 is included in the bit string stored in the register 703. Furthermore, the time required by the judging unit 720 for judging whether a code word stored in the storage unit 721 is included in the bit string stored in the register 702 is longer than the time required by the judging unit 740 for judging whether a code word stored in the storage unit 741 is included in the bit string stored in the register 703.

The control unit 707 outputs a selection signal for switching among variable length code tables of a plurality of types. The control unit 707 outputs a selection signal "0" when using the table lookup unit 704, a selection signal "1" when using the table lookup unit 705, a selection signal "2" when using the table lookup unit 706, and a selection signal "3" when using none of the table lookup units 704, 705, and 706.

In accordance with a selection signal outputted by the control unit 707, the multiplexer 708 selects a signal to be outputted to the barrel shifter 700 and the multiplexer 714. When the selection signal is "0", the multiplexer 708 selects a code length outputted by the table lookup unit 704, and when the selection signal is other than "0", the multiplexer 708 selects a fixed value "0".

In accordance with a selection signal outputted by the control unit 707, the multiplexer 709 selects a signal to be outputted to the multiplexer 712. When the selection signal is "2", the multiplexer 709 selects a decode completion signal outputted by the table lookup unit 706, and when the selection signal is other than "2", the multiplexer 709 selects a decode completion signal outputted by the table lookup unit 705.

In accordance with a selection signal outputted by the control unit 707, the multiplexer 710 selects a signal to be outputted to the multiplexer 713. When the selection signal is "2", the multiplexer 710 selects decoded data outputted by the table lookup unit 706, and when the selection signal is other than "2", the multiplexer 710 selects decoded data outputted by the table lookup unit 705.

In accordance with a selection signal outputted by the control unit 707, the multiplexer 711 selects a signal to be outputted to the barrel shifter 701 and the multiplexer 714. When the selection signal is "1", the multiplexer 711 selects a code length outputted by the table lookup unit 705; when the selection signal is "2", the multiplexer 711 selects a decode completion signal outputted by the table lookup unit 706; and when the selection signal is other than "1" and "2", the multiplexer 711 selects a fixed value "0".

In accordance with a selection signal outputted by the control unit 707, the multiplexer 712 selects a signal to be outputted. When the selection signal is "0", the multiplexer 712 selects a decode completion signal outputted by the table lookup unit 704; when the selection signal is "1" or "2", the multiplexer 712 selects a decode completion signal selected by the multiplexer 709; and when the selection signal is "3", the multiplexer 712 selects a fixed value "0".

In accordance with a selection signal outputted by the control unit 707, the multiplexer 713 selects a signal to be outputted. When the selection signal is "0" or "3", the multiplexer 713 selects decoded data outputted by the table lookup unit 704, and when the selection signal is "1" or "2", the multiplexer 713 selects decoded data selected by the multiplexer 710.

In accordance with a selection signal outputted by the control unit 707, the multiplexer 714 selects a signal to be outputted. When the selection signal is "0" or "3", the multiplexer 714 selects a code length selected by the multiplexer 708, and when the selection signal is "1" or "2", the multiplexer 714 selects a code length selected by the multiplexer 711.

In this case, decoded data to be selected by the multiplexer 713 is valid only in a cycle in which the decode completion signal selected by the multiplexer 712 assumes a value of "1".

Next, operations of the variable length code decoding apparatus 70 according to the seventh embodiment of the present invention will be described.

FIG. 22 is a diagram showing specific operations performed by the variable length code decoding apparatus 70. FIG. 23 is a diagram showing examples of code words included in a bit stream inputted to the variable length code decoding apparatus 70. An operation for decoding a bit stream "p1p1-p16p1-p32" by the variable length code decoding apparatus 70 will now be described. In addition, the bit stream "p1p1-p16p1-p32" is followed by a bit string "q1-q32".

Furthermore, as shown in FIG. 23, the table lookup unit 704 stores a code word "p1" that is a code word coded by the first variable length coding method. The table lookup unit 705 stores a code word "p1-p16" that is a code word coded by the second variable length coding method. The table lookup unit 706 stores a code word "p1-p32" that is a code word coded by the third variable length coding method.

Moreover, the table lookup units are switched over in a sequence from the table lookup unit 704 to the table lookup unit 705 to the table lookup unit 706.

In addition, the bit stream supplying unit 200 retains "p1p1-p16p1-p32p1-p15" as an initial value, the register 702 retains "p1p1-p16p1-p15" as an initial value, and the register 703 retains "p1p1-p16p1-p15" as an initial value.

<0th Cycle>

In the 0th cycle, the bit stream supplying unit 200 outputs an initial value "p1p1-p16p1-p32p1-p15".

The barrel shifter 700 shifts the bit string "p1p1-p16p1-p32p1-p15" outputted by the bit stream supplying unit 200 to the left by a code length "1" selected by the multiplexer 708. The barrel shifter 700 outputs the shifted bit string "p1-p16p1-p16".

The barrel shifter 701 shifts the bit string "p1p1-p16p1-p32p1-p15" outputted by the bit stream supplying unit 200 to the left by a code length "0" selected by the multiplexer 711. The barrel shifter 700 outputs the shifted bit string "p1p1-p16p1-p15".

The register 702 retains an initial value "p1p1-p16p1-p15". The register 703 retains an initial value "p1p1-p16p1-p15".

Since the bit string "p1p1-p16p1-p15" retained in the register 702 and the code word "p1" stored in the table lookup unit 704 are consistent, the table lookup unit 704 outputs a decode completion signal "1", outputs decoded data "P0", and outputs a code length "1".

Since the bit string "p1p1-p16p1-p15" retained in the register 703 and code words stored in the table lookup unit 705 are inconsistent, the table lookup unit 705 outputs a decode completion signal "0", outputs decoded data "x", and outputs a code length "x".

Since the bit string "p1p1-p16p1-p15" retained in the register 703 and code words stored in the table lookup unit 706 are inconsistent, the table lookup unit 706 outputs a decode completion signal "0", outputs decoded data "x", and outputs a code length "x".

Since the table lookup unit 704 is used, the control unit 707 outputs a selection signal "0".

Since the selection signal outputted by the control unit 707 is "0", the multiplexer 708 selects the code length "1" outputted by the table lookup unit 704.

Since the selection signal outputted by the control unit 707 is "0", the multiplexer 709 selects the decode completion signal "0" outputted by the table lookup unit 705.

Since the selection signal outputted by the control unit 707 is "0", the multiplexer 710 selects the decoded data "x" outputted by the table lookup unit 705.

Since the selection signal outputted by the control unit 707 is "0", the multiplexer 711 selects a fixed value "0".

Since the selection signal outputted by the control unit 707 is "0", the multiplexer 712 selects the decode completion signal "1" outputted by the table lookup unit 704.

Since the selection signal outputted by the control unit 707 is "0", the multiplexer 713 selects the decoded data "P0" outputted by the table lookup unit 704.

Since the selection signal outputted by the control unit 707 is "0", the multiplexer 714 selects the code length "1" selected by the multiplexer 708.

Since the code length selected by the multiplexer 714 is "1", the bit stream supplying unit 200 shifts the first bit by 1 bit and extracts a bit string "p1-p16p1-p32p1-p16". In the next cycle, the bit stream supplying unit 200 outputs the extracted bit string "p1-p16p1-p32p1-p16".

The register 702 loads the bit string "p1-p16p1-p16" outputted by the barrel shifter 700, and outputs the bit string "p1-p16p1-p16" in the next cycle. The register 703 loads the bit string "p1p1-p16p1-p15" outputted by the barrel shifter 701, and outputs the bit string "p1p1-p16p1-p15" in the next cycle.

<1st Cycle>

In the 1st cycle, the bit stream supplying unit 200 outputs the bit string "p1-p16p1-p32p1-p16" extracted in the 0th cycle.

The barrel shifter 700 shifts the bit string "p1-p16p1-p32p1-p16" outputted by the bit stream supplying unit 200 to the left by a code length "0" selected by the multiplexer 708. The barrel shifter 700 outputs the shifted bit string "p1-p16p1-p16".

The barrel shifter 701 shifts the bit string "p1-p16p1-p32p1-p16" outputted by the bit stream supplying unit 200 to the left by a code length "0" outputted by the multiplexer 711. The barrel shifter 701 outputs the shifted bit string "p1-p16p1-p16".

The register 702 retains the bit string "p1-p16p1-p16" loaded in the 0th cycle. The register 703 retains the bit string "p1p1-p16p1-p15" loaded in the 0th cycle.

Since the bit string "p1p1-p16p1-p15" retained in the register 702 and the code word "p1" stored in the table lookup unit 704 are consistent, the table lookup unit 704 outputs a decode completion signal "1", outputs decoded data "P0", and outputs a code length "1".

Since the bit string "p1p1-p16p1-p15" retained in the register 703 and code words stored in the table lookup unit 705 are inconsistent, the table lookup unit 705 outputs a decode completion signal "0", outputs decoded data "x", and outputs a code length "x".

Since the bit string "p1p1-p16p1-p15" retained in the register 703 and code words stored in the table lookup unit 706 are inconsistent, the table lookup unit 706 outputs a decode completion signal "0", outputs decoded data "x", and outputs a code length "x".

In the next cycle, since a different combination of a barrel shifter and a register is used, none of the table lookup units are used. Consequently, the control unit 707 outputs a selection signal "3".

Since the selection signal outputted by the control unit 707 is "3", the multiplexer 708 selects a fixed value "0".

Since the selection signal outputted by the control unit 707 is "3", the multiplexer 709 selects the decode completion signal "0" outputted by the table lookup unit 705.

Since the selection signal outputted by the control unit 707 is "3", the multiplexer 710 selects the decoded data "x" outputted by the table lookup unit 705.

Since the selection signal outputted by the control unit 707 is "3", the multiplexer 711 selects a fixed value "0".

Since the selection signal outputted by the control unit 707 is "3", the multiplexer 712 selects a fixed value "0".

Since the selection signal outputted by the control unit 707 is "0", the multiplexer 713 selects the decoded data "P0" outputted by the table lookup unit 704.

Since the selection signal outputted by the control unit 707 is "0", the multiplexer 714 selects the code length "0" selected by the multiplexer 708.

Since the code length selected by the multiplexer 714 is "0", the bit stream supplying unit 200 extracts a bit string "p1-p16p1-p32p1-p16". In the next cycle, the bit stream supplying unit 200 outputs the extracted bit string "p1-p16p1-p32p1-p16".

The register 702 loads the bit string "p1-p16p1-p16" outputted by the barrel shifter 700, and outputs the bit string "p1-p16p1-p16" in the next cycle. The register 703 loads the bit string "p1-p16p1-p16" outputted by the barrel shifter 701, and outputs the bit string "p1-p16p1-p16" in the next cycle.

<2nd Cycle>

In the 2nd cycle, the bit stream supplying unit 200 outputs the bit string "p1-p16p1-p32p1-p16" extracted in the 1st cycle.

The barrel shifter 700 shifts the bit string "p1-p16p1-p32p1-p16" outputted by the bit stream supplying unit 200 to the left by the code length "0" selected by the multiplexer 708. The barrel shifter 700 outputs the shifted bit string "p1-p16p1-p16".

The barrel shifter 701 shifts the bit string "p1-p16p1-p32p1-p16" outputted by the bit stream supplying unit 200 to the left by the code length "16" selected by the multiplexer 711. The barrel shifter 701 outputs the shifted bit string "p1-p32".

The register 702 retains the bit string "p1-p16p1-p16" loaded in the 1st cycle. The register 703 retains the bit string "p1-p16p1-p16" loaded in the 1st cycle.

Since the bit string "p1-p16p1-p16" retained in the register 702 and the code word "p1" stored in the table lookup unit 704 are consistent, the table lookup unit 704 outputs a decode completion signal "1", outputs decoded data "P0", and outputs a code length "1".

Since the bit string "p1-p16p1-p16" retained in the register 703 and the code word "p1-p16" stored in the table lookup unit 705 are consistent, the table lookup unit 705 outputs a decode completion signal "1", outputs decoded data "P1", and outputs a code length "16".

Since the bit string "p1-p16p1-p16" retained in the register 703 and code words stored in the table lookup unit 706 are inconsistent, the table lookup unit 706 outputs a decode completion signal "0", outputs decoded data "x", and outputs a code length "x".

Since the table lookup unit 705 is used, the control unit 707 outputs a selection signal "1".

Since the selection signal outputted by the control unit 707 is "1", the multiplexer 708 selects a fixed value "0".

Since the selection signal outputted by the control unit 707 is "1", the multiplexer 709 selects the decode completion signal "1" outputted by the table lookup unit 705.

Since the selection signal outputted by the control unit 707 is "1", the multiplexer 710 selects the decoded data "P1" outputted by the table lookup unit 705.

Since the selection signal outputted by the control unit 707 is "1", the multiplexer 711 selects the code length "16" outputted by the table lookup unit 705.

Since the selection signal outputted by the control unit 707 is "1", the multiplexer 712 selects the decode completion signal "1" selected by the multiplexer 709.

Since the selection signal outputted by the control unit 707 is "1", the multiplexer 713 selects the decoded data "P1" selected by the multiplexer 710.

Since the selection signal outputted by the control unit 707 is "1", the multiplexer 714 selects the code length "16" selected by the multiplexer 711.

Since the code length selected by the multiplexer 714 is "16", the bit stream supplying unit 200 shifts the first bit by 1 bit and extracts a bit string "p1-p32q1-q32". In the next cycle, the bit stream supplying unit 200 outputs the extracted bit string "p1-p32q1-q32".

The register 702 loads the bit string "p1-p16p1-p16" outputted by the barrel shifter 700, and outputs the bit string "p1-p16p1-p16" in the next cycle. The register 703 loads the bit string "p1-p32" outputted by the barrel shifter 701, and outputs the bit string "p1-p32" in the next cycle.

<3rd Cycle>

In the 3rd cycle, the bit stream supplying unit 200 outputs the bit string "p1-p32q1-q32" extracted in the 2nd cycle.

The barrel shifter 700 shifts the bit string "p1-p32q1-q32" outputted by the bit stream supplying unit 200 to the left by the code length "0" selected by the multiplexer 708. The barrel is shifter 700 outputs the shifted bit string "p1-p32".

The barrel shifter 701 shifts the bit string "p1-p32q1-q32" outputted by the bit stream supplying unit 200 to the left by the code length "32" outputted by the multiplexer 711. The barrel shifter 701 outputs the shifted bit string "q1-q32".

The register 702 retains the bit string "p1-p16p1-p16" loaded in the 2nd cycle. The register 703 retains the bit string "p1-p32" loaded in the 2nd cycle.

Since the bit string "p1-p16p1-p16" retained in the register 702 and the code word "p1" stored in the table lookup unit 704 are consistent, the table lookup unit 704 outputs a decode completion signal "1", outputs decoded data "P0", and outputs a code length "1".

Since the bit string "p1-p32" retained in the register 703 and the code word "p1-p16" stored in the table lookup unit 705 are consistent, the table lookup unit 705 outputs a decode completion signal "1", outputs decoded data "P1", and outputs a code length "16".

Since the bit string "p1-p32" retained in the register 703 and the code word "p1-p32" stored in the table lookup unit 706 are consistent, the table lookup unit 706 outputs a decode completion signal "1", outputs decoded data "P2", and outputs a code length "32".

Since the table lookup unit 706 is used, the control unit 707 outputs a selection signal "2".

Since the selection signal outputted by the control unit 707 is "2", the multiplexer 708 selects a fixed value "0".

Since the selection signal outputted by the control unit 707 is "2", the multiplexer 709 selects the decode completion signal "1" outputted by the table lookup unit 706.

Since the selection signal outputted by the control unit 707 is "2", the multiplexer 710 selects the decoded data "P2" outputted by the table lookup unit 706.

Since the selection signal outputted by the control unit 707 is "2", the multiplexer 711 selects the code length "32" outputted by the table lookup unit 706.

Since the selection signal outputted by the control unit 707 is "2", the multiplexer 712 selects the decode completion signal "1" selected by the multiplexer 709.

Since the selection signal outputted by the control unit 707 is "2", the multiplexer 713 selects the decoded data "P2" selected by the multiplexer 710.

Since the selection signal outputted by the control unit 707 is "2", the multiplexer 714 selects the code length "32" selected by the multiplexer 711.

As shown, the variable length code decoding apparatus 70 according to the seventh embodiment of the present invention includes a plurality of table lookup units 704, 705, and 706 which respectively store variable length code tables of a plurality of types of variable length coding methods. In addition, the variable length code decoding apparatus 70 includes the barrel shifter 700 corresponding to the table lookup unit 704 whose delay is the greatest among the plurality of table lookup units 704, 705, and 706, and the barrel shifter 701 corresponding to the table lookup units 705 and 706 other than the table lookup unit 704 having the greatest delay. Consequently, the delay in the path of the table lookup unit 704 having the greatest delay can be reduced.

More specifically, a code length outputted by the table lookup unit 704 is inputted to the barrel shifter 700 via the two-input multiplexer 708. On the other hand, code lengths outputted by the table lookup units 705 and 706 are inputted to the barrel shifter 701 via the three-input multiplexer 711. In this case, the two-input multiplexer has fewer gates and less delay than the three-input multiplexer. As a result, the delay in the path of the table lookup unit 704 can be reduced in comparison to the delays in the paths of the table lookup units 705 and 706. In addition, when selecting either a code length outputted by the table lookup units 704, 705, and 706 or a fixed value "0" using a single multiplexer, a four-input multiplexer is required. Therefore, compared to a case where a code length outputted by the table lookup units 704, 705, and 706 is selected by a single multiplexer, the delay in the path of the table lookup unit 704 can be reduced. In other words, since the speed of a decoding process performed by the table lookup unit 704 having the greatest delay can be increased, decoding process by the variable length code decoding apparatus 70 can now be performed at a higher speed.

Furthermore, a decode completion signal outputted by the table lookup unit 704 is externally outputted solely via the two-input multiplexer 712. Decoded data outputted by the table lookup unit 704 is externally outputted solely via the two-input multiplexer 713. Consequently, since the speed of a decoding process performed by the table lookup unit 704 having the greatest delay can be increased, decoding process by the variable length code decoding apparatus 70 can now be performed at a higher speed.

It should be noted that one or more among the table lookup units 704, 705, and 706 may be provided with the same configuration as the variable length code decoding apparatuses according to the first to sixth embodiments described above. In other words, one or more among the table lookup units 704, 705, and 706 may be configured such that a code word including one coefficient is decoded in one cycle and a code word including two or more coefficients is decoded in two cycles.

Furthermore, the present invention may be applied to a variable length code table of four or more types.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

INDUSTRIAL APPLICABILITY

The present invention is applicable to a variable length code decoding apparatus and may particularly be applied as a moving picture decoding apparatus realized by an electronic circuit such as an LSI. For example, the present invention may be advantageous as a moving picture decoding apparatus provided in a personal computer, a digital television, a DVD player, a DVD recorder, a PDA (Personal Data Assistant), a mobile phone and the like which decode and reproduce coded moving images.

What is claimed is:

1. A variable length code decoding apparatus which decodes a bit stream including a code word that is variable-length-coded data, said variable length code decoding apparatus comprising:
   an extracting unit operable to extract a bit string of at least a maximum code length of a code word used in the variable length coding, from a beginning of an undecoded bit stream;
   a first storage unit for storing a plurality of code words in which one piece of data is coded, and decoded data and code lengths respectively corresponding to the code words;
   a second storage unit for storing a plurality of code words in which two or more pieces of data are coded, and decoded data and code lengths respectively corresponding to the code words;
   a first judging unit operable to judge whether one of the code words stored in said first storage unit is included in the bit string extracted by said extracting unit, and, when judged as being included, to output the decoded data and the code length of the code word; and
   a second judging unit operable to judge whether one of the code words stored in said second storage unit is included in the bit string extracted by said extracting unit, and, when judged as being included, to output the decoded data and the code length of the code word,
   wherein said extracting unit is operable, when said first judging unit judges that the code word is included, to judge the beginning of the undecoded bit stream based on the code length outputted by said first judging unit, and to extract a bit string to be decoded next in the same cycle as a cycle in which the judgment was made by said first judging unit, and
   said extracting unit is operable, when said second judging unit judges that the code word is included, to judge the beginning of the undecoded bit stream based on the code length outputted by said second judging unit, and to extract the bit string to be decoded next in a cycle subsequent to the cycle in which the judgment was made by said second judging unit.

2. The variable length code decoding apparatus according to claim 1,
wherein said first judging unit is further operable to output a decode completion signal indicating whether one of the code words stored in said first storage unit is included in the bit string extracted by said extracting unit,
said second judging unit is further operable to output a decode completion signal indicating whether one of the code words stored in said second storage unit is included in the bit string extracted by said extracting unit,
said variable length code decoding apparatus further comprises:
a first register which retains the decode completion signal, the decoded data, and the code length outputted by said second judging unit; and
a first selecting unit operable to select, in accordance with the decode completion signal retained in said first register, either the decode completion signal, the decoded data, and the code length outputted by said first judging unit or the decode completion signal, the decoded data, and the code length retained in said first register, and
said extracting unit is operable to judge the beginning of the undecoded bit stream based on the code length selected by said first selecting unit, and to extract the bit string to be decoded next.

3. The variable length code decoding apparatus according to claim 2,
wherein said extracting unit is operable, when the decode completion signal selected by said first selecting unit indicates that code words stored in said first storage unit and said second storage unit are not included in the bit string extracted by said extracting unit, to judge that the code length selected by said first selecting unit is invalid, and to not judge the beginning of the undecoded bit stream based on the code length selected by said first selecting unit.

4. The variable length code decoding apparatus according to claim 2,
wherein said extracting unit includes:
a bit stream supplying unit operable to judge the beginning of the undecoded bit stream based on the code length selected by said first selecting unit, and to extract a bit string at least twice as long as the maximum code length of the code word used in the variable length coding from the judged beginning of the undecoded bit stream;
a first shifter operable to shift the bit string extracted by said bit stream supplying unit by the code length outputted by said first judging unit, and to output a bit string of at least the maximum code length of the code word used in the variable length coding from the beginning of the shifted bit string;
a second shifter operable to shift the bit string extracted by said bit stream supplying unit by the code length retained in said first register, and to output a bit string of at least the maximum code length of the code word used in the variable length coding from the beginning of the shifted bit string;
a second selecting unit operable to select either the bit string outputted by said first shifter or the bit string outputted by said second shifter, in accordance with the decode completion signal retained in said first register; and
a second register which retains the bit string selected by said second selecting unit,
wherein said first shifter is only capable of performing shifting by a number of bits of the code lengths stored in said first storage unit,
said second shifter is only capable of performing shifting by a number of bits of the code lengths stored in said second storage unit,
said first judging unit is operable to judge whether one of the code words stored in said first storage unit is included in the bit string retained in said second register, and, when judged as being included, to output the decoded data and the code length of the code word, and
said second judging unit is operable to judge whether one of the code words stored in said second storage unit is included in the bit string retained in said second register, and, when judged as being included, to output the decoded data and the code length of the code word.

5. The variable length code decoding apparatus according to claim 1, further comprising:
a third storage unit for storing a plurality of code words in which two or more pieces of data are coded and which is not stored in said second storage unit, and decoded data and code lengths respectively corresponding to the code words; and
a third judging unit operable to judge whether one of the code words stored in said third storage unit is included in the bit string extracted by said extracting unit, and, when judged as being included, to output the decoded data and the code length of the code word,
wherein said extracting unit is operable, when said third judging unit judges that the code word is included, to judge the beginning of the undecoded bit stream based on the code length outputted by said third judging unit, and to extract the bit string to be decoded next in the same cycle as a cycle in which the judgment was made by said third judging unit.

6. The variable length code decoding apparatus according to claim 5,
wherein the time required for the judgment by said third judging unit is equal to or shorter than the time required for the judgment by said first judging unit.

7. The variable length code decoding apparatus according to claim 1,
wherein said first storage unit is for storing the plurality of code words in which one piece of data has been coded, decoded data respectively corresponding to the code words and which require sequential processing, and code lengths respectively corresponding to the code words,
said second storage unit is for storing the plurality of code words in which two or more pieces of data have been coded, the decoded data respectively corresponding to the code words and which require sequential processing, and the code lengths respectively corresponding to the code words, and
said variable length code decoding apparatus further comprises:
a third register which retains the bit string extracted by said extracting unit;
a fourth storage unit for storing the plurality of code words stored in said first storage unit and second storage unit and decoded data respectively corresponding to the code words and which do not require sequential processing; and
a fourth judging unit operable to judge whether one of the code words stored in said fourth storage unit is included in the bit string retained in said third register, and, when judged as being included, to output the decoded data of the code word which does not require sequential processing.

8. The variable length code decoding apparatus according to claim 1, further comprising
an error detecting unit operable to output, when said first judging unit judges that the code word is not included and said second judging unit judges that the code word is not included, an error detection signal indicating that an error has been detected.

9. The variable length code decoding apparatus according to claim 8, further comprising:
a third register which retains the bit string extracted by said extracting unit;
a fifth storage unit for storing code words not stored in said first storage unit and said second storage unit, and error types corresponding to the code words; and
a fifth judging unit operable to judge whether one of the code words stored in said fifth storage unit is included in the bit string retained in said third register, and, when judged as being included, to output the error type of the code word.

10. The variable length code decoding apparatus according to claim 1,
wherein said second storage unit is for storing the plurality of code words in which two pieces of data are coded, and the decoded data and the code lengths respectively corresponding to the code words,
said variable length code decoding apparatus further comprises:
a third storage unit for storing a plurality of code words in which three pieces of data are coded, and decoded data and code lengths respectively corresponding to the code words; and
a third judging unit operable to judge whether one of the code words stored in said third storage unit is included in the bit string extracted by said extracting unit, and, when judged as being included, to output the decoded data and the code length of the code word,
said extracting unit is operable, when said second judging unit judges that the code word is included, to judge the beginning of the undecoded bit stream based on the code length outputted by said second judging unit, and to extract the bit string to be decoded next in either the same cycle as a cycle in which the judgment was made by said second judging unit or the subsequent cycle,
said extracting unit is operable, when said third judging unit judges that the code word is included, to judge the beginning of the undecoded bit stream based on the code length outputted by said third judging unit, and to extract the bit string to be decoded next in any of the same cycle as a cycle in which the judgment was made by said third judging unit, the immediately subsequent cycle, and two cycles after the cycle in which the judgment was made by said third judging unit, and
said variable length code decoding apparatus further comprises:
a first switch operable to switch a cycle in which bit string extraction is performed by said extracting unit, when said second judging unit judges that the code word is included, to either the same cycle as a cycle in which the judgment was made by said second judging unit or the subsequent cycle; and
a second switch operable to switch a cycle in which bit string extraction is performed by said extracting unit, when said third judging unit judges that the code word is included, to any of the same cycle as a cycle in which the judgment was made by said third judging unit, the immediately subsequent cycle, and two cycles after the cycle in which the judgment was made by said third judging unit.

11. A variable length code decoding apparatus which decodes a bit stream including a code word that is data variable-length-coded by any of a first variable length coding, a second variable length coding, and a third variable length coding, said variable length code decoding apparatus comprising:
a bit stream supplying unit operable to extract a bit string at least twice as long as a maximum code length of a code word used in the first variable length coding, the second variable length coding, and the third variable length coding, from a beginning of an undecoded bit stream;
a first shifter operable to shift the bit string extracted by said bit stream supplying unit, and to output a bit string of at least the maximum code length of the code word used in the first variable length coding, from the beginning of the shifted bit string;
a second shifter operable to shift the bit string extracted by said bit stream supplying unit, and to output a bit string of at least the maximum code length of the code word used in the second variable length coding and the third variable length coding, from the beginning of the shifted bit string;
a first storage unit for storing a plurality of code words coded according to the first variable length coding, and decoded data and code lengths respectively corresponding to the code words;
a second storage unit for storing a plurality of code words coded according to the second variable length coding, and decoded data and code lengths respectively corresponding to the code words;
a third storage unit for storing a plurality of code words coded according to the third variable length coding, and decoded data and code lengths respectively corresponding to the code words;
a first judging unit operable to judge whether one of the code words stored in said first storage unit is included in the bit string outputted by said first shifter, and, when judged as being included, to output the decoded data and the code length of the code word;
a second judging unit operable to judge whether one of the code words stored in said second storage unit is included in the bit string shifted by said second shifter, and, when judged as being included, to output decoded data and a code length of the code word;
a third judging unit operable to judge whether one of the code words stored in said third storage unit is included in the bit string shifted by said second shifter, and, when judged as being included, to output decoded data and a code length of the code word;
a first selecting unit operable to select either the decoded data and the code length outputted by said second judging unit or the decoded data and the code length outputted by said third judging unit; and
a second selecting unit operable to select either the decoded data and the code length outputted by said first judging unit or the decoded data and the code length selected by said first selecting unit,
wherein said bit stream supplying unit is operable to judge the beginning of the undecoded bit stream based on the code length selected by said second selecting unit, and to extract the bit string,
said first shifter is operable to shift the bit string extracted by said bit stream supplying unit by the code length outputted by said first judging unit, said second shifter is operable to shift the bit string extracted by said bit stream supplying unit by the code length selected by said first selecting unit, a time required for the judgment by said first judging unit is longer than a time required for the judgment by said second judging unit, and a time required for the judgment by said first judging unit is longer than a time required for the judgment by said third judging unit.

12. A variable length code decoding method of decoding a bit stream including a code word that is variable-length-coded data, said variable length code decoding method comprises:

decoding a code word in which one piece of data is coded, and extracting a bit string to be decoded next from the bit stream based on a code length of the decoded code word, said decoding and said extracting being performed in one cycle;

decoding, in a predetermined cycle, a code word in which two or more pieces of data are coded; and extracting, in a cycle subsequent to the predetermined cycle, a bit string to be decoded next from the bit stream based on a code length of the code word decoded in the predetermined cycle.

* * * * *